United States Patent
Igarashi et al.

[19]

[11] Patent Number: 6,027,962
[45] Date of Patent: Feb. 22, 2000

[54] METHOD OF MANUFACTURING SEMICONDUCTOR DEVICE HAVING BIPOLAR TRANSISTOR AND FIELD-EFFECT TRANSISTOR

[75] Inventors: Takayuki Igarashi; Kakutaro Suda; Yoshitaka Ohtsu, all of Hyogo, Japan

[73] Assignees: Mitsubishi Denki Kabushiki Kaisha, Tokyo; Ryoden Semiconductor System Engineering Corporation, Hyogo, both of Japan

[21] Appl. No.: 08/991,004

[22] Filed: Dec. 15, 1997

[30] Foreign Application Priority Data

Jun. 18, 1997 [JP] Japan .................................. 9-161014

[51] Int. Cl.[7] .............................................. H01L 21/8238
[52] U.S. Cl. ............................................ 438/202; 438/234
[58] Field of Search .................................. 257/380, 378; 438/202, 203, 234; 148/DIG. 9

[56] References Cited

U.S. PATENT DOCUMENTS

| | | |
|---|---|---|
| 5,026,654 | 6/1991 | Tanba et al. . |
| 5,192,992 | 3/1993 | Kim et al. . |
| 5,444,003 | 8/1995 | Wang et al. . |
| 5,471,083 | 11/1995 | Ikeda et al. . |
| 5,525,530 | 6/1996 | Watabe . |

FOREIGN PATENT DOCUMENTS

| | | |
|---|---|---|
| 6-112412 | 4/1994 | Japan . |
| 6-188375 | 7/1994 | Japan . |
| 7-169867 | 7/1995 | Japan . |
| 7-335774 | 12/1995 | Japan . |

*Primary Examiner*—Charles Bowers
*Assistant Examiner*—Scott J. Hawranek
*Attorney, Agent, or Firm*—McDermott, Will & Emery

[57] ABSTRACT

A method of manufacturing a semiconductor device can suppress an etching damage to a bipolar transistor part and a CMOS transistor part while simplifying a manufacturing process. According to this manufacturing method, an external base leader electrode layer which will form an external base leader electrode is used as an etching protection film for forming a CMOS transistor, and a layered film including a polycrystalline silicon film which will ultimately form a gate electrode is used as an etching protection film during formation of a bipolar transistor. Thereby, a step of forming the etching protection film can be utilized also as a step of forming the external base electrode and the gate electrode. Consequently, the etching damages to the bipolar transistor part and the CMOS transistor part are suppressed while simplifying the manufacturing process.

9 Claims, 72 Drawing Sheets

METHOD OF MANUFACTURING SEMICONDUCTOR DEVICE HAVING BIPOLAR TRANSISTOR AND FIELD-EFFECT TRANSISTOR

BACKGROUND OF THE INVENTION

1. Field of the Invention

The present invention relates to a method of manufacturing a semiconductor device, and in particular to a method of manufacturing a semiconductor device which includes bipolar transistors and field-effect transistors formed on a semiconductor substrate.

2. Description of the Background Art

Such a BiCMOS element has been known that includes a bipolar transistor having a high-speed performance and a good drive performance, and also includes a CMOS transistor allowing high-density integration and low power consumption.

FIGS. 93 to 106 are cross sections of structures showing a process of manufacturing a first BiCMOS element in the prior art. FIG. 106 is a cross section of a structure of the conventional first BiCMOS element which is manufactured by the manufacturing process shown in FIGS. 93 to 105. Referring first to FIG. 106, description will now be given on the sectional structure of the first BiCMOS element in the prior art.

In a bipolar transistor part (A: A1, A2) of the conventional first BiCMOS element, an $N^+$-type collector buried layer 2 is formed on a P-type silicon substrate 1. An N-type epitaxial layer 6 is formed on the upper surface of collector buried layer 2. For element isolation, there are formed a field oxide film 7, a P-type isolation region 11 and a $P^+$-type lower surface isolation region 5.

A base region which is formed of a $P^-$-type true base region 24 and a $P^+$-type external base region 88 is formed at a surface portion of N-type epitaxial layer 6. An $N^+$-type emitter region 27 is formed at the surface of this base region. An $N^+$-type collector wall region 8 is formed at a position spaced from external base region 88 by field oxide film 7. Collector wall region 8 has an end in contact with $N^+$-type collector buried layer 2.

A $P^+$-type external base leader electrode 23 is formed on field oxide film 7 and the surface of external base region 88. An $N^+$-type emitter electrode 26a is formed inside a side wall spacer 25 of an opening E1 for an emitter, and is electrically connected to emitter region 27.

$P^+$-type external base leader electrode 23 and $N^+$-type emitter electrode 26a are electrically isolated from each other by side wall spacer 25.

A CVD oxide film 28a is formed on the upper surface of emitter electrode 26a. A CVD oxide film 22a is formed on the upper surface of external base leader electrode 23. Side wall spacer 25 is formed at side surfaces of external base leader electrode 23 and CVD oxide film 22a.

At a PMOS transistor part (B) in the CMOS transistor part, an $N^+$-type buried layer 3 is formed at P-type silicon substrate 1. An N-type well region 9 is formed on buried layer 3. For element isolation, field oxide film 7 is formed. A pair of P-type source/drain regions 15 spaced from each other by a channel region are formed at the surface of N-type well region 9. Source/drain regions 15 are formed of $P^-$-type source/drain regions 15a and $P^+$-type source/drain regions 15b. A gate electrode 13a, which is formed of, e.g., an $N^+$-type polycrystalline silicon film and a tungsten silicide (WSi) film, is formed on the channel region. A side wall spacer 19 is formed at the side surface of gate electrode 13a.

At an NMOS transistor part (C), a $P^-$-type buried layer 4 is formed at P-type silicon substrate 1. A P-type well region 10 is formed on buried layer 4. For element isolation, field oxide film 7 is formed. Similarly to the PMOS transistor part, a pair of N-type source/drain regions 17 spaced from each other by a channel region are formed at the surface of P-type well region 10. Source/drain regions 17 are formed of $N^-$-type source/drain regions 17a and $N^+$-type source/drain regions 17b. Gate electrode 13a, which is formed of, e.g., an $N^+$-type polycrystalline silicon film and a tungsten silicide (WSi) film, is formed on the channel region. Side wall spacer 19 is formed at the side surface of gate electrode 13a.

A polycrystalline silicon resistance 30a is formed on field oxide film 7 located at a polycrystalline silicon resistance part (D) neighboring to NMOS transistor part (C). A CVD oxide film 31 is formed on polycrystalline silicon resistance 30a.

An interlayer insulating film 32 is formed over bipolar transistor part (A), CMOS transistor part (B and C) and polycrystalline silicon resistance part (D). Interlayer insulating film 32 is provided with contact holes 33 which are located above collector wall region 8, emitter electrode 26a, external base leader electrode 23, source/drain regions 15, source/drain regions 17 and polycrystalline silicon resistance 30a, respectively. Although not shown, a contact hole 33 is formed also above gate electrode 13a. These contact holes 33 are filled with metal films 34 made of tungsten, respectively. Metal interconnections 35 made of, e.g., aluminum, are formed on the upper surface of interlayer insulating film 32 and are electrically connected to metal films 34, respectively.

It has been generally known to form polycrystalline silicon resistance 30a as a resistance element in an integrated circuit using a bipolar transistor as described above. FIG. 107 shows an inverter circuit using a resistance element in a bipolar transistor. In the inverter circuit shown in FIG. 107, a current flows between a collector and an emitter when a positive voltage is applied to an input voltage Vin, so that a voltage lowers at a resistance R, and thereby an output voltage Vout lowers. When input voltage Vin is at a low potential, no current flows between the collector and the emitter, so that lowering of the voltage does not occur at resistance R. Therefore, output voltage Vout is equal to Vcc, and a high potential is attained. As can be seen from the above, the resistance R in the element using the bipolar transistor performs a voltage conversion operation. A TTL (Transistor Transistor Logic) circuit and an ECL (Emitter Coupled Logic) circuit are examples of known logical circuits using the bipolar transistors and resistance elements. In these circuits, the bipolar transistor and the resistance element must be formed in the same step.

Referring to FIGS. 93 to 106, description will be given on a conventional process of manufacturing the first BiCMOS element.

As shown in FIG. 93, processing is performed to form $N^+$-type collector buried layer 2, $N^+$-type buried layer 3, $P^+$-type buried layer 4 and $P^+$-type lower surface isolating layer 5 at P-type silicon substrate 1. Then, N-type epitaxial layer 6 is formed on collector buried layer 2. Thereafter, field oxide film 7 is formed at predetermined regions of the main surface of P-type silicon substrate 1, and then $N^+$-type collector wall region 8, N-type well region 9, P-type well region 10 and P-type isolating region 11 are formed.

As shown in FIG. 94, gate oxide film 12 is formed on an active region surrounded by field oxide film 7. Then, an N-type polycrystalline silicon film 131 and a tungsten silicide film 132 each having a thickness of about 2000 Å are deposited on gate oxide film 12 and field oxide film 7. After forming a photoresist pattern 14 at a predetermined region on tungsten silicide film 132, patterning is performed with a mask formed of photoresist pattern 14 to form gate electrode 13a shown in FIG. 95.

Thereafter, a photoresist pattern 16a is formed over bipolar transistor part (A) and NMOS transistor part (C). P-type impurity 111 is implanted into a surface of N-type well region 9 masked with photoresist pattern 16a and gate electrode 13a of PMOS transistor part (B). In this implantation, for example, ions of $BF_2^+$ are implanted under the conditions of 25 KeV and $7 \times 10^{13} cm^{-2}$. Thereby, lightly doped $P^-$-type source/drain regions 15a are formed. Thereafter, photoresist pattern 16a is removed.

As shown in FIG. 96, a photoresist pattern 18a covering bipolar transistor part (A) and PMOS transistor part (B) is formed, and then N-type impurity 222 is ion-implanted into the surface of P-type well region 10 masked with gate electrode 13a of NMOS transistor part (C) and photoresist pattern 18a. In this implantation, for example, ions of $As^+$ are implanted under the conditions of 60 KeV and $3 \times 10^{13} cm^{-2}$. Thereby, lightly doped $N^-$-type source/drain regions 17a are formed. Thereafter, photoresist pattern 18a is removed.

After depositing a CVD oxide film (not shown) of about 2000 Å in thickness, this CVD oxide film is dry-etched to form side wall spacer 19 at side surface of each gate electrode 13a, as shown in FIG. 97.

Thereafter, as shown in FIG. 98, processing is performed to form a photoresist pattern 20a covering bipolar transistor part (A) and NMOS transistor part (C). P-type impurity 333 is implanted into the surface of N-type well region 9 masked with photoresist pattern 20a, gate electrode 13a located at PMOS transistor part (B) and side wall spacer 19. Thereby, heavily doped $P^+$-type source/drain regions 15b are formed. In this implantation, for example, ions of $BF_2$ are implanted under the conditions of 20 KeV and $4 \times 10^{15} cm^{-2}$. Thereafter, photoresist pattern 20a is removed.

As shown in FIG. 99, processing is performed to form a photoresist pattern 21a covering bipolar transistor part (A) and PMOS transistor part (B). N-type impurity 444 is implanted into the surface of P-type well region 10 masked with photoresist pattern 21a, gate electrode 13a located at NMOS transistor part (C) and side wall spacer 19. In this implantation, for example, ions of $As^+$ are implanted under the conditions of 50 KeV and $4 \times 10^{15} cm^{-1}$. Thereby, heavily doped $N^+$-source/drain regions 17b are formed. Thereafter, photoresist pattern 21a is removed.

After depositing a polycrystalline silicon film (not shown) of about 2000 Å in thickness on the whole surface, P-type impurity is implanted into this polycrystalline silicon film. In this implantation, for example, ions of $BF_2^+$ are implanted under the conditions of 40 KeV and $4 \times 10^{15} cm^{-2}$. Further, a CVD oxide film (not shown) of about 2000 Å in thickness is deposited on the whole surface, and then dry etching is performed with a mask formed of a photoresist pattern (not shown). Thereby, external base leader electrode 23 and CVD oxide film 22a having configurations shown in FIG. 100 are formed. Then, implantation of P-type impurity is performed for forming the true base region. In this implantation, for example, ions of $BF_2^+$ are implanted under the conditions of 20 KeV and $8 \times 10^{13} cm^{-2}$. The step for this ion implantation is not shown. Thereafter, a CVD oxide film (not shown) of about 2000 Å in thickness is deposited on the whole surface, and then this CVD oxide film is dry-etched to form side wall spacers 25 at the side surfaces of external base leader electrodes 23 and CVD oxide films 22a as shown in FIG. 101.

Then, as shown in FIG. 102, a polycrystalline silicon film 260a of about 2000 Å in thickness is deposited on the whole surface, and thereafter N-type impurity 555 is ion-implanted into polycrystalline silicon film 260a. In this ion implantation, for example, ions of $As^+$ are implanted under the conditions of 50 KeV and $1 \times 10^{16} cm^{-2}$. Thereafter, heat treatment is performed at 850° C. for about 30 minutes, so that emitter region 27 is formed. Also, true base region 24 and external base region 88 are formed. Thereafter, a CVD oxide film (not shown) of about 2000 Å in thickness is deposited on the whole surface of polycrystalline silicon film 260a, and then a photoresist pattern 29 shown in FIG. 103 is formed. Dry etching is performed with a mask formed of photoresist pattern 29, so that emitter electrode 26a and overlying CVD oxide film 28a are formed as shown in FIG. 103. Thereafter, photoresist pattern 29 is removed.

Subsequently, a polycrystalline silicon film 30 of about 2000 Å in thickness is deposited on the whole surface for forming a resistance element. P-type or N-type impurity 666 is ion-implanted into polycrystalline silicon film 30 with an implantation dose, an implantation energy and a kind of impurity controlled or selected to attains an intended resistance value. Then, a CVD oxide film (not shown) of about 2000 Å in thickness is deposited on the whole surface, and thereafter a photoresist pattern (not shown) is formed at a predetermined region on this CVD oxide film. Using this photoresist pattern as a mask, dry etching is effected on the underlying CVD oxide film and polycrystalline silicon film 30, so that polycrystalline silicon resistance 30a and CVD oxide film 31 are formed as shown in FIG. 105.

Thereafter, interlayer insulating film 32 covering the whole surface is formed as shown in FIG. 106. Processing is performed to form contact holes 33 at regions of interlayer insulating film 32 located above collector wall region 8, emitter electrode 26a, external base leader electrode 23, source/drain regions 15, source/drain regions 17 and polycrystalline silicon resistance 30a. After filling each contact hole 33 with metal film 34 made of, e.g., tungsten, metal interconnection 35 made of, e.g., aluminum is formed on the upper surface of each metal film 34. Thereby, the conventional first BiCMOS element shown in FIG. 106 is completed.

FIGS. 108 to 111 are cross sections showing a process of manufacturing a second BiCMOS element in the prior art. Referring to FIG. 111, this conventional second BiCMOS element has the substantially same structure as the conventional first BiCMOS element shown in FIG. 106. However, this second BiCMOS element has metal silicide films 39 which are formed on the surfaces of emitter electrode 26a, external base leader electrode 23, collector wall region 8, source/drain regions 15 and 17, gate electrode 13b and polycrystalline silicon resistance 30a. Metal silicide films 39 are formed for reducing resistances of the respective electrodes and regions.

Referring to FIGS. 108 to 111, a process of manufacturing the conventional second BiCMOS element will be described below.

After the same process as that for manufacturing the conventional first BiCMOS element shown in FIG. 93, gate oxide film 12 is formed on the active region surrounded by field oxide film 7. An N-type polycrystalline silicon film 133 of about 2000 Å in thickness is formed on field oxide film 7 and gate oxide film 12, and then a CVD oxide film 36 of about 2000 Å in thickness is deposited on polycrystalline silicon film 133. A photoresist pattern 37 is formed at a predetermined region on CVD oxide film 36, and then patterning is performed with a mask formed of photoresist pattern 37. Thereby, gate electrodes 13b shown in FIG. 109 are formed.

Thereafter, a manufacturing process is performed similarly to that for the conventional first BiCMOS element shown in FIGS. 95 to 103. Thereby, the structure shown in FIG. 109 is obtained. Using photoresist pattern 38 as a mask for leaving portions which are not to be silicided, patterning is effected on CVD oxide films 22a, 28a, 31 and 36. Thereby, a structure shown in FIG. 110 is formed. Thereafter, photoresist pattern 38 is removed. After sputtering cobalt to the whole surface, lamp annealing is performed several times. Thereafter, cobalt is removed, so that a metal silicide film is formed on silicon and polycrystalline silicon in a self-aligned manner. This process is called a SALICIDE (Self-Aligned-Silicide) process.

The SALICIDE process is performed to form, for example, cobalt silicide films 39 on the upper surfaces of emitter electrode 26a, external base leader electrode 23, collector wall region 8, source/drain regions 15 and 17 and gate electrode 13b as well as on the contact region of polycrystalline silicon resistance 30a. Thereafter, a manufacturing process is performed similarly to that for the conventional first BiCMOS element shown in FIG. 106, so that the conventional second BiCMOS element is completed.

In the method of manufacturing the conventional first BiCMOS element shown in FIGS. 93 to 106, bipolar transistor part (A1 and A2) is subjected one time to the oxide film dry etching (DE1 in FIG. 97) during formation of the CMOS transistor part (B and C). Meanwhile, the CMOS transistor part (B and C) is subjected one time to the oxide film dry etching (DE2 in FIG. 101) during formation of bipolar transistor part (A1 and A2), and is also unavoidably subjected three times to the polycrystalline silicon dry etching (DE3 in FIG. 100, DE4 in FIG. 103 and DE5 in FIG. 105). Particularly, in the step of effecting the polycrystalline silicon dry etching on the polycrystalline silicon films on source/drain regions 15 and 17, such a disadvantage arises that source/drain regions 15 and 17 at the surface of silicon substrate 1 are etched to a large extent, because the polycrystalline silicon film and underlying silicon substrate 1 are present continuously to each other and a select ratio of etching is not substantially present between the polycrystalline silicon film and silicon substrate 1. In this case, irregularities, i.e., concave and convex portions are formed at the surface regions of source/drain regions 15 and 17, and therefore the regions doped with impurity partially decreases, which results in disadvantageous variations in junction leak and transistor characteristics as well as unacceptable characteristics.

At the active region (A1) of the bipolar transistor, the emitter/base junction is exposed on the surface. Therefore, a base leak current occurs when the surface of active region of the bipolar transistor is subjected to the dry etching.

Since the polycrystalline silicon resistance is formed of the polycrystalline silicon film which is dedicated to formation of the resistance, this increases the steps in number.

The manufacturing process for the conventional second BiCMOS element shown in FIGS. 108 to 111 employs the step of effecting the oxide film dry etching (DE6) on the surfaces of source/drain regions 15 and 17 in addition to the steps in the manufacturing process for the conventional first BiCMOS element described above. Due to the fact that the dry etching is performed many times, field oxide film 7 is also subjected to the etching, so that the film thickness of the field oxide film 7 is disadvantageously reduced. In the worst case, as shown in FIG. 112, field oxide film 7 disappears, so that source/drain regions 15 of the PMOS transistor are connected to source/drain regions 17 of the NMOS transistor via silicide film 39, resulting in short-circuit. In some cases, source/drain regions 15 of the PMOS transistor are connected to P-type isolating region 11, P-type lower surface isolating region 5 and P-type silicon substrate 1, resulting in short-circuit. In these cases, an operation failure may occur in the transistor.

In order to prevent the above disadvantages, the dry etching may be performed with a photoresist pattern or the like masking regions not to be dry-etched. However, this remarkably increases the steps in number, and therefore complicates the manufacturing process.

As described above, it is impossible in the prior art to reduce an etching damage to the bipolar transistor part and CMOS transistor part while simplifying a manufacturing process.

SUMMARY OF THE INVENTION

An object of the invention is to provide a method of manufacturing a semiconductor device which can prevent deterioration of electrical characteristics of a BiCMOS element without complicating a manufacturing process.

Another object of the invention is provide a method of manufacturing a semiconductor device which can prevent an etching damage to an active region of a bipolar transistor without requiring an additional mask.

Still another object of the invention is provide a method of manufacturing a semiconductor device which can prevent an etching damage to a CMOS transistor part without complicating a manufacturing process.

According to an aspect of the invention, a method of manufacturing a semiconductor device including a bipolar transistor and a field-effect transistor formed on a semiconductor substrate includes the following steps. An element isolating and insulating film is formed on a main surface of the semiconductor substrate. A layered film is formed by successively forming a gate insulating film, at least a first semiconductor film and a first insulating film on the main surface of the semiconductor substrate. The layered film located above an emitter region and a base region of the bipolar transistor are removed. A second semiconductor film for an external base leader electrode is formed on the emitter region and the base region. A second insulating film is formed on the second semiconductor film. A first side wall insulating film is formed on the side surface of the second semiconductor film and the side surface of the second insulating film, and the first insulating film on the first semiconductor film is removed. After forming at least a third semiconductor film on the first semiconductor film, the first and third semiconductor films are patterned to form a gate electrode. Impurity is ion-implanted into the main surface of the semiconductor substrate masked with the gate electrode to form a pair of source/drain regions. The second semiconductor film is patterned to form the external base leader electrode and an opening for the emitter. Impurity is ion-implanted into the main surface of the semiconductor substrate through the opening for the emitter to form the base region. A second side wall insulating film is formed at the side surface of the external base leader electrode located in the opening for the emitter. A fourth semiconductor film having a portion located in the opening for the emitter and electrically connected to the main surface of the semiconductor substrate is formed and thereafter is patterned to form an emitter electrode.

According to the above method of manufacturing the semiconductor device, the second semiconductor film which will form the external base leader electrode is used as an etching protection film during formation of the field-effect transistor. Therefore, it is possible to protect the bipolar transistor active region from an etching damage without employing an additional mask such as a resist. Also, the step of forming the etching protection film can be used also as the step of forming the external base leader electrode. The layered film including the first semiconductor film which will form the gate electrode is used as the etching protection film during formation of the bipolar transistor. Therefore, the step of forming the etching protection film can be used also as the step of forming the gate electrode. Thereby, it is possible to protect the active region of the CMOS transistor from an etching damage while simplifying the manufacturing process. As described above, the manufacturing method of the first aspect can protect the bipolar transistor part and the CMOS transistor part from the etching damage while employing the simplified manufacturing process, and therefore can prevent deterioration of element characteristics, which may be caused by the etching damage, while employing the simplified manufacturing process. The first insulating film on the first semiconductor film is removed by the dry etching, which is performed for forming the first side wall insulating film on the side surfaces of the second semiconductor film and second insulating film. This can also simplify the manufacturing process. Since all the regions other than the emitter/base regions are covered with the layered film, it is possible to prevent effectively the shaving of the surface of element isolating and insulating film at the CMOS transistor part during formation of the emitter/base regions. Thereby, silicide films, which will be formed at a later step, can be effectively prevented from being short-circuited through an area on the shaved element isolating and insulating film.

In the manufacturing method of another aspect, the second insulating film is left on the second semiconductor film in the step of forming the first side wall insulating film and removing the first insulating film. During formation of the first side wall film, the second insulating film thus left can effectively prevent the upper surface of the external base leader electrode from dry etching. As a result, it is possible to prevent effectively the variation in film thickness of the external base leader electrode and therefore the variation in characteristics of the bipolar transistor.

According to the manufacturing method of still another aspect, the impurity is also ion-implanted into the collector region of the bipolar transistor during ion-implantation of the impurity for forming the source/drain regions. This can further reduce a collector resistance.

According to the manufacturing method of further another aspect, the step of forming the emitter electrode includes the steps of forming a fourth semiconductor film and subsequently implanting first impurity into the fourth semiconductor film; forming a resist or mask layer on a portion of the fourth semiconductor film provided for forming a first resistance layer and subsequently implanting second impurity into the fourth semiconductor film; and removing the mask layer and subsequently patterning the fourth semiconductor film to form simultaneously the emitter electrode and the first resistance layer. By simultaneously forming the first resistance layer and the emitter electrode, the number of steps can be reduced.

According to the manufacturing method of further another aspect, the fourth semiconductor film is patterned to form a second resistance layer in addition to and simultaneously with the emitter electrode and the first resistance layer. Thereby, the number of steps can be further reduced.

According to a further aspect, the manufacturing method further includes the steps of exposing a surface of at least a portion of an element formation region, and forming a silicide film at the surface of the exposed portion. Owing to the formation of the silicide film at the surface of at least a portion of the element formation region, it is possible to form simultaneously the bipolar transistor and CMOS transistor, which are provided with the silicide film and have low resistance and good speed characteristics, as well as the transistor of an ordinary performance not provided with the silicide film.

In the manufacturing method, the step of forming the silicide film may include the steps of forming a third insulating film at the side surface of the exposed portion; and forming a silicide film on the upper surface of the exposed portion. Since the silicide film is formed only at the upper surface of the exposed portion, it is possible to prevent short-circuit between the silicide film formed around the emitter electrode and the silicide film of the external base leader electrode.

According to the manufacturing method of a further aspect, the implantation of ions into the base region is performed by implanting ions into the main surface of the semiconductor substrate after forming the second side wall insulating film. Thereby, the base region can be formed without an influence applied by shaving of the main surface of the semiconductor substrate during formation of the second side wall insulating film. Thereby, even when the base region surface is shaved by the etching performed for forming the second side wall insulating film, a width of the base region and an impurity concentration can be controlled independently of an amount of a shaved portion of the base region surface. As a result, it is possible to reduce variation in width of the base region and variation in impurity concentration.

In the above manufacturing method, an impurity region for connecting an external base region and a true base region together may be formed by ion-implanting impurity into the main surface of the semiconductor substrate through the opening for the emitter prior to formation of the second side wall insulating film. According to this method, variation in width of the base region and variation in impurity concentration can be further reduced compared with the aforementioned aspect, and therefore variation in electrical characteristics of the bipolar transistor can be further reduced.

According to a further aspect, a method of manufacturing a semiconductor device includes the following steps. An element isolating and insulating film is formed on a main surface of a semiconductor substrate. A layered film is formed by successively forming a gate insulating film, at least a first semiconductor film and a first insulating film on the main surface of the semiconductor substrate. The layered film located on an emitter region and a base region of the bipolar transistor are removed. A second semiconductor film for an external base leader electrode is formed on the emitter region and the base region. A second insulating film is formed on the second semiconductor film. The second semiconductor film and the second insulating film are patterned to form the external base leader electrode and an opening for an emitter. Impurity is ion-implanted into the main surface of the semiconductor substrate through the opening for the emitter to form the base region. Dry etching is performed to form a side wall insulating film at the side surface of the external base leader electrode and the side surface of the second insulating film, and to remove the first insulating film on the first semiconductor film. Forming and subsequently patterning at least a third semiconductor film on the first semiconductor film and in the opening for the emitter to form simultaneously the gate electrode and the emitter electrode. Impurity is ion-implanted into the main surface of the semiconductor substrate masked with the gate electrode to form a pair of source/drain regions.

According to the method of manufacturing the semiconductor device of the above aspect, the field-effect transistor is formed after forming the bipolar transistor. Therefore, an etching damage to the emitter/base active regions of the bipolar transistor can be prevented. The layered film including the first semiconductor film, which will form the gate electrode, is used as the etching protection film during formation of the bipolar transistor. Thereby, the step of forming the etching protection film can be used also as the step of forming the gate electrode. Thereby, it is possible to protect the active region of the CMOS transistor from an etching damage while simplifying the manufacturing process. Since the first insulating film on the first semiconductor film is removed by the dry etching which is performed for forming the side wall insulating film on the side surface of the external base leader electrode. This also simplifies the manufacturing process. Further, the gate electrode and the emitter electrode are formed simultaneously. Therefore, the manufacturing process can be further simplified.

The manufacturing method of a further aspect includes the following steps prior to the step of forming the second insulating film. First impurity is implanted into the second semiconductor film. Second impurity is implanted into the second semiconductor film after forming a mask layer on a portion of the second semiconductor film provided for forming the first resistance layer. The external base leader electrode, the opening for the emitter and the first resistance layer are simultaneously formed by patterning the second semiconductor film after removing the mask layer. In this manner, the external base leader electrode, the opening for the emitter and the first resistance layer can be simultaneously formed, so that the manufacturing process can be further simplified. The active region of the bipolar transistor can be protected from an etching damage without adding a new mask.

In the manufacturing method described above, the patterning may be effected on the second semiconductor film to form the second resistance layer in addition to and simultaneously with the external base leader electrode, the opening for the emitter and the first resistance layer. This can further simplify the manufacturing process.

In the manufacturing method of a further aspect, the impurity is ion-implanted also into the collector region of the bipolar transistor during ion-implantation of the impurity for forming the source/drain regions. Thereby, the collector resistance can be further reduced.

According to a further aspect, the manufacturing method further includes the steps of exposing a surface of at least a portion of an element formation region, and forming a silicide film at the exposed surface. Owing to the formation of the silicide film at the surface of at least a portion of the element formation region, it is possible to form the silicide film selectively in many elements. Consequently, it is possible to form simultaneously the element, which is provided with the silicide film and has a low resistance and good speed characteristics, as well as the ordinary element.

According to the manufacturing method of a further aspect, the implantation of ions into the base region is performed by implanting ions into the main surface of the semiconductor substrate after forming the second side wall insulating film. Thereby, even when the base region surface is shaved by the etching performed for forming the second side wall insulating film, a width of the base region and an impurity concentration can be controlled independently of an amount of the shaved portion of the base region surface.

In the above manufacturing method, an impurity region for connecting an external base region and a true base region together may be formed by ion-implanting impurity into the main surface of the semiconductor substrate through the opening for the emitter prior to formation of the side wall. According to this method, variation in width of the base region and variation in impurity concentration can be further reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below.
(Embodiment 1)

Referring to FIGS. 1 to 18, a manufacturing process of an embodiment 1 will be described below.

Figure 1:
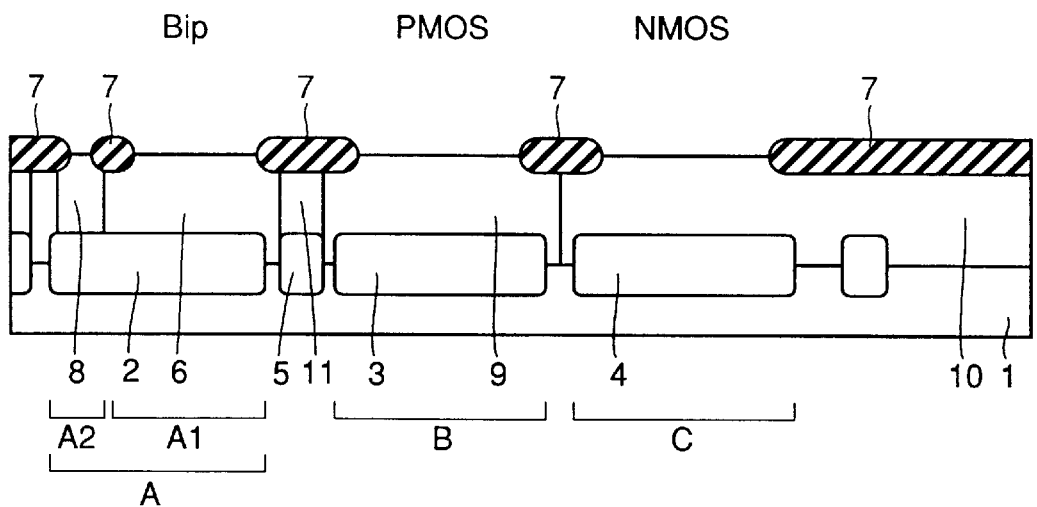
FIGS. 1 to 18 are cross sections showing a process of manufacturing a BiCMOS element of an embodiment 1 of the invention.

As shown in FIG. 1, processing similar to that in the prior art is performed to form $N^+$-type collector buried layer 2, $N^+$-type buried layer 3, $P^+$-type buried layer and $P^+$-type lower surface isolating region 5 on P-type silicon substrate 1. Then, N-type epitaxial layer 6 is formed on the upper surface of $N^+$-type collector buried layer 2. Subsequently, field oxide film 7 is formed at predetermined regions on the main surface of P-type silicon substrate 1. Then, N-type collector wall region 8, N-type well region 9, P-type well region 10 and P-type isolating region 11 are formed.

Figure 2:
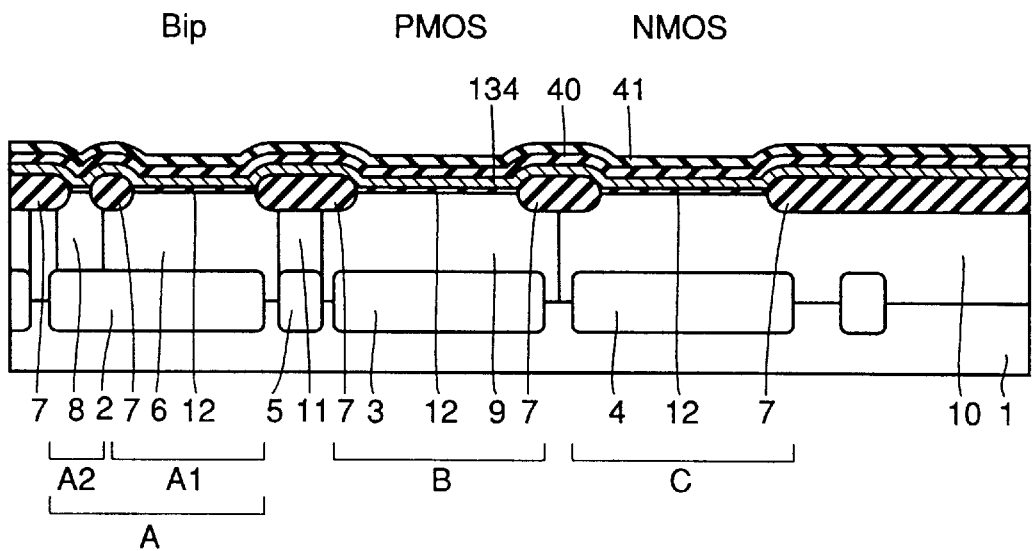
Figure 3:
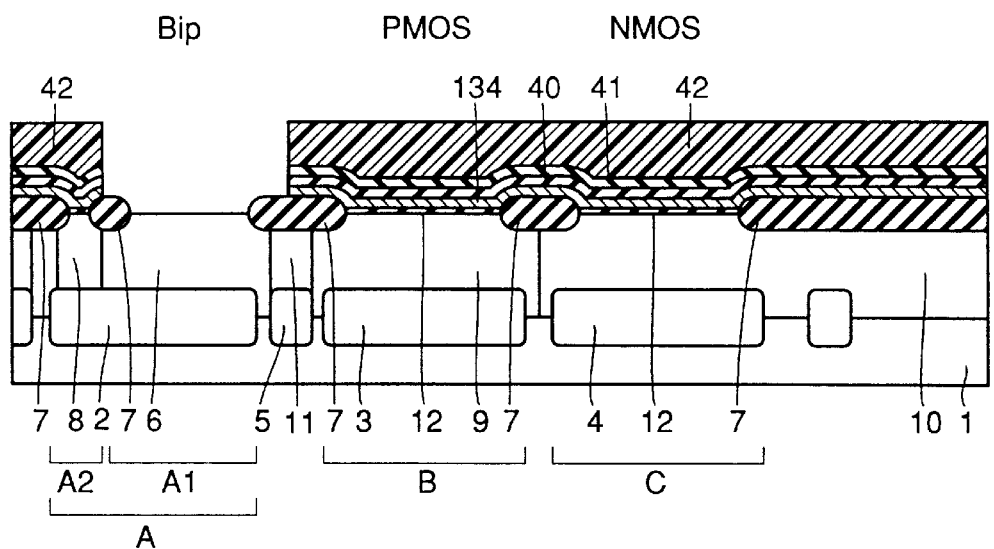

Then, as shown in FIG. 2, gate oxide film 12 is formed on the main surface of P-type silicon substrate 1 including active region (A) of the bipolar transistor and active regions (B and C) of the CMOS transistor. Thereafter, a polycrystalline silicon film 134 of about 500 Å in thickness, a nitride film 40 of about 700 Å in thickness and a CVD oxide film 41 of about 500 Å in thickness are successively deposited on gate oxide film 12 and field oxide film 7. Thereby, a layered film formed of polycrystalline silicon film 134, nitride film 40 and CVD oxide film 41 is formed. Then, a photoresist pattern 42 shown in FIG. 3 is formed at a predetermined region on CVD oxide film 41, and thereafter dry etching is performed with a mask formed of a photoresist pattern 42. Thereby, the layered film located only on the base/emitter active region (A1) of the bipolar transistor is removed, as shown in FIG. 3. Thereafter, photoresist pattern 42 is removed.

Figure 4:
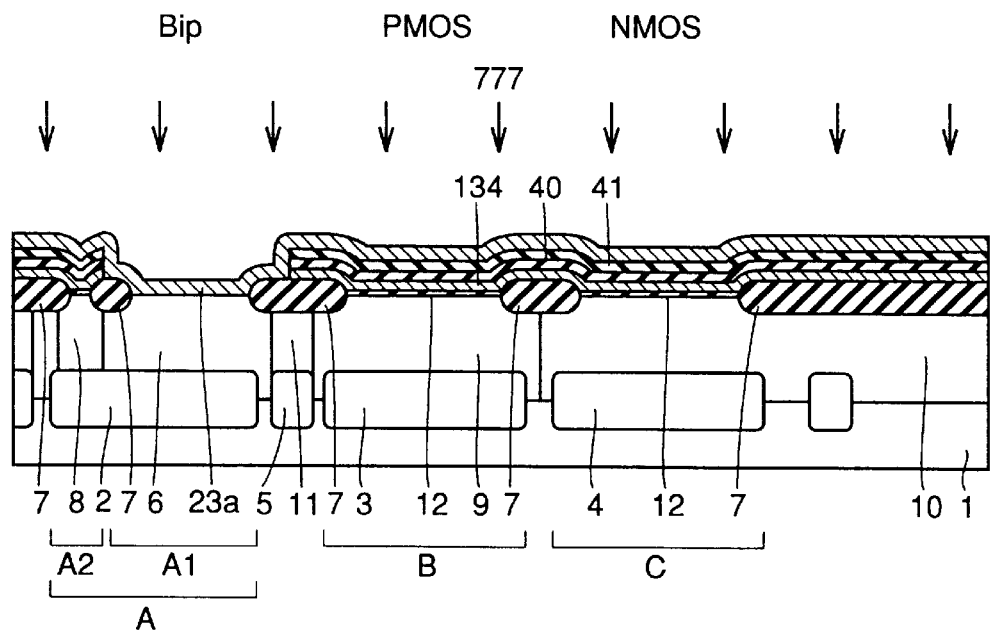
Figure 5:
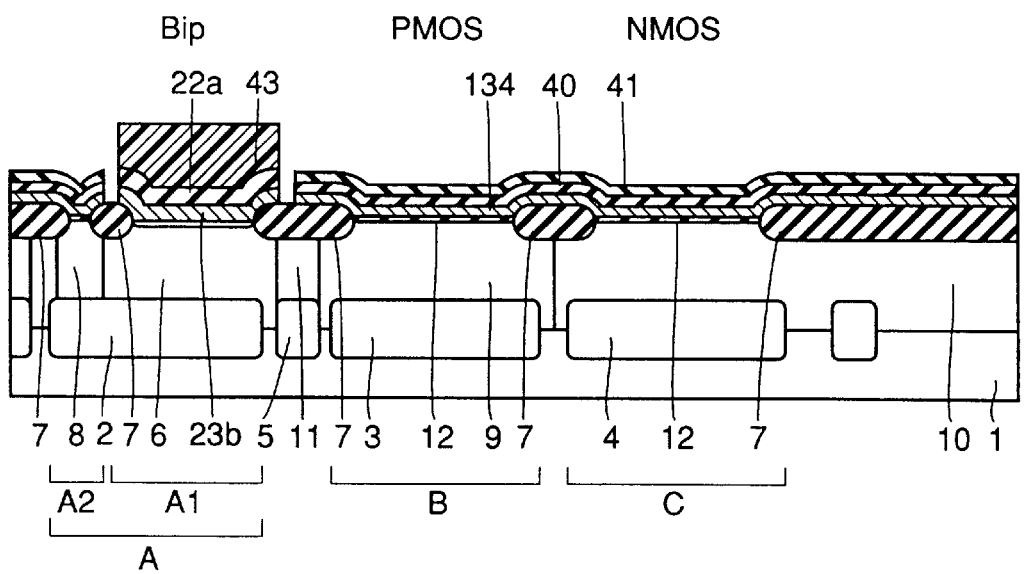

As shown in FIG. 4, a polycrystalline silicon film 23a of about 1000 Å in thickness which will form an external base electrode is deposited on the whole surface. P-type impurity 777 is implanted into polycrystalline silicon film 23. In this implantation, for example, ions of $BF_2^+$ are implanted under the conditions of 20 KeV and $4 \times 10^{15} cm^{-2}$. Then, a CVD oxide film (not shown) of about 3000 Å in thickness is formed on the whole surface, and thereafter a photoresist pattern 43 shown in FIG. 5 is formed. Etching is effected on the underlying CVD oxide film and polycrystalline silicon film 23a masked with photoresist pattern 43, so that an external base electrode layer 23a having a configuration shown in FIG. 5 is formed. At this time, an opening for an emitter is not formed.

After depositing a CVD oxide film (not shown) of about 2000 Å in thickness on the whole surface, this CVD oxide film is dry-etched to form a side wall spacer 44 at the side surface of external base leader electrode 23 and the side surface of CVD oxide film 22. This dry etching is performed to remove completely CVD oxide film 41 (see FIG. 5) forming the layered film. In this manner, the dry etching, which is performed for forming side wall spacer 44, is utilized also for removing CVD oxide film 41, whereby the manufacturing process can be further simplified compared with the case where CVD oxide film 41 is removed by an independent step. Such processing may be employed that the dry etching is performed to remove completely CVD oxide film 41 without forming side wall spacer 44. In this case, the processing for removing CVD oxide film 41 is performed to leave CVD oxide film 22 of a certain thickness.

Figure 7:
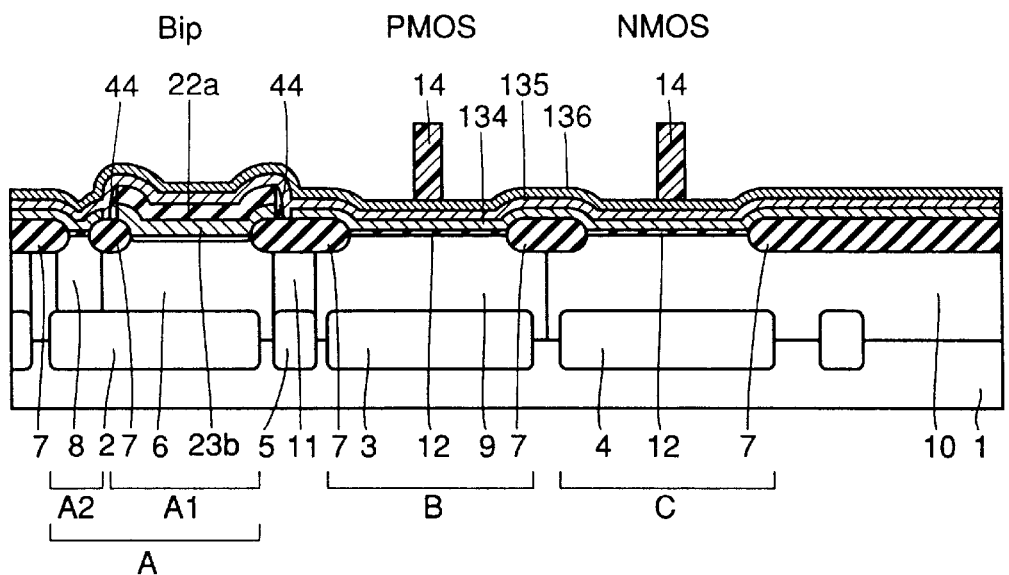
Figure 8:
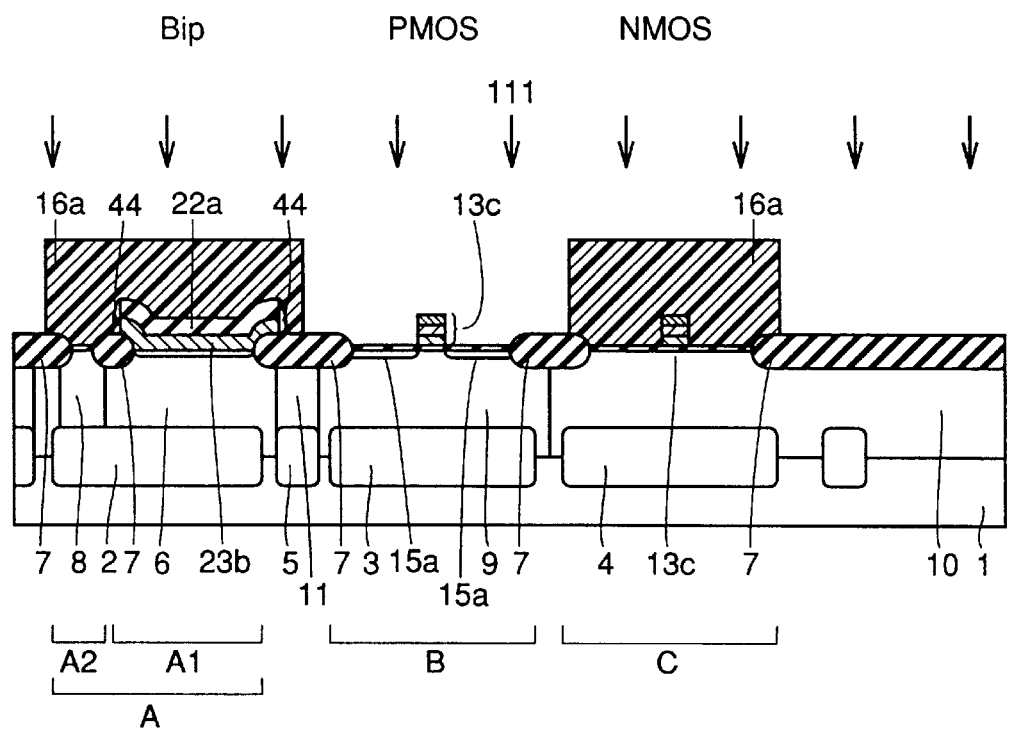

Thereafter, nitride film 40 is removed. As shown in FIG. 7, an N-type polycrystalline silicon film 135 and a tungsten silicide film 136, which have thicknesses of about 1500 Å and 2000 Å, respectively, are deposited on polycrystalline silicon film 134. After forming a photoresist pattern 14 at a predetermined region of tungsten silicide film 136, dry etching is performed with a mask formed of photoresist pattern 14. Thereby, a gate electrode 13c shown in FIG. 8 is formed.

Thereafter, processing is performed to form a photoresist pattern 16a covering bipolar transistor part (A) and NMOS transistor part (C). P-type impurity 111 is implanted into the surface of N-type well region 9 masked with photoresist pattern 16a and gate electrode 13c in PMOS transistor part (B), so that lightly doped $P^-$-type source/drain regions 15a are formed. In this implantation, for example, ions of $BF_2^+$ are implanted under the conditions of 25 KeV and $7 \times 10^{13} cm^{-2}$. Thereafter, photoresist pattern 16a is removed.

Figure 9:
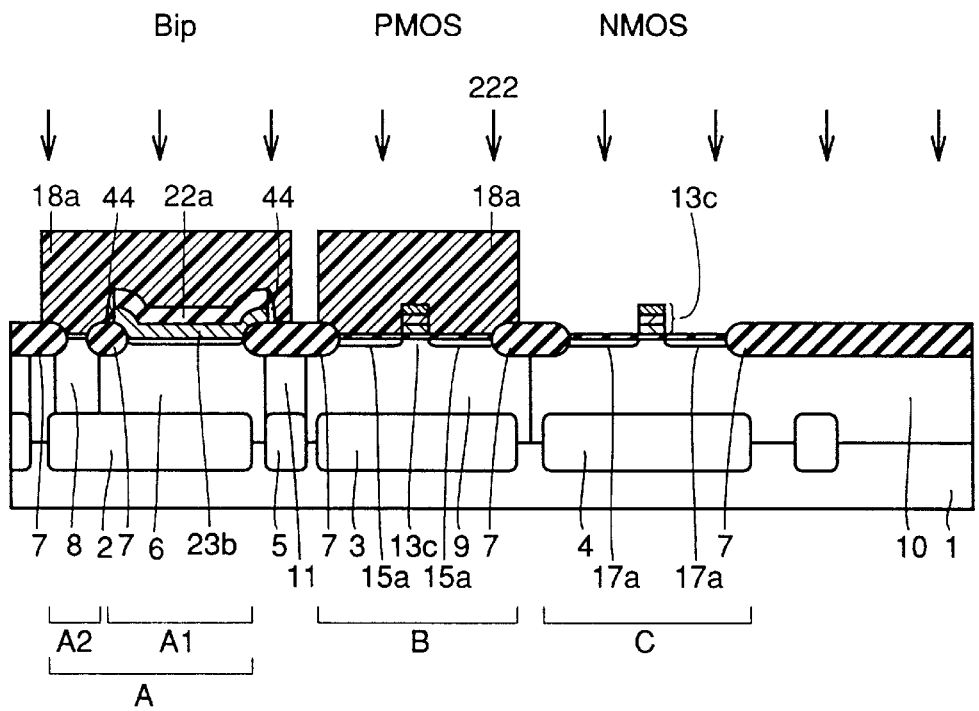

Then, as shown in FIG. 9, processing is performed to form a photoresist pattern 18a covering bipolar transistor part (A) and PMOS transistor part (B). N-type impurity 222 is implanted into the surface of P-type well region 10 masked with photoresist pattern 18a and gate electrode 13c of NMOS transistor part (C), so that lightly doped $N^-$-type source/drain regions 17a are formed. In this implantation, for example, ions of $As^+$ are implanted under the conditions of 60 KeV and $3 \times 10^{13} cm^{-2}$. Thereafter, photoresist pattern 18a is removed.

Figure 10:
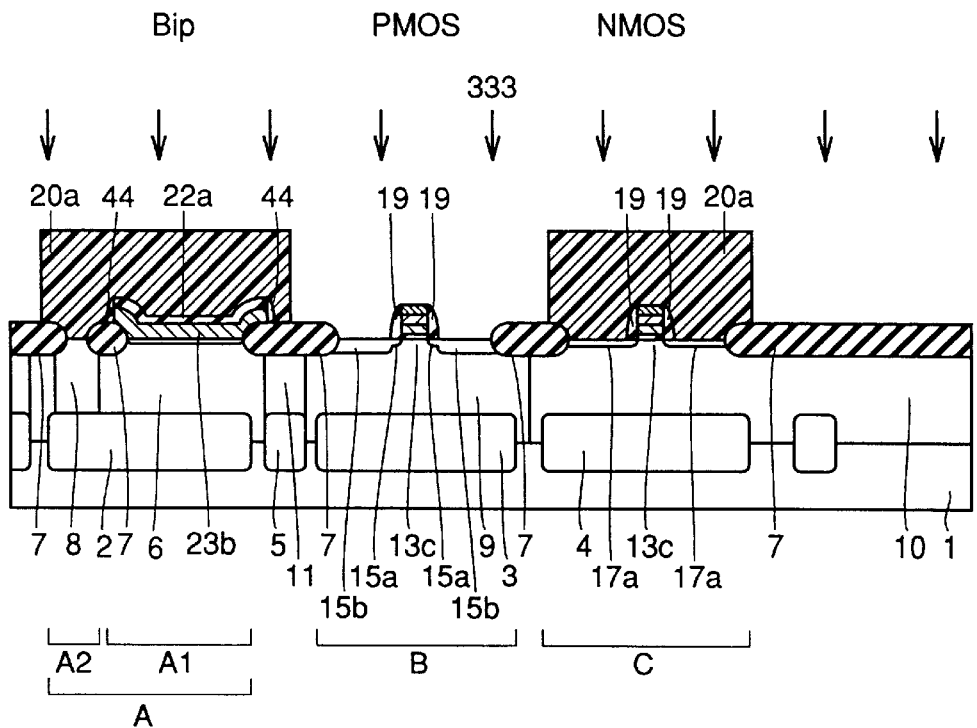

After depositing a CVD oxide film (not shown) of about 2000 Å in thickness, dry etching is effected on this CVD oxide film to form a side wall spacer 19 at the side surface of gate electrode 13c, as shown in FIG. 10. In this processing, the etching is effected also on CVD oxide film 22a on external base leader electrode layer 23a at bipolar transistor part (A). However, this etching is effected only to such an extent that CVD oxide film 22a remains and therefore the surface of external base leader electrode layer 23a is not exposed. Thereby, the surface of external base leader electrode layer 23a can be effectively prevented from being subjected to the dry etching during formation of side wall spacer 19 at the side surface of gate electrode 13c. As a result, it is possible to prevent effectively the variation in film thickness of external base leader electrode layer 23a and therefore the variation in electrical characteristics of the bipolar transistor. In this case, the processing is controlled to leave CVD oxide film 22a of about 500 Å in thickness.

Thereafter, processing is performed to form a photoresist pattern 20a covering bipolar transistor part (A) and NMOS transistor part (C). P-type impurity 333 is implanted into the surface of N-type well region 9 masked with photoresist pattern 20a as well as gate electrode 13c and side wall spacer 19 at PMOS transistor part (B). Thereby, heavily doped P$^+$-type source/drain regions 15b are formed. In this implantation, for example, ions of BF$_2^+$ are implanted under the conditions of 20 KeV and $4\times10^{15}$cm$^{-2}$. Thereafter, photoresist pattern 20a is removed.

Thereafter, processing is performed to form a photoresist pattern 21a covering bipolar transistor part (A) and PMOS transistor part (B). N-type impurity 444 is implanted into the surface of P-type well region 10 masked with photoresist pattern 21a as well as gate electrode 13c and side wall spacer 19 at NMOS transistor part (C). Thereby, heavily doped N$^+$-type source/drain regions 17b are formed. In this implantation, for example, ions of As$^+$ are implanted under the conditions of 50 KeV and $4\times10^{15}$cm$^{-2}$. Thereafter, photoresist pattern 21a is removed.

Figure 12:
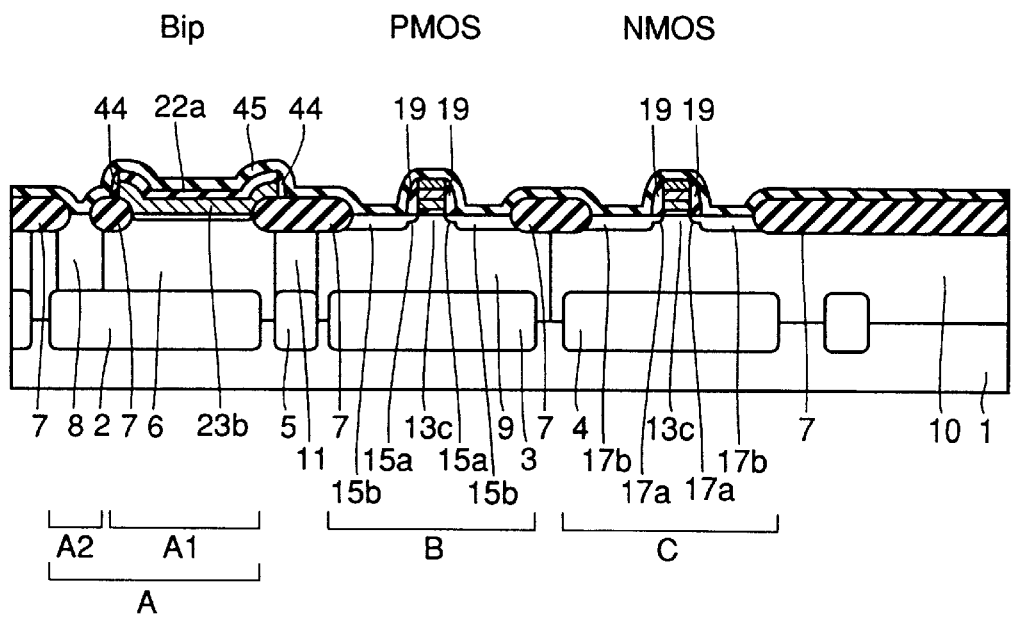
Figure 13:
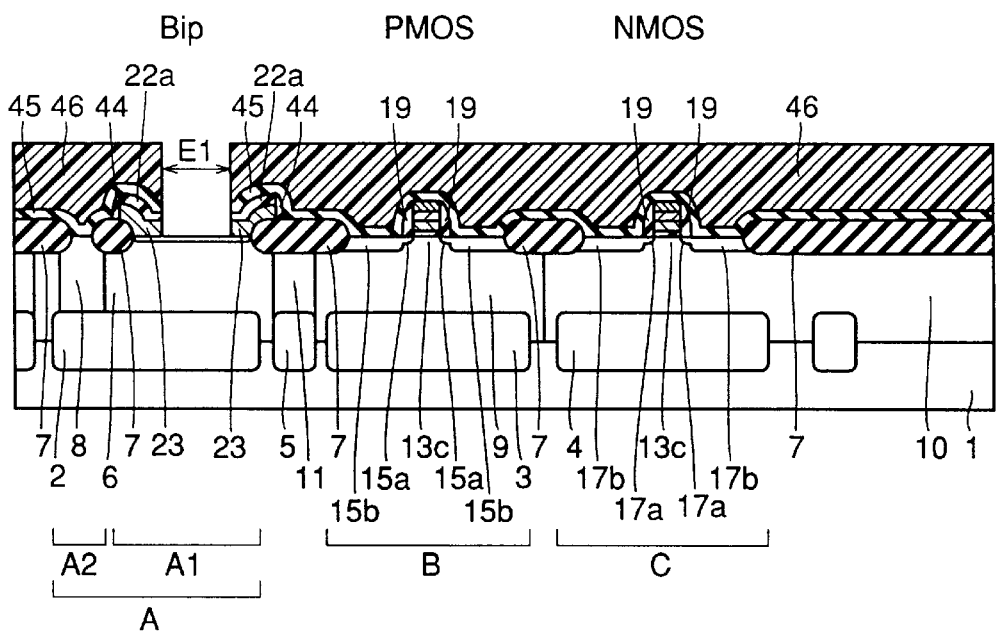

Then, as shown in FIG. 12, a CVD oxide film 45 of about 2500 Å in thickness is deposited on the whole surface. Thereafter, photoresist pattern 46 is formed as shown in FIG. 13. Dry etching is performed using photoresist pattern 46 as a mask, so that an opening E1 for the emitter is formed at bipolar transistor part (A). Thereafter, photoresist pattern 46 is removed.

Figure 14:
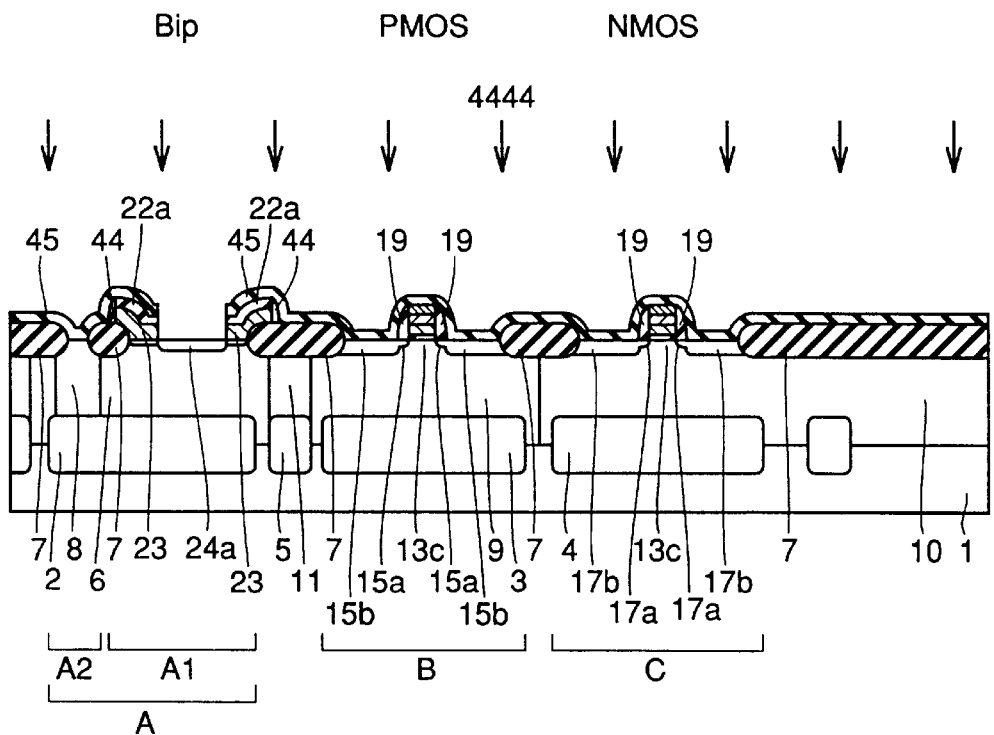

Then, as shown in FIG. 14, P-type impurity 4444 for forming a true base region is implanted through opening E1 for the emitter. In this implantation, for example, ions of BF$_2^+$ are implanted under the conditions of 20 KeV and $8\times10^{13}$cm$^{-2}$. Thereby, a true base region 24a is formed.

Figure 15:
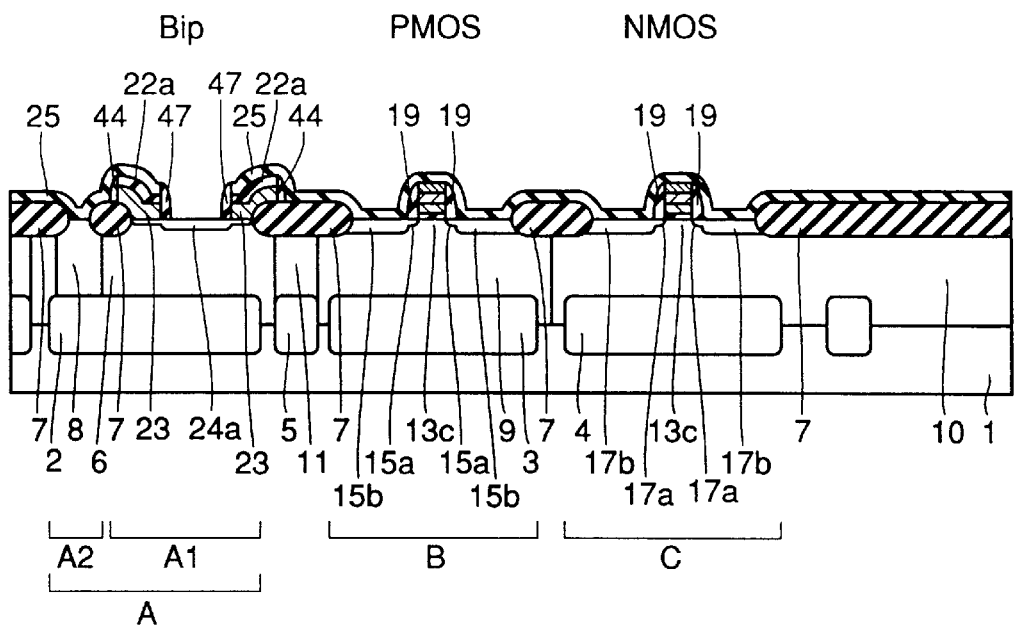

Then, a CVD oxide film (not shown) of about 2000 Å in thickness is formed on the whole surface, and dry etching is effected on this CVD oxide film to form a side wall spacer 47 at the side surface of external base leader electrode 23 and the side surface of CVD oxide film 22a in opening E1 for emitter as shown in FIG. 15.

Figure 16:
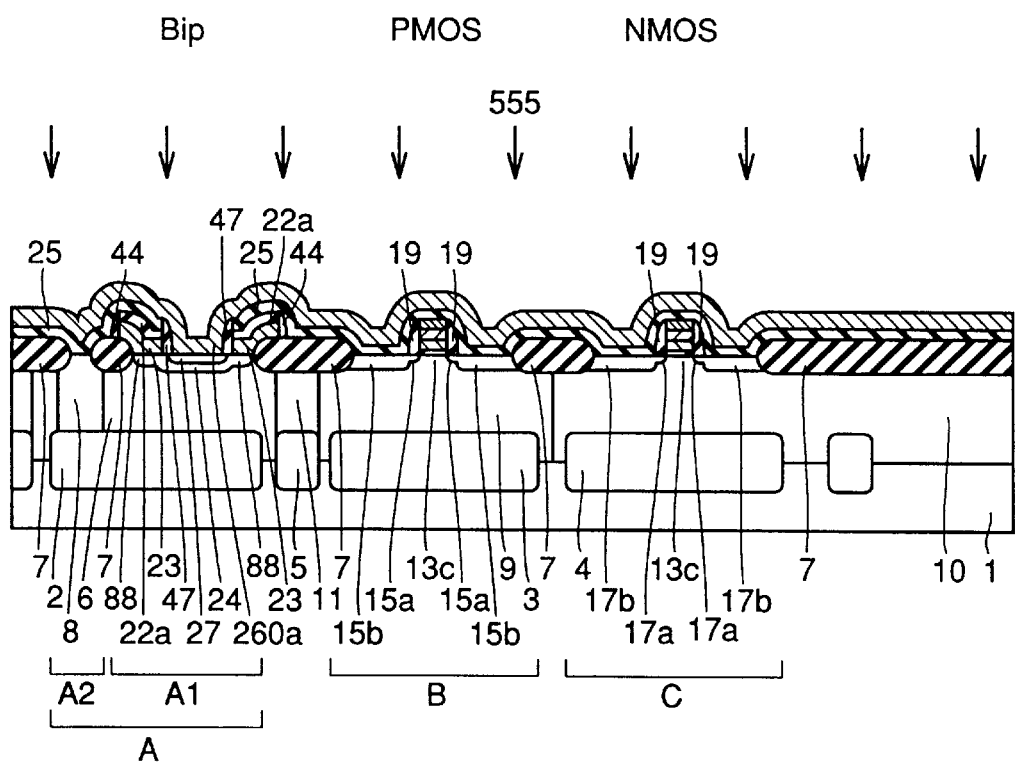

Thereafter, a polycrystalline silicon film 260a of about 1000 Å in thickness is deposited as shown in FIG. 16, and N-type impurity 555 is implanted into polycrystalline silicon film 260a. In this implantation, for example, ions of As$^+$ are implanted under the conditions of 50 KeV and $1\times10^{16}$cm$^{-2}$. This implantation of N-type impurity 555 determines the impurity concentration of emitter region 27, because emitter region 27 will completed by diffusing N-type impurity 555 from emitter electrode 26 into emitter region 27 by a heat treatment in a later step as will be described later. Polycrystalline silicon film 260a may be formed by depositing a doped polycrystalline silicon film containing doped impurity. In this case, implantation of N-type impurity 555 is not required.

Figure 17:
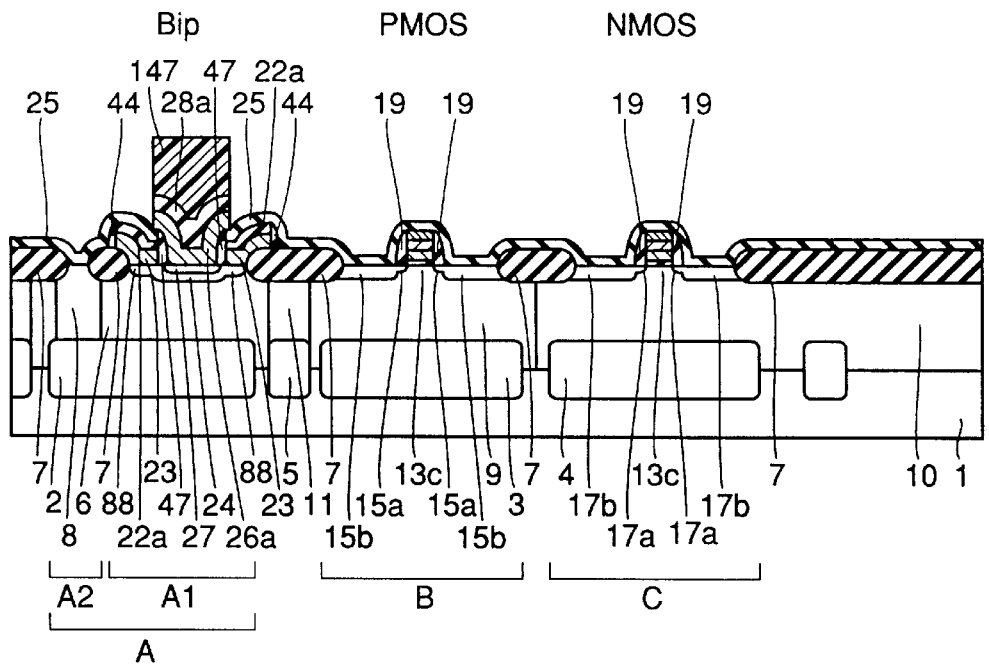

Thereafter, a CVD oxide film (not shown) of about 2000 Å in thickness is deposited on the whole surface, and thereafter a photoresist pattern 147 is formed on this CVD oxide film as shown in FIG. 17. Using photoresist pattern 147 as a mask, dry etching is effected on the underlying CVD oxide film and polycrystalline silicon film 260a to form patterned emitter electrode 26a and CVD oxide film 28a.

Figure 18:
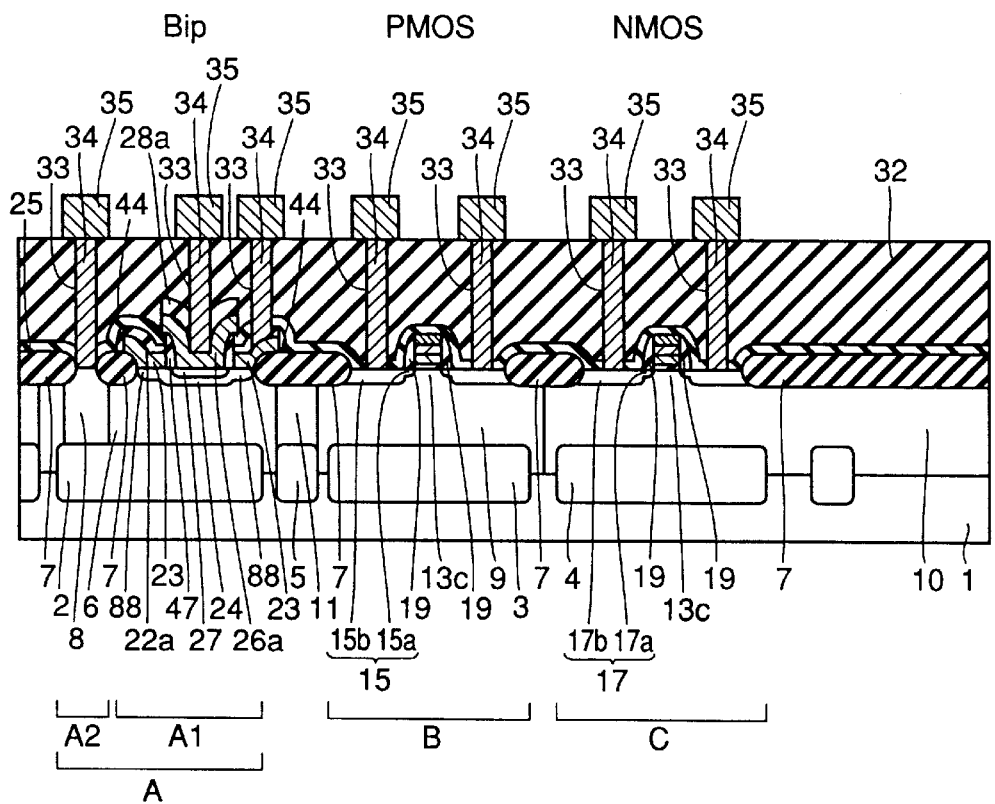

Thereafter, interlayer insulating film 32 is formed as shown in FIG. 18. Processing is performed to form contact holes 33 at interlayer insulating film 32 and more specifically at positions above collector wall region 8, emitter electrode 26a, external base leader electrode 23, and source/drain regions 15 and 17. Although not shown, contact holes 33 are formed also above the gate electrodes. Processing is performed to fill each contact hole 33 with metal film 34 made of, e.g., tungsten, and metal interconnection 35 made of, e.g., aluminum is formed on an upper surface of each metal film 34. In this manner, the BiCMOS element of the embodiment 1 is completed.

According to the process of manufacturing the BiCMOS of the embodiment 1, external base leader electrode layer 23b is used as the etching protection film for etching of the base/emitter region (A1) in the process of forming CMOS transistor region (B and C). Therefore, it is possible to prevent an etching damage to base/emitter region (A1) of the bipolar transistor during formation of the CMOS region without requiring an additional mask such as a resist. Further, the step of forming the etching protection film can be utilized also as the step of forming external base leader electrode layer 23b. As a result, the base/emitter region (A1) of the bipolar transistor can be protected from an etching damage while simplifying the manufacturing process. Since the layered film including polycrystalline silicon film 134 which will form gate electrode 13c is used as an etching protection film during formation of the base/emitter region (A1) of the bipolar transistor, the step of forming a portion which will form the gate electrode can be utilized also as the step of forming the protection film. Thereby, active regions (B and C) of the CMOS transistor and collector wall region (A2) can be protected from the etching damage while simplifying the manufacturing process. As a result, it is possible to prevent shaving of the active regions of the CMOS transistor and formation of irregularities at the surfaces of the active regions. Accordingly, disadvantageous occurrence of a junction leak current can be prevented.

Further, in the step shown in FIG. 10, CVD oxide film 22a is left to prevent exposure of the upper surface of external base leader electrode 23 during formation of side wall spacer 19 of gate electrode 13c. Therefore, external base leader electrode 23 is prevented from being subjected to the dry etching. Thereby, it is possible to prevent effectively the variation in electrical characteristics of the bipolar transistor which may be caused by variation in film thickness of external base leader electrode 23.

According to the process of manufacturing the BiCMOS of the embodiment 1, as described above, the region not related to the etching is coated with the protection film in each of the steps of forming the bipolar transistor and forming the CMOS transistor. Therefore, it is possible to prevent an etching damage to emitter/base active region (A1), collector wall region (A2), and active regions (B and C) of CMOS transistor. As a result, a problem such as a junction leak current can be prevented, and good and stable element characteristics can always be obtained.

(Embodiment 2)

Referring to FIGS. 19 to 22, a manufacturing process of an embodiment 2 will be described below.

A structure shown in FIG. 7 is formed through the same manufacturing process as the process of the embodiment 1 shown in FIGS. 1 to 7.

Figure 19:
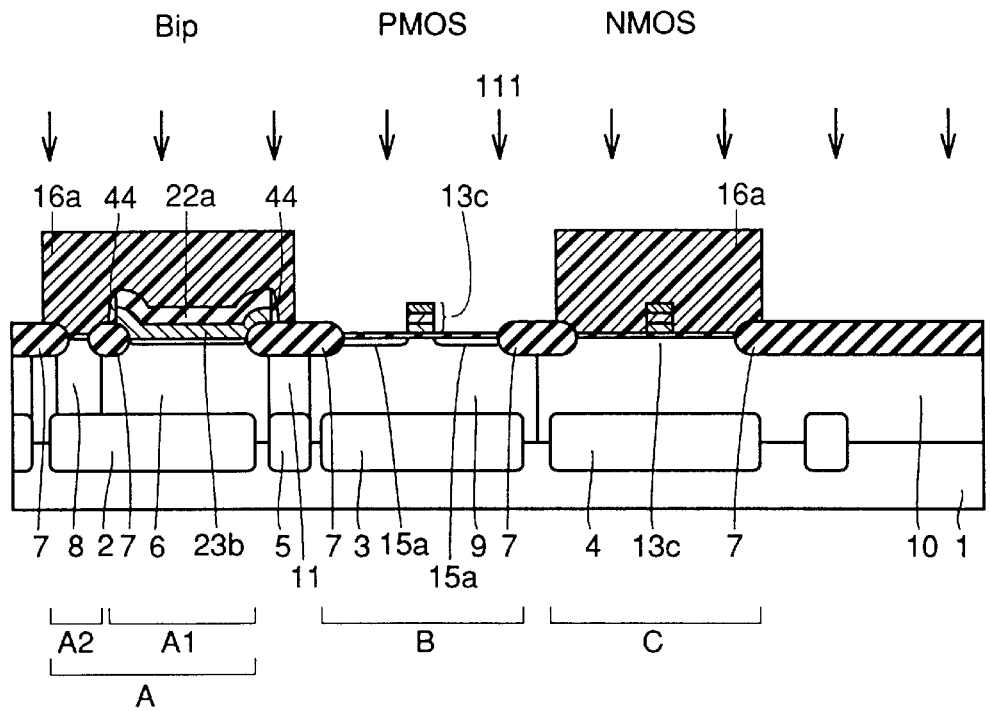
FIGS. 19 to 22 are cross sections showing a process of manufacturing a BiCMOS element of an embodiment 2 of the invention.

Then, as shown in FIG. 19, photoresist pattern 16a covering bipolar transistor part (A) and NMOS transistor part (C) is formed after patterning gate electrode 13c. P-type impurity 111 is implanted into the surface of N-well region 9 masked with photoresist pattern 16a and gate electrode 13c of PMOS transistor part (B), so that lightly doped P$^-$-type source/drain regions 15a are formed. In this implantation, for example, ions of BF$_2^+$ are implanted under the conditions of 25 KeV and $7\times10^{13}$cm$^{-2}$. Thereafter, photoresist pattern 16a is removed.

Figure 20:
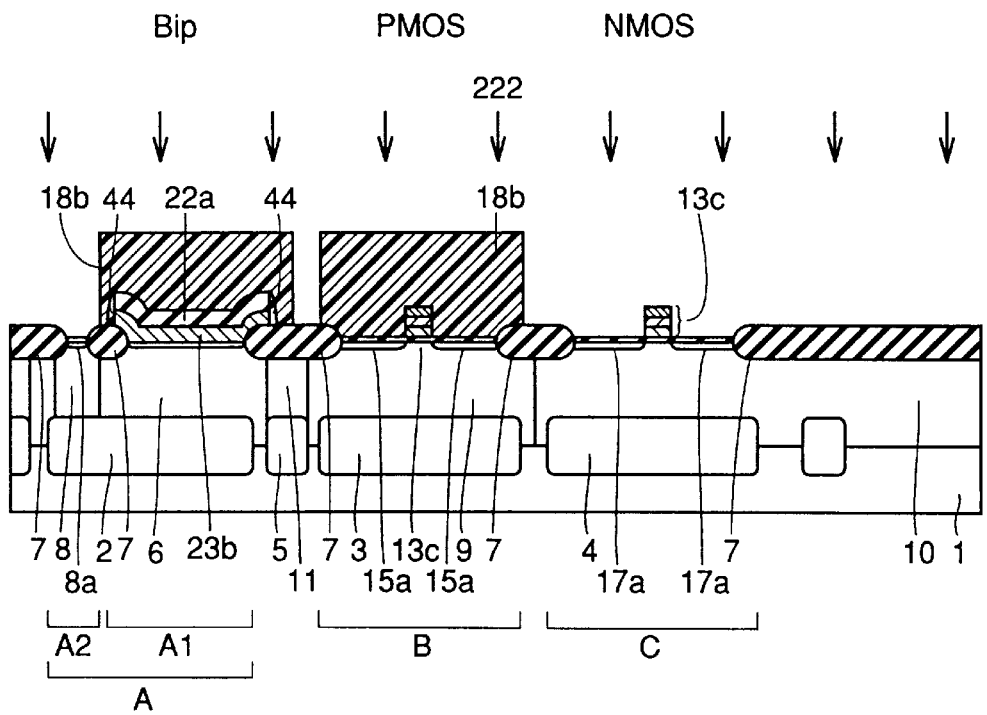

Then, as shown in FIG. 20, processing is performed to for a photoresist pattern 18b covering base/emitter region (A1) of the bipolar transistor part and PMOS transistor part (B).

Lightly doped N⁻-type source/drain regions 17a are formed by ion-implantation of N-type impurity 222 with a mask formed of photoresist pattern 18b and gate electrode 13c of NMOS transistor part (C). In this processing, N-type impurity 222 is implanted also into the surface of collector wall (A2) to form an N-type impurity region 8a. In this implantation, for example, ions of As⁺ are implanted under the conditions of 60 KeV and $3\times10^{13}$cm⁻². Thereafter, photoresist pattern 18b is removed.

Figure 21:
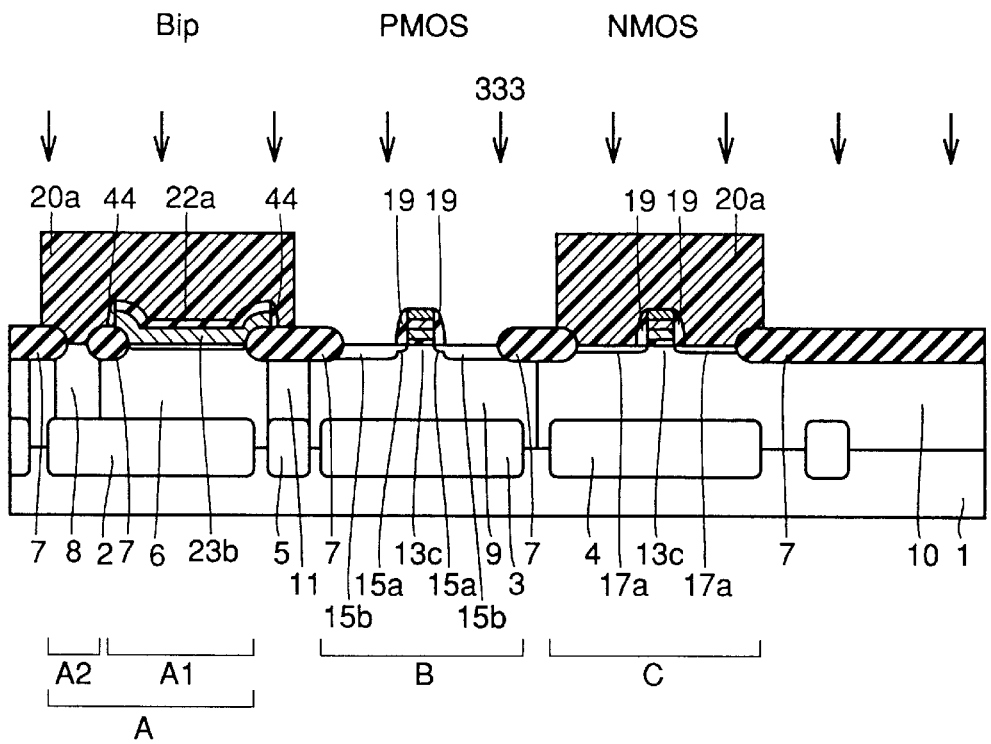

Then, a process similar to the process of the embodiment 1 shown in FIG. 10 is performed to form side wall spacer 19 at the side surface of gate electrode 13c as shown in FIG. 21. Processing is performed to form photoresist pattern 20a covering bipolar transistor part (A1 and A2) and NMOS transistor part (C). P-type impurity 333 is ion-implanted into the surface of N-type well region 9 masked with photoresist pattern 20a, gate electrode 13c of PMOS transistor part (B) and side wall spacer 19, so that heavily doped P⁺-type source/drain regions 15b are formed. Thereafter, photoresist pattern 20a is removed. The dry etching for forming side wall spacer 19 is performed to leave CVD oxide film 22a on base leader electrode layer 23b. Thereby, the upper surface of base leader electrode layer 23b is not shaved by the dry etching performed for forming side wall spacer 19, and therefore variation in film thickness of base leader electrode layer 23b does not occur. As a result, it is possible to prevent variation in electrical characteristics of the finally formed bipolar element.

Figure 22:
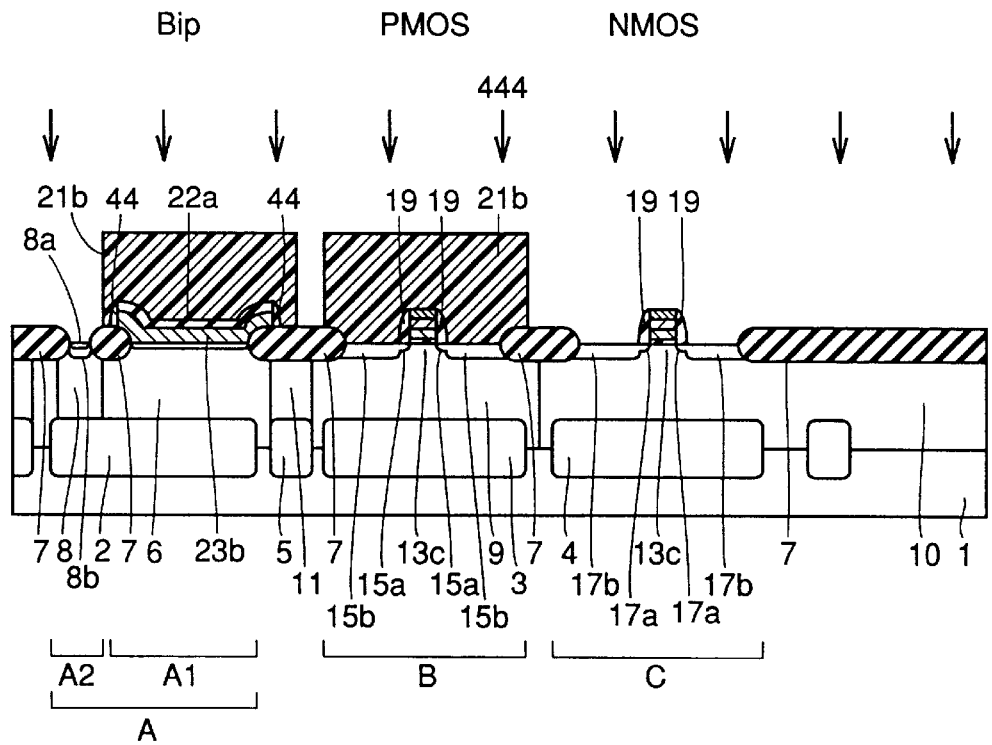

Then, as shown in FIG. 22, processing is performed to form a photoresist pattern 21b covering base/emitter active region (A1) of the bipolar transistor part and PMOS transistor part (B). N-type impurity 444 is implanted into the surface of P-type well region 10 masked with photoresist pattern 21b, gate electrode 13c of NMOS transistor part (C) and side wall spacer 19, so that heavily doped N⁺-type source/drain regions 15b are formed. In this processing, N-type impurity 444 is implanted also into collector wall region (A2). Thereby, an N-type impurity region 8b is formed.

Thereafter, a process similar to that of the embodiment 1 shown in FIGS. 14 to 18 is performed to complete the BiCMOS element of the embodiment 2.

According to the manufacturing process of the embodiment 2, N-type impurity 222 and 444 are implanted into the surface of collector wall region 8 of the bipolar transistor, so that it is possible to achieve the same effects as those of the embodiment 1 as well as an effect that the collector resistance can be reduced. Thereby, the drive performance and high-speed performance of the bipolar transistor can be improved, and consequently the bipolar transistor can have improved performances.

(Embodiment 3)

Referring to FIGS. 23 to 26, a manufacturing process of the embodiment 3 will be described below.

First, a structure shown in FIG. 15 is formed through a process similar to that of the embodiment 1 shown in FIGS. 1 to 15.

Figure 23:
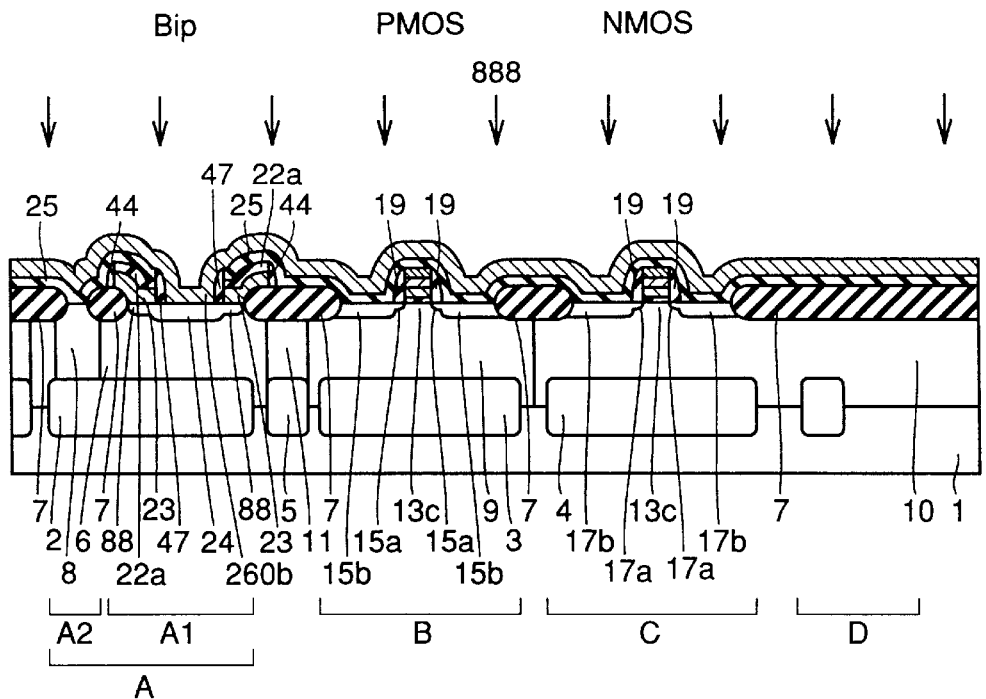
FIGS. 23 to 26 are cross sections showing a process of manufacturing a BiCMOS element of an embodiment 3 of the invention.

Thereafter, as shown in FIG. 23, a polycrystalline silicon film 260b of about 1000 Å in thickness is formed on the whole surface, and N-type impurity 888 is implanted into polycrystalline silicon film 260b. In this implantation, for example, ions of As⁺ are implanted under the conditions of 50 KeV and $1\times10^{13}$cm⁻². The purpose of this implantation is to determine a resistance value of an N-type polycrystalline silicon resistance, which will be described later, and an implantation dose and an implantation energy are controlled to attain the intended resistance value.

Figure 24:
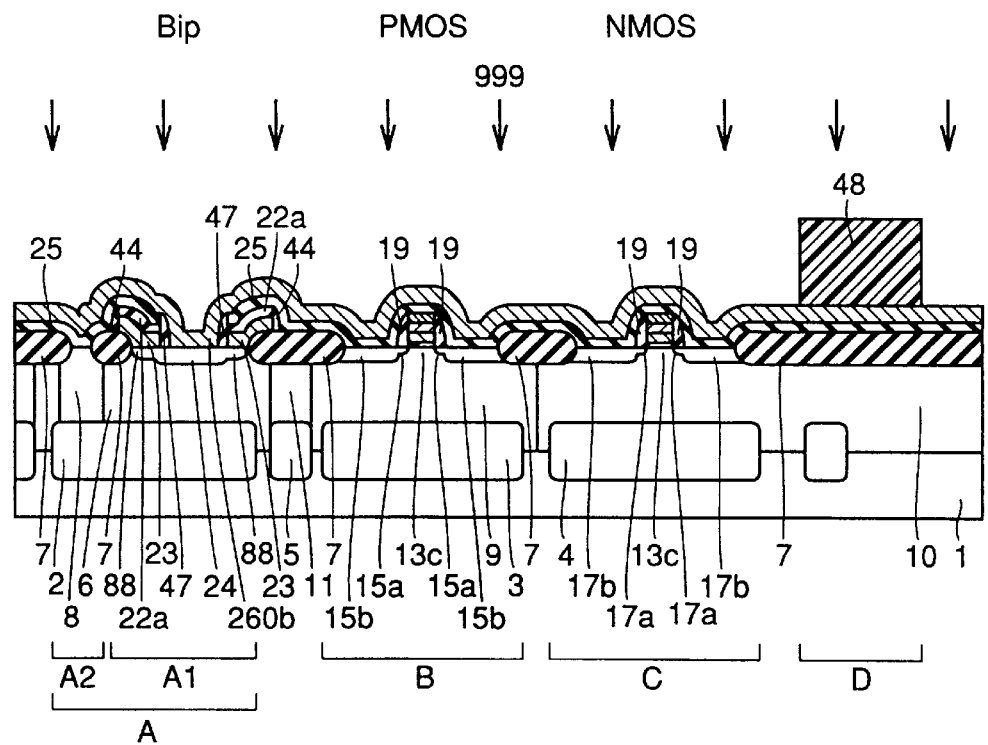

As shown in FIG. 24, a photoresist pattern 48 is formed on a region of polycrystalline silicon film 260b which will form the N-type polycrystalline silicon resistance, and then N-type impurity 999 is implanted into polycrystalline silicon film 260b masked with photoresist pattern 48. This implantation of N-type impurity 999 and the implantation of N-type impurity 888 in the former step determine the resistance value of the emitter electrode which will be formed later. Since emitter region 27 is formed by diffusing N-type impurity 888 and 999 implanted into the emitter electrode by a heat treatment which will be performed later, these two operations of implanting N-type impurity 888 and 999 determine the impurity concentration of emitter region 27.

Figure 25:
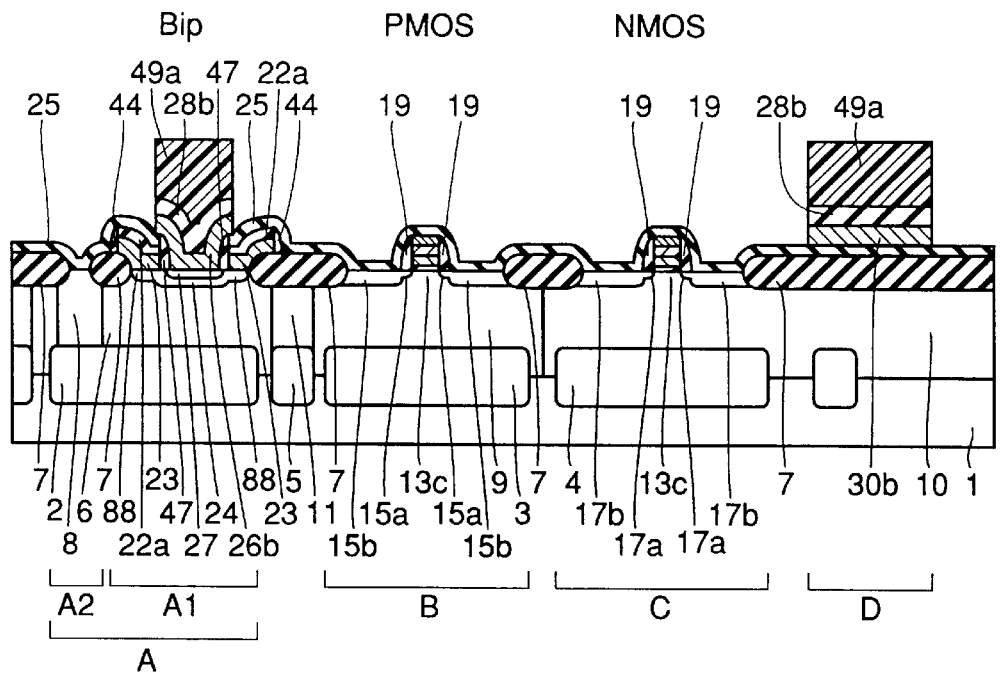

Thereafter, photoresist pattern 48 is removed. After depositing a CVD oxide film (not shown) of about 2000 Å in thickness on the whole surface, a photoresist pattern 49a shown in FIG. 25 is formed at a predetermined region on the CVD oxide film. Using the photoresist patter 49a as a mask, the underlying CVD oxide film and polycrystalline silicon film 260b are dry-etched to form emitter electrode 26b and CVD oxide film 28b which are patterned as shown in FIG. 25. Thereafter, photoresist pattern 49a is removed.

Figure 26:
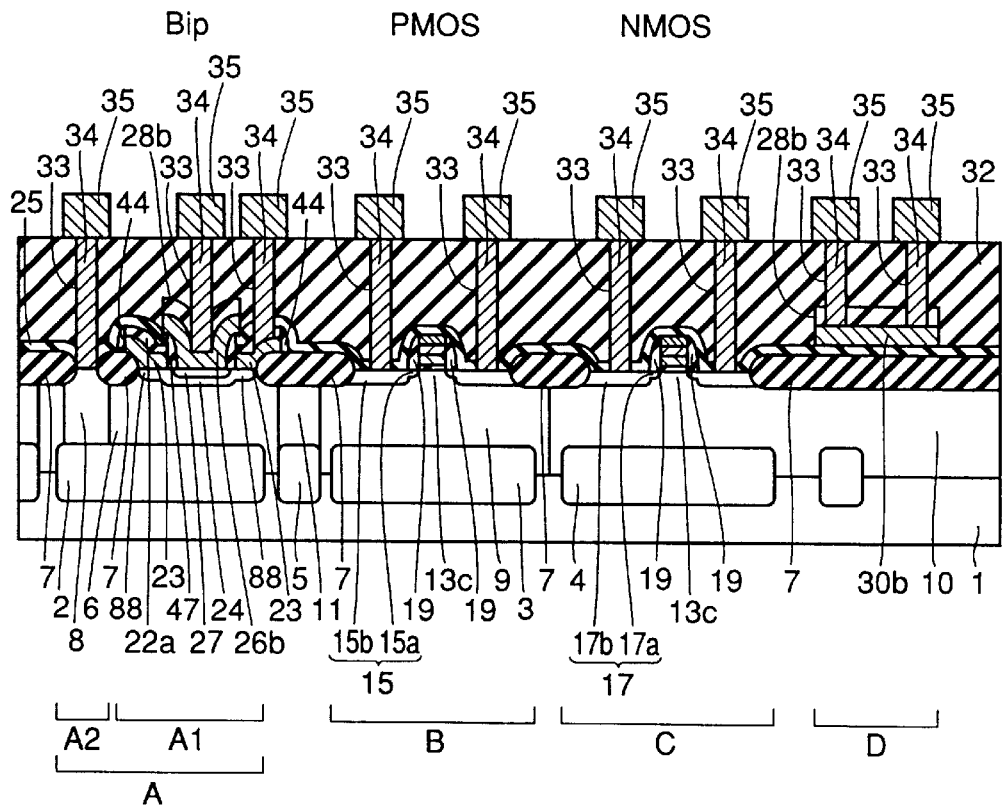

Finally, as shown in FIG. 26, interlayer insulating film 32 is formed, and then contact holes 33 are formed at predetermined regions of interlayer insulating film 32. Metal film 34 made of tungsten is formed in each contact hole 33. Metal interconnection 35 made of aluminum is formed on the upper surface of each metal film 34.

According to the manufacturing process of the embodiment 3 described above, polycrystalline silicon resistance 30b and emitter electrode 26b can be formed simultaneously through one step of depositing polycrystalline silicon film 260b and one step of dry-etching polycrystalline silicon film 260b. Owing to this, the times that the CMOS transistor active regions (B and C) are subjected to the polycrystalline silicon dry etching can be smaller by one than those in the prior art. As described above, this embodiment 3 can achieve the same effects as those of the foregoing embodiment 1, and can further achieve the effect that polycrystalline silicon resistance 30b and emitter electrode 26b can be formed simultaneously, so that the manufacturing steps can be reduced in number.

(Embodiment 4)

Figure 27:
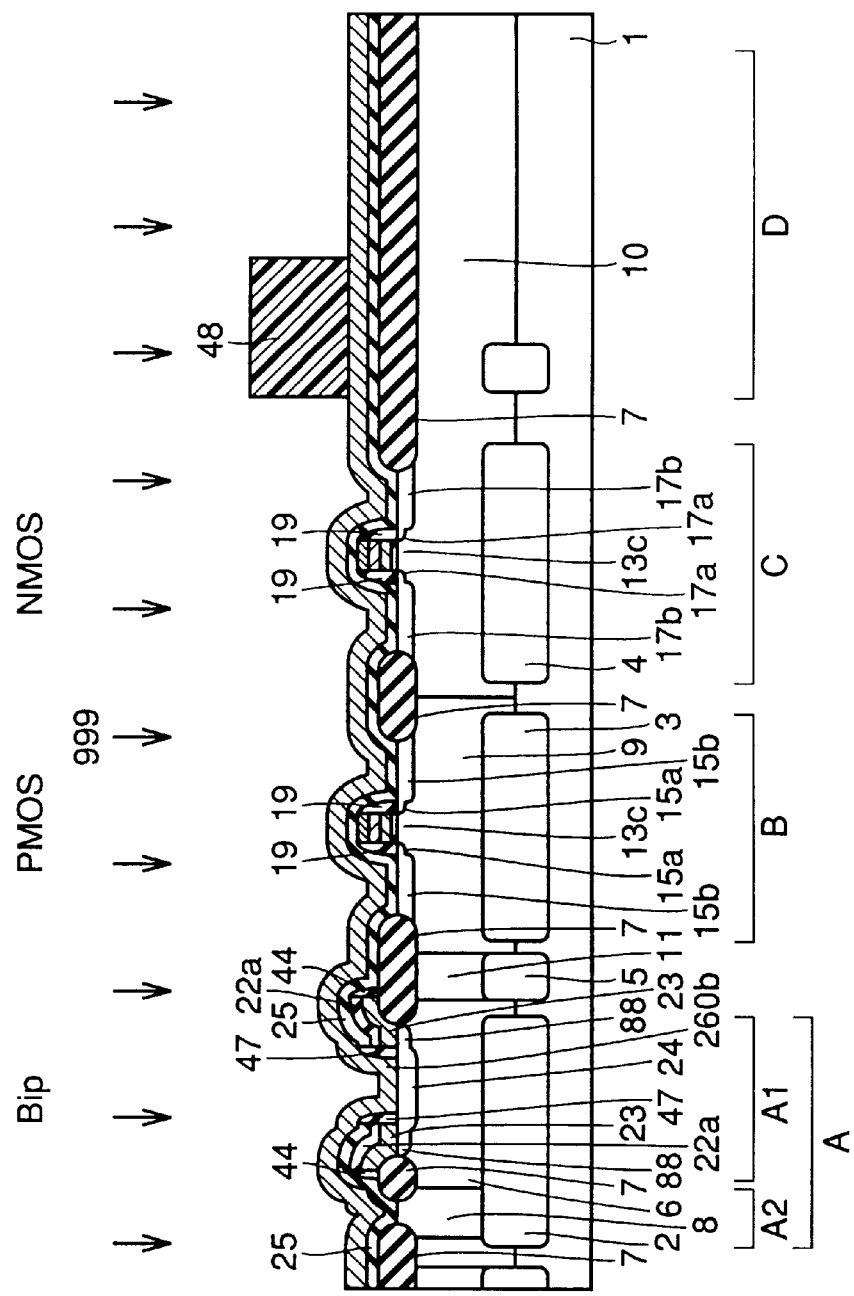
FIGS. 27 to 29 are cross sections showing a process of manufacturing a BiCMOS element of an embodiment 4 of the invention.
Figure 28:
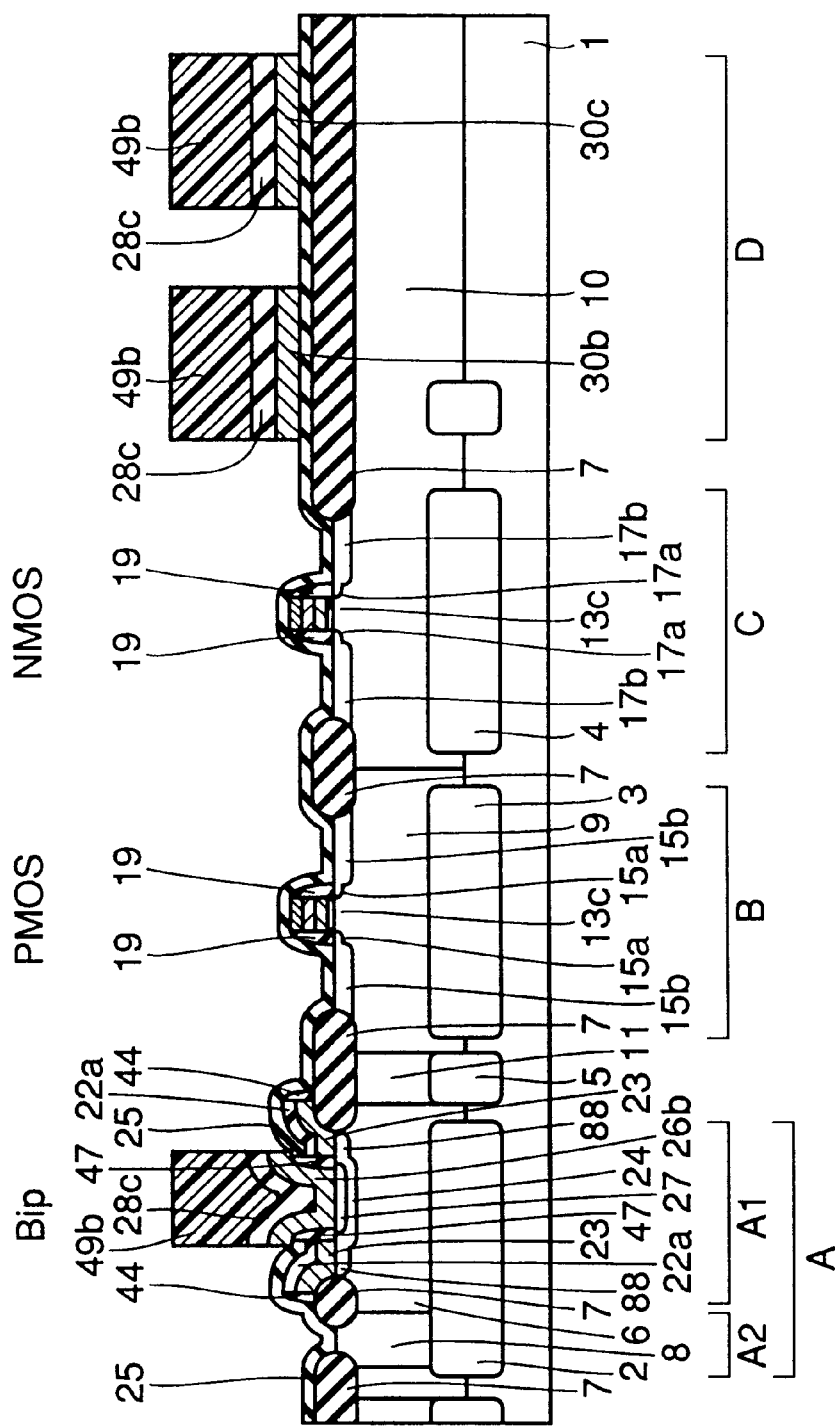
Figure 29:
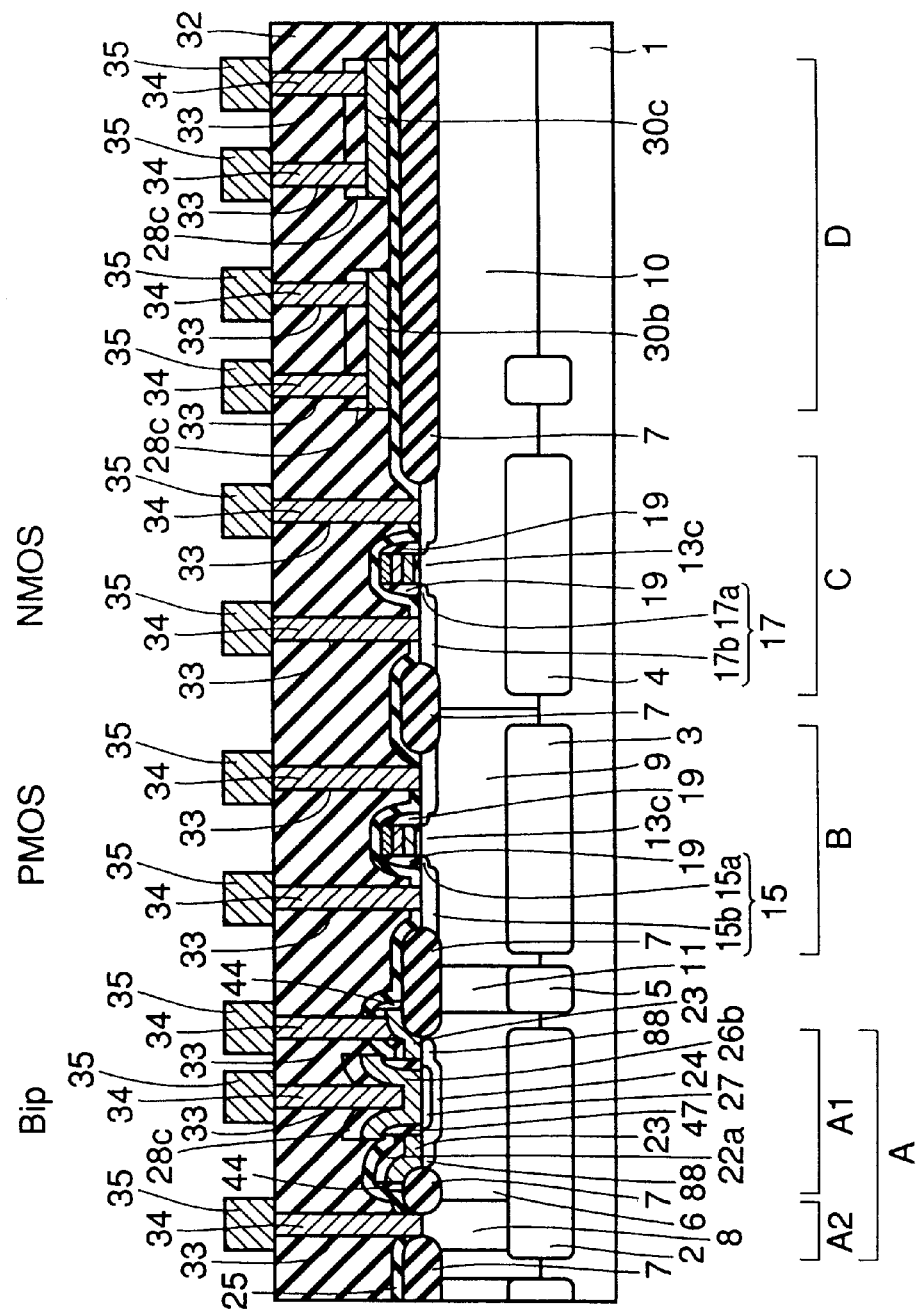

Referring to FIGS. 27 to 29, a manufacturing process of an embodiment 4 will be described below.

First, a structure shown in FIG. 15 is formed through a process similar to that of the embodiment 1 shown in FIGS. 1 to 15. Then, processing similar to that of the embodiment 2 shown in FIG. 23 is performed. More specifically, a polycrystalline silicon film 260b of about 1000 Å in thickness is formed on the whole surface, and N-type impurity 888 is implanted into polycrystalline silicon film 260b. In this implantation, for example, ions of As⁺ are implanted under the conditions of 50 KeV and $1\times10^{13}$cm⁻². The purpose of this implantation is to determine a resistance value of a first N-type polycrystalline silicon resistance 30c, which will be described later, and an implantation dose and an implantation energy are controlled to attain the intended resistance value.

Thereafter, as shown in FIG. 27, photoresist pattern 48 is formed on a region of polycrystalline silicon film 260b, which will form N-type polycrystalline silicon resistance 30b. N-type impurity 999 is implanted into polycrystalline silicon film 260b masked with photoresist pattern 48. Thereafter, photoresist pattern 48 is removed. This implantation of N-type impurity 999 and the implantation of N-type impurity 888 at the former step determine the dose of impurity implanted into emitter electrode 26b which will be formed later. Polycrystalline Silicon film 260b into which the N-type impurity was implanted through two implanting steps is used as second polycrystalline silicon resistance 30c which will be described later.

After forming the step shown in FIG. 27, a CVD oxide film (not shown) of about 2000 Å in thickness is formed on the whole surface, and a photoresist pattern 49b is formed at a predetermined region on this CVD oxide film. Dry etching is performed with a mask formed of photoresist pattern 49b to form simultaneously emitter electrode 26b, first N-type polycrystalline silicon resistance 30b and second N-type polycrystalline silicon resistance 30c as well as a CVD oxide film 28c overlying them. Thereafter, photoresist pattern 49b is removed.

Finally, as shown in FIG. 29, interlayer insulating film 32 is formed, and contact holes 33 are formed at predetermined regions of interlayer insulating film 32. Processing is also performed to fill each contact hole 33 with metal film 34 made of, e.g., tungsten. Metal interconnections made of, e.g., aluminum are formed at upper surfaces of metal films 34, respectively, so that the BiCMOS element of the embodiment 4 is completed.

According to the manufacturing process of the embodiment 4, as described above, two kinds of resistances having different resistance values, i.e., first and second N-type polycrystalline silicon resistances 30b and 30c can be formed simultaneously by one step of depositing polycrystalline silicon film 260b and one step of dry-etching. As a result, the manufacturing process can be remarkably simplified. A magnitude of resistance (the number of sheets) for achieving an intended resistance value can be small. If two kinds of resistances of, e.g., 500 $\Omega/\square$ and 2000 $\Omega/\square$ have been prepared and a resistance of 2000 ohms is required, this resistance value can be achieved only by one resistance sheet of 2000 $\Omega/\square$. However, if only one kind of resistance of 500 $\Omega/\square$ has been prepared and a resistance of 2000 ohms is required, four sheets each having a resistance of 500 $\Omega/\square$ must be arranged in series. This requires a large area. In this embodiment 4, however, two kinds of resistances can be formed from one polycrystalline silicon film 260b as described above, so that the area can be small, and consequently high-density integration is allowed.

(Embodiment 5)

Referring to FIGS. 30 to 33A and 33B, a manufacturing process of an embodiment 5 will be described below.

Figure 6:
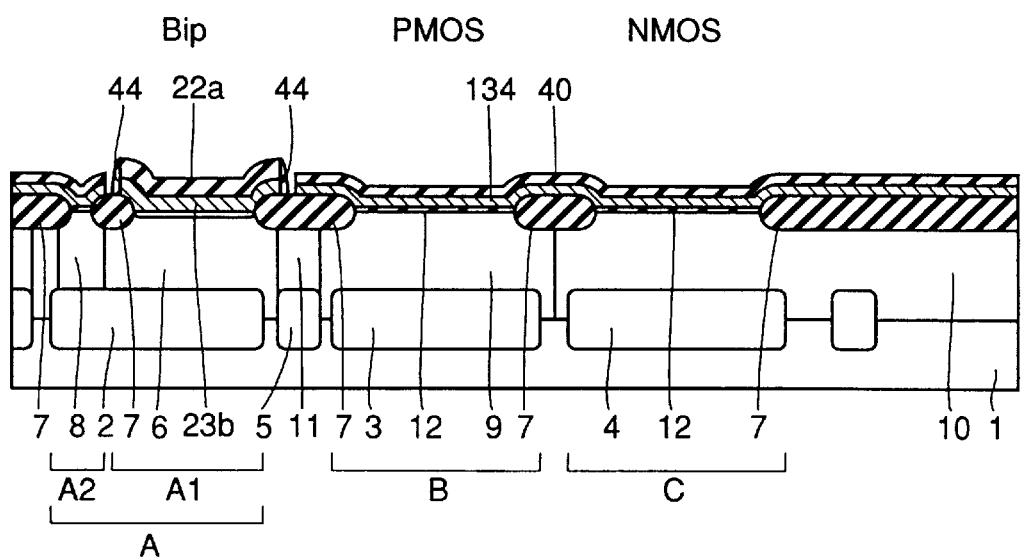
Figure 30:
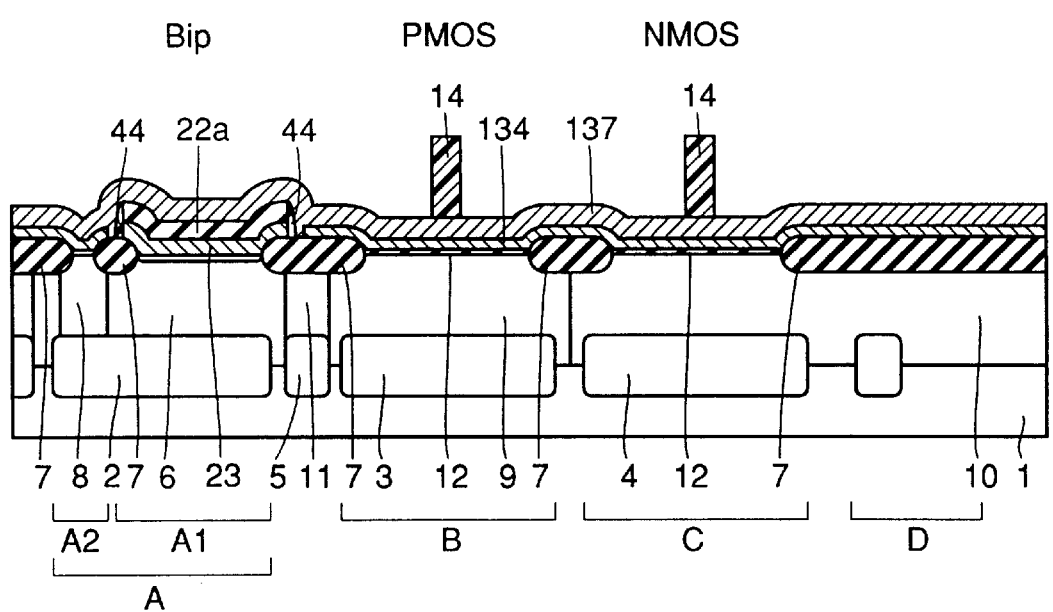
FIGS. 30, 31A, 31B, 32A, 32B, 33A and 33B are cross sections showing a process of manufacturing a BiCMOS element of an embodiment 5 of the invention.
Figure 31A:
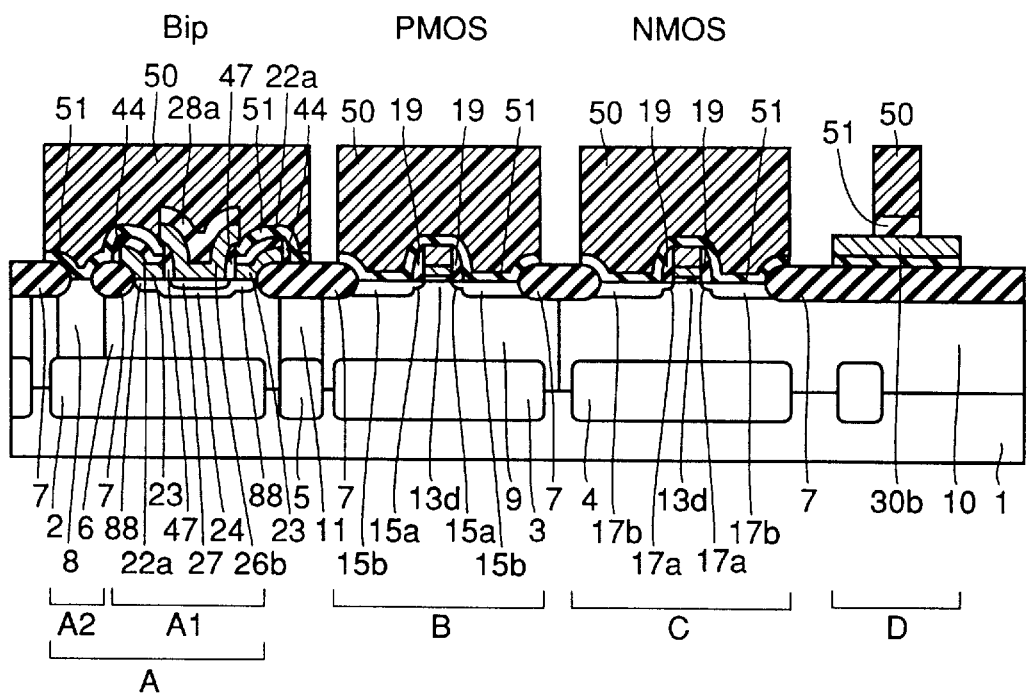
Figure 31B:
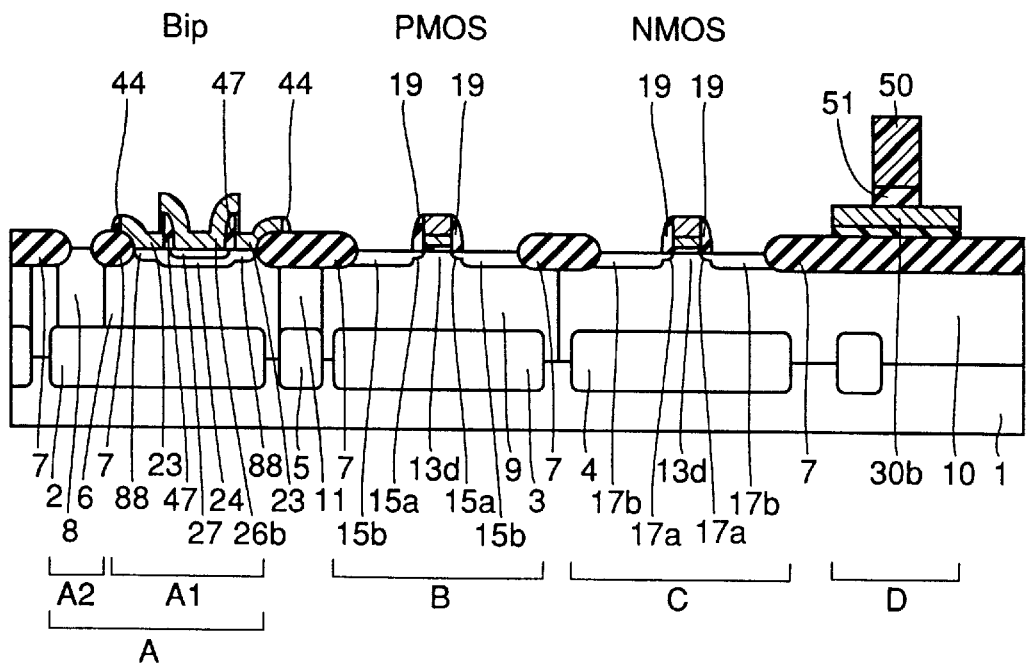

First, a structure shown in FIG. 6 is formed through a process similar to that of the embodiment 1 shown in FIGS. 1 to 6. Then, nitride film 40 shown in FIG. 6 is removed, and subsequently, as shown in FIG. 30, an N-type polycrystalline silicon film 137 of about 2000 Å in thickness is formed on the exposed surface of polycrystalline silicon film 134. After forming photoresist pattern 14 at a predetermined region on N-type polycrystalline silicon film 137, dry etching is effected on N-type polycrystalline silicon film 137 and polycrystalline silicon film 134 masked with photoresist pattern 14. Thereby, a gate electrode 13d of two-layer structure shown in FIGS. 31A and 31B is formed. Thereafter, a process similar to that of the embodiment 1 shown in FIGS. 8 to 15 and a process similar to that of the embodiment 2 shown in FIGS. 23 to 25 are performed. Then, as shown in FIGS. 31A and 31B, a photoresist pattern 50 is formed at a portion of the element formation region at which a metal silicide film is not to be formed. Using this photoresist pattern 50 as a mask, dry etching is effected on an underlaying CVD oxide film 51 for patterning the same. Thereafter, photoresist pattern 50 is removed.

Figure 32A:
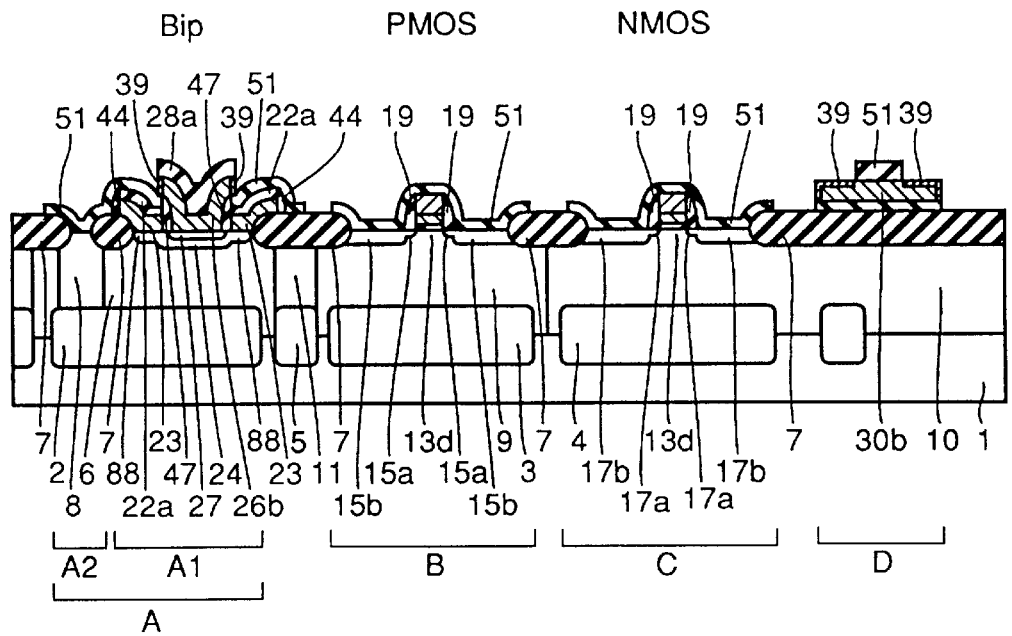
Figure 32B:
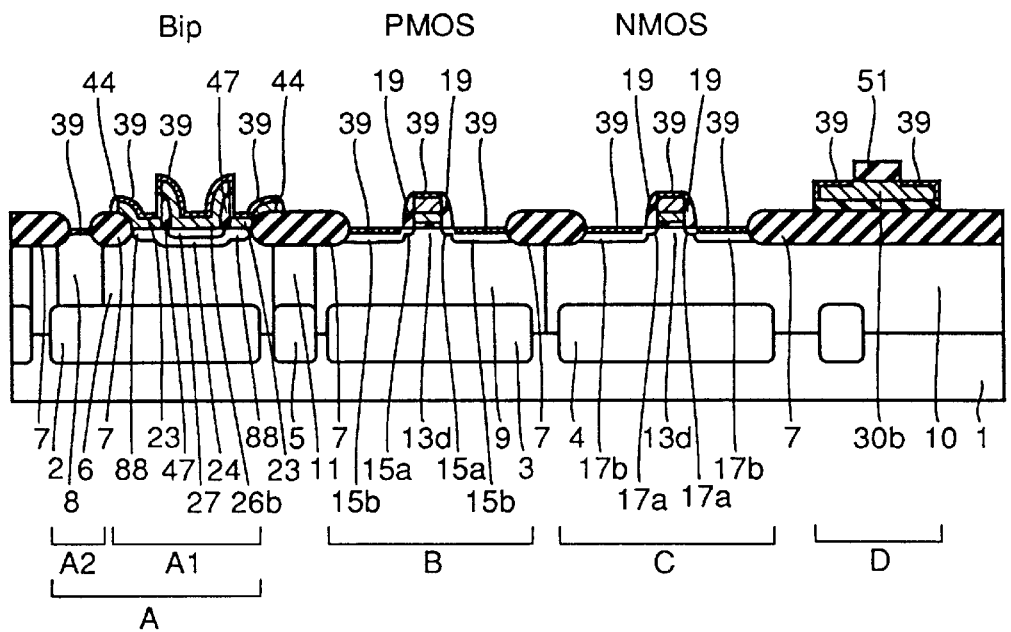

A metal film of, e.g., cobalt is deposited on the whole surface of the above structure, and lamp annealing is performed several times, so that metal silicide films 39 shown in FIGS. 32A and 32B are formed only on the silicon and polycrystalline silicon. In this manner, the element provided with metal silicide film 39 and the element not provided with metal silicide film 39 are selectively formed easily.

Figure 33A:
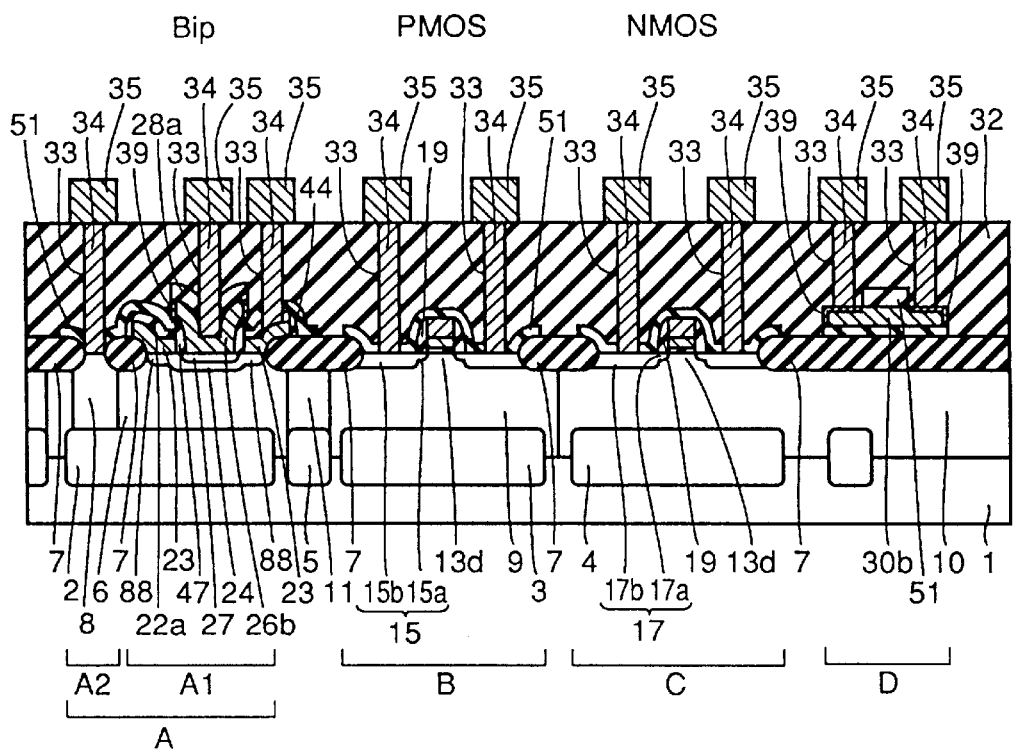
Figure 33B:
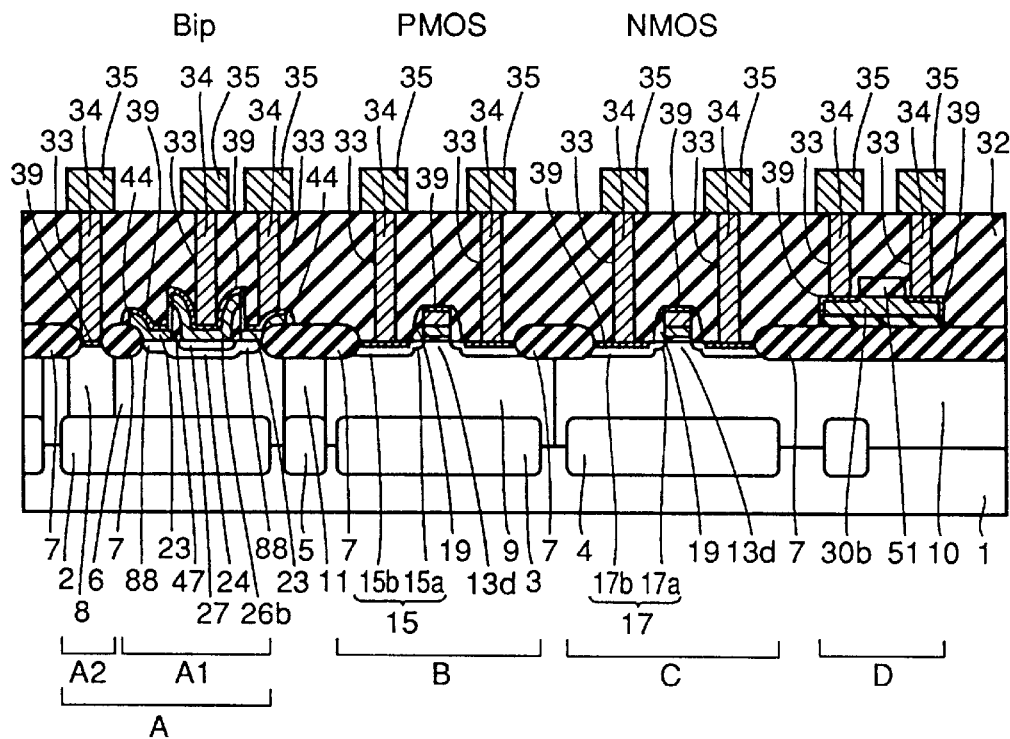

Thereafter, as shown in FIGS. 33A and 33B, interlayer insulating film 32 is formed, and contact holes 33 are formed at predetermined regions of interlayer insulating film 32. Processing is performed to fill each contact hole 33 with metal film 34 made of, e.g., tungsten. Metal interconnection 35 made of, e.g., aluminum is formed on the supper surface of each metal film 34, so that the BiCMOS element of the embodiment 5 is completed.

According to the manufacturing process of the embodiment 5, as described above, the layered film formed of polycrystalline silicon film 134, nitride film 40 and CVD oxide film 41 covers the surface except for that of emitter/base active region (A1) during formation of external base leader electrode 23 of the bipolar transistor. Therefore, reduction in film thickness of field oxide film 7 can be suppressed. Thereby, metal silicide film 39 which is ultimately formed does not cause short-circuiting in contrast to the prior art shown in FIG. 112. Since the element of a low resistance having metal silicide film 39 is selectively formed, it is possible to form the bipolar transistor and the CMOS transistor, which are provided at the element surfaces with metal silicide films 39 and have good drive performances and good speed performances, as well as the ordinary transistor not provided at the element surface with metal silicide film 39.

(Embodiment 6)

Referring to FIGS. 34 to 38A and 38B, a manufacturing process of an embodiment 6 will be described below.

Figure 34:
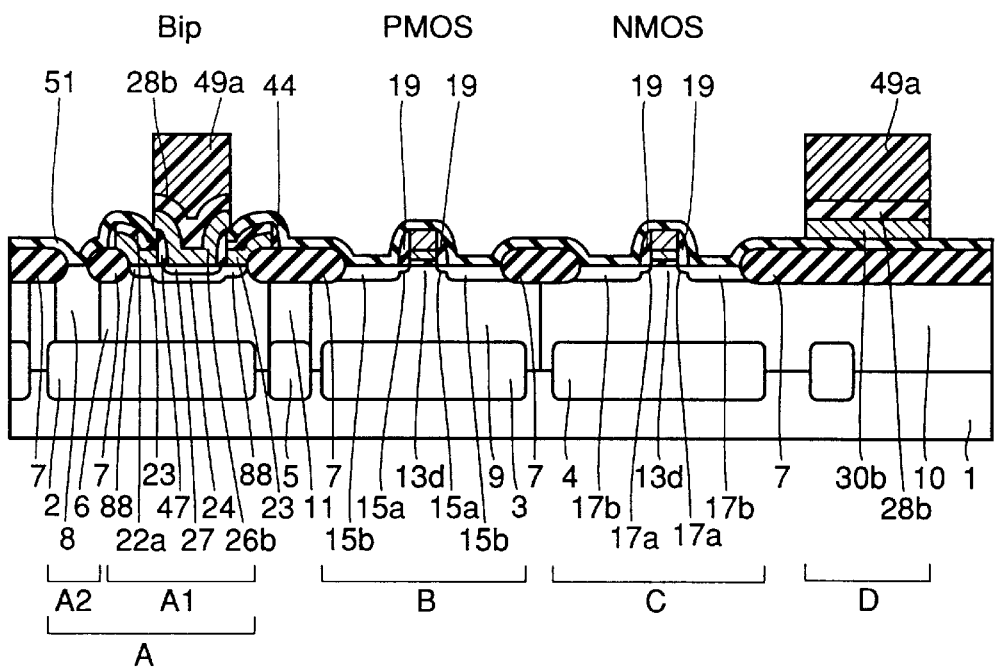
FIGS. 34, 35, 36A, 36B, 37A, 37B, 38A and 38B are cross sections showing a process of manufacturing a BiCMOS element of an embodiment 6 of the invention.

First, a structure shown in FIG. 34 is formed by a process similar to that of the embodiment 5 already described. Thereafter, photoresist pattern 49a is removed.

Figure 35:
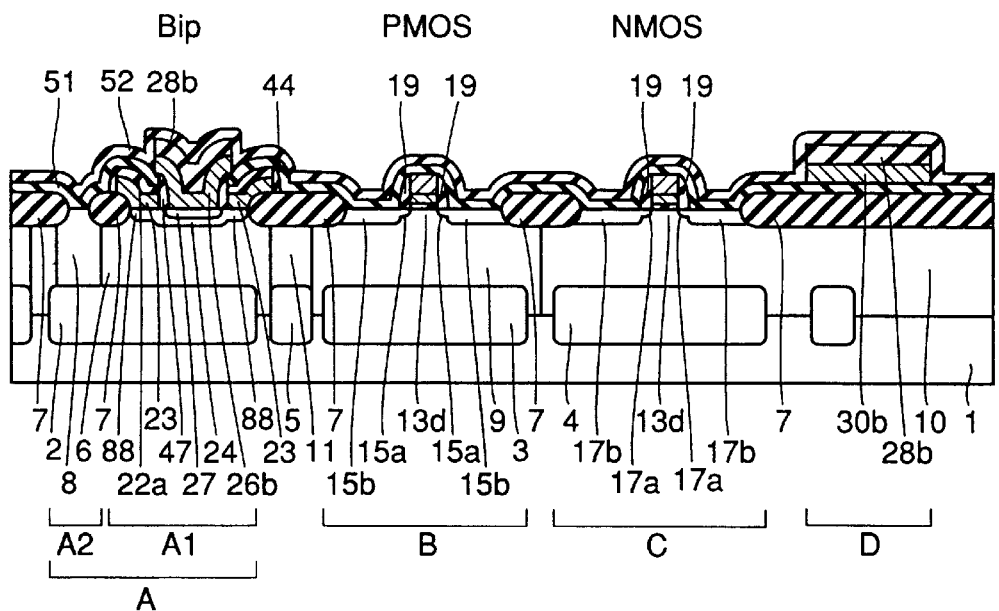
Figure 36A:
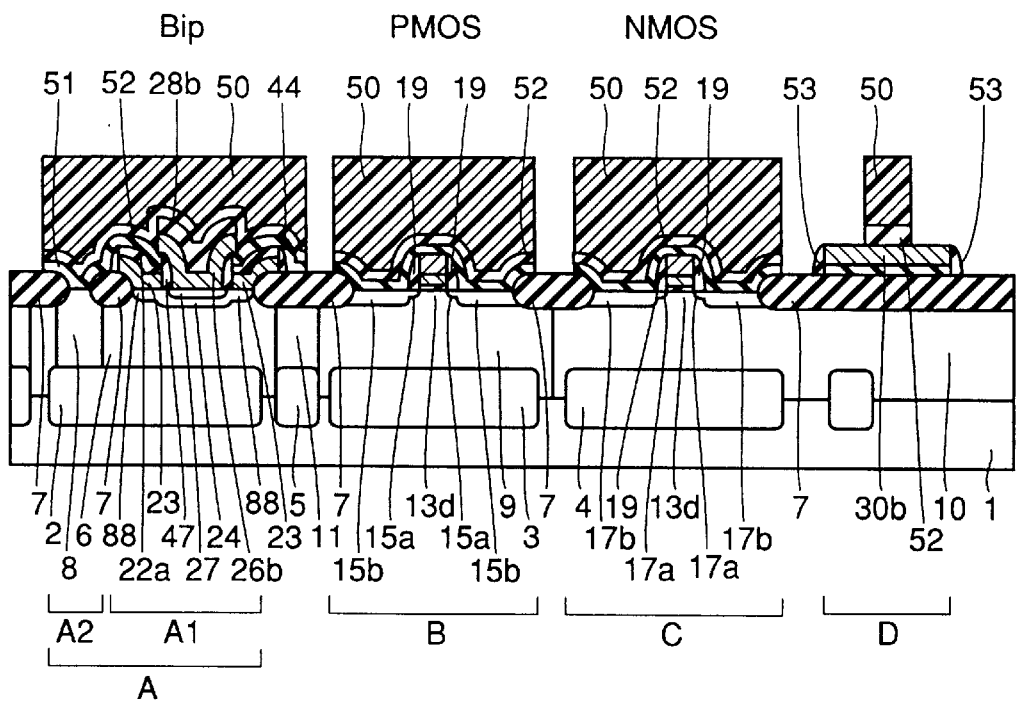
Figure 36B:
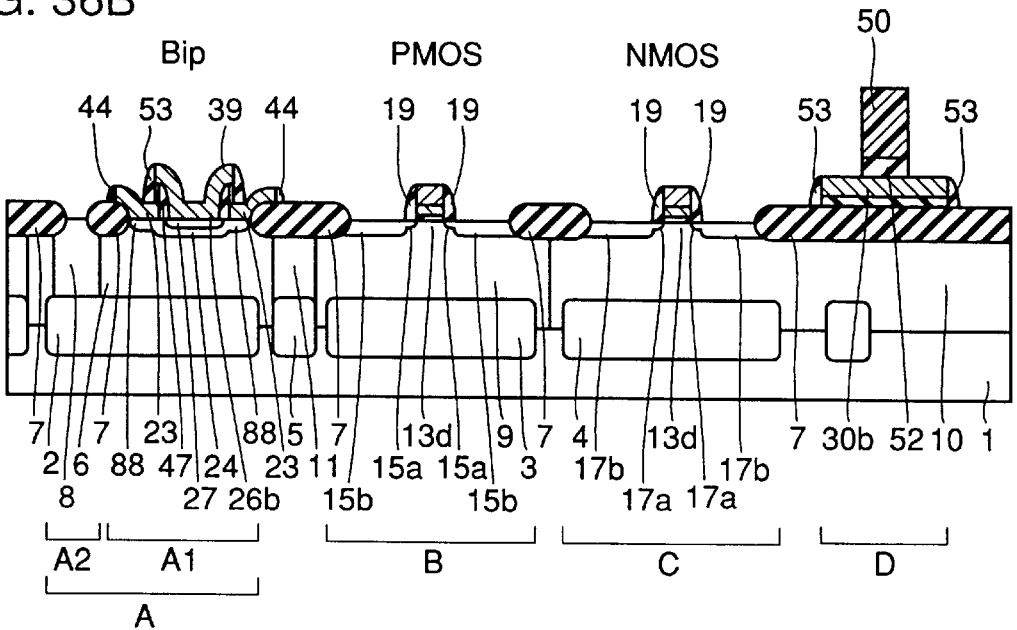

Then, as shown in FIG. 35, a CVD oxide film 52 of about 1000 Å in thickness is formed on the whole surface. Then, as shown in FIGS. 36A and 36B, processing is performed to form photoresist pattern 50 covering a region not provide with metal silicide film 39 which will be described later. CVD oxide film 52 is patterned with a mask formed of photoresist pattern 50. Etching for this patterning forms side wall spacers 53 at the side surfaces of emitter electrode 26b shown in FIG. 36B and first polycrystalline silicon resistance 30b shown in FIGS. 36A and 36B. Thereafter, photoresist pattern 50 is removed.

Figure 37A:
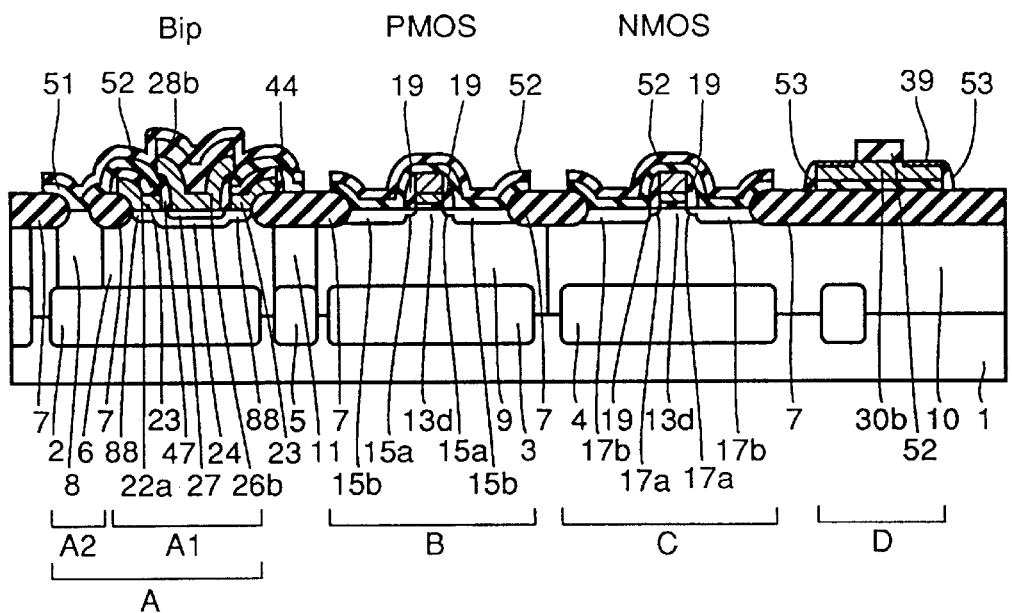
Figure 37B:
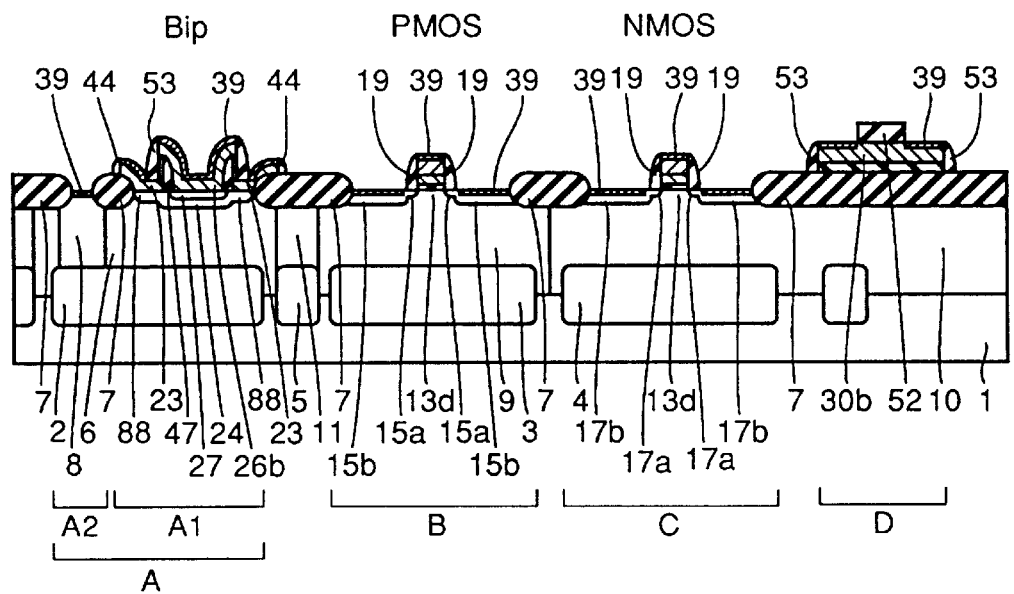

Then, as shown in FIGS. 37A and 37B, a metal film made of, e.g., cobalt is deposited on the whole surface, and subsequently lamp annealing is performed several times, so that metal silicide film 39 is formed on the silicon and polycrystalline silicon. Metal silicide films 39 are left only on the silicon and polycrystalline silicon by removing the metal film from regions other than those. According to the process of the embodiment 6, side wall spacers 53 are formed at the side surface of first polycrystalline silicon resistance 30b and the side surface of emitter electrode 26b. Therefore, metal silicide film 39 is not formed at the portions provided with the side wall spacers 53 in contrast to the embodiment 5 already described.

Figure 38A:
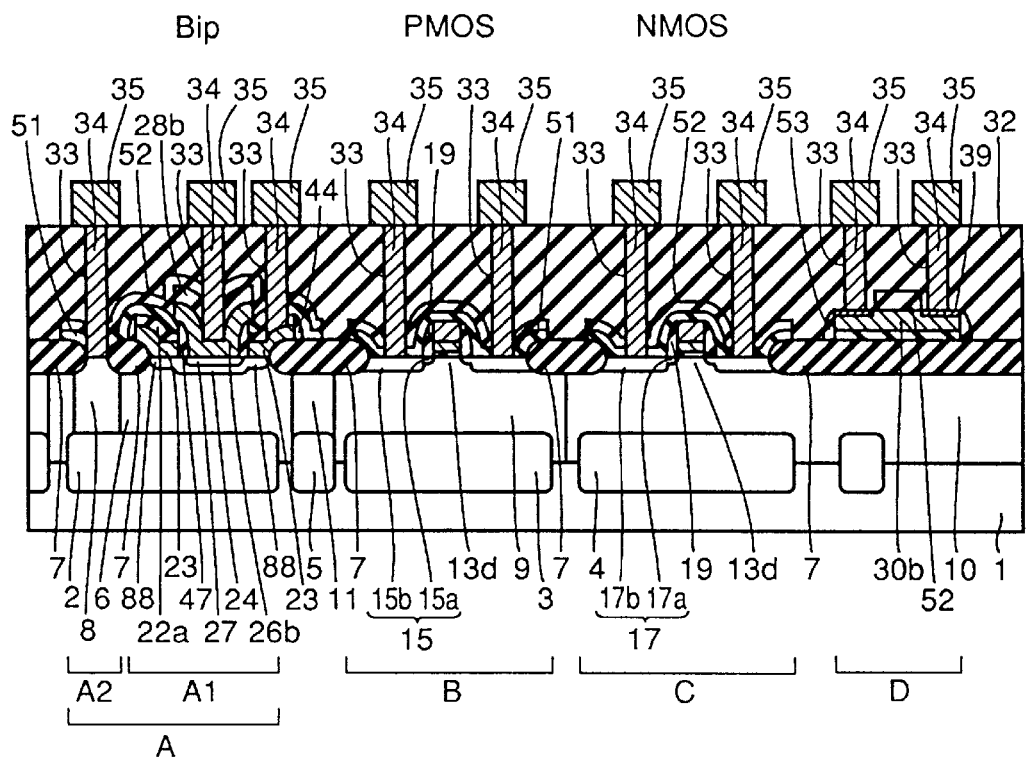
Figure 38B:
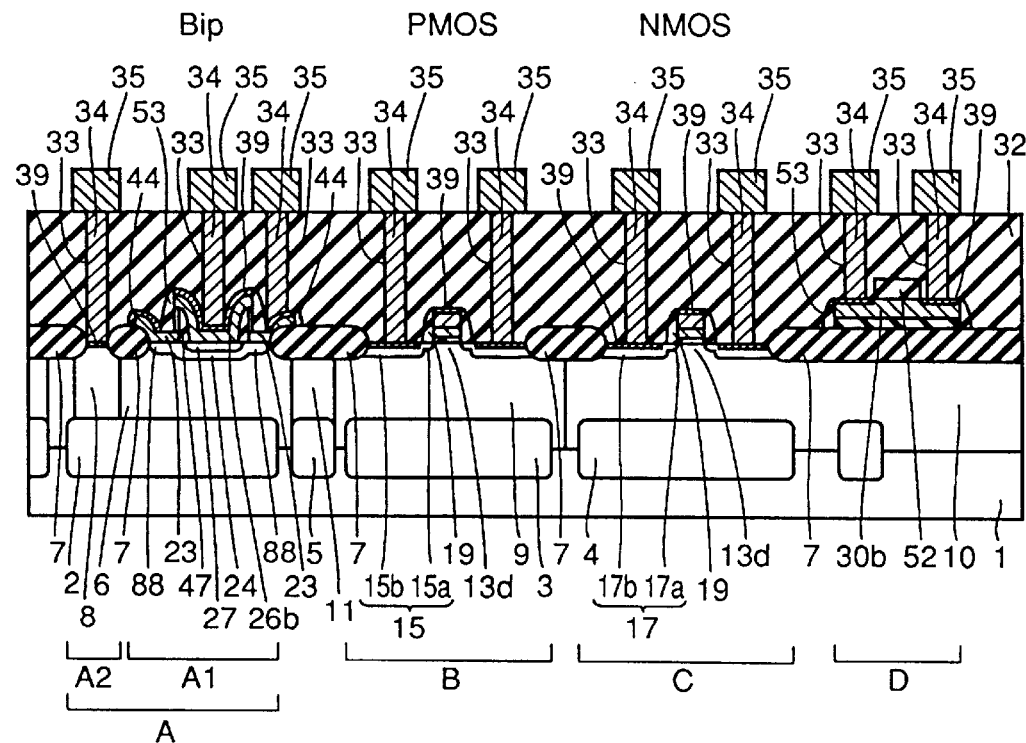

Then, as shown in FIGS. 38A and 38B, interlayer insulating film 32 is formed, and contact holes 33 are formed at predetermined regions of interlayer insulating film 32. After filling each contact hole 33 with metal film 34, metal interconnection 35 is formed on the upper surface of each metal film 34. Thereby, the BiCMOS element of the embodiment 6 is completed.

According to the process of the embodiment 6 described above, since side wall spacer 53 is formed at the side surface of emitter electrode 26*b*, metal silicide film 39 is formed only on the upper surface of emitter electrode 26*b*. Thereby, a long distance can be kept between the metal silicide film 39 formed on the upper surface of emitter electrode 26*b* and metal silicide film 39 formed on the upper surface of external base leader electrode 23, so that short-circuiting between emitter electrode 26*b* and external base leader electrode 23 can be prevented.

(Embodiment 7)

Figure 39:
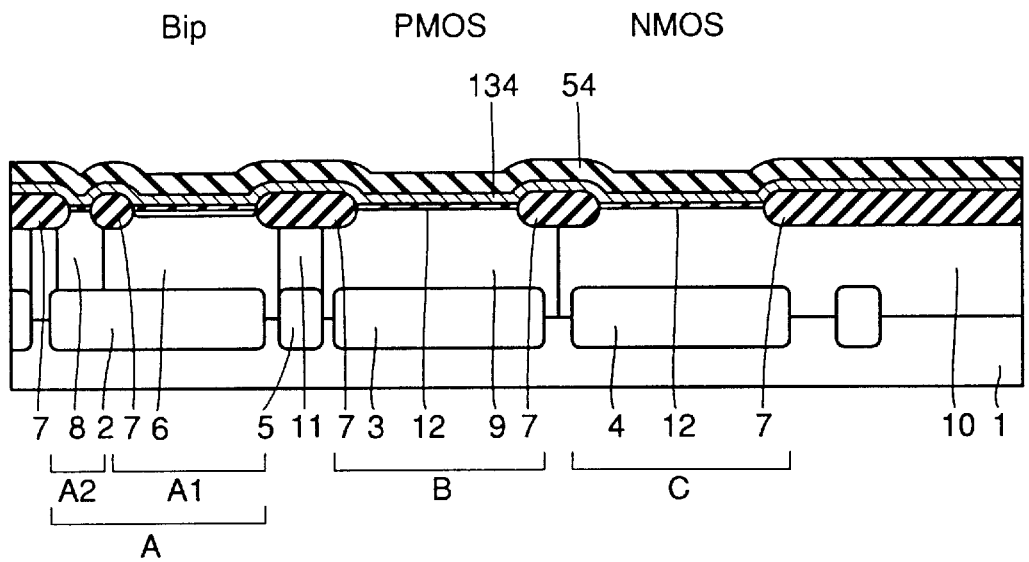
FIGS. 39 to 41 are cross sections showing a process of manufacturing a BiCMOS element of an embodiment 7 of the invention.
Figure 40:
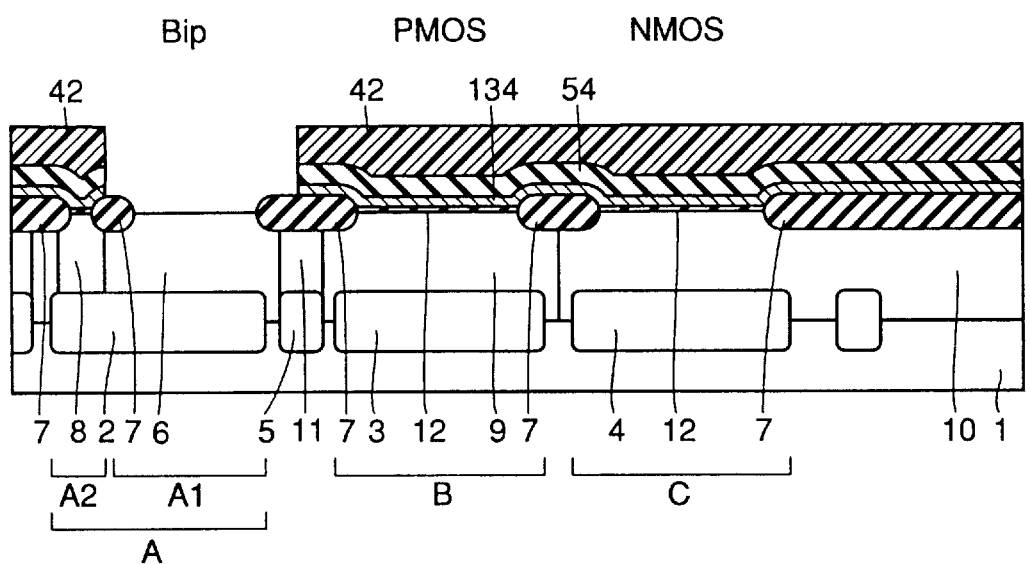
Figure 41:
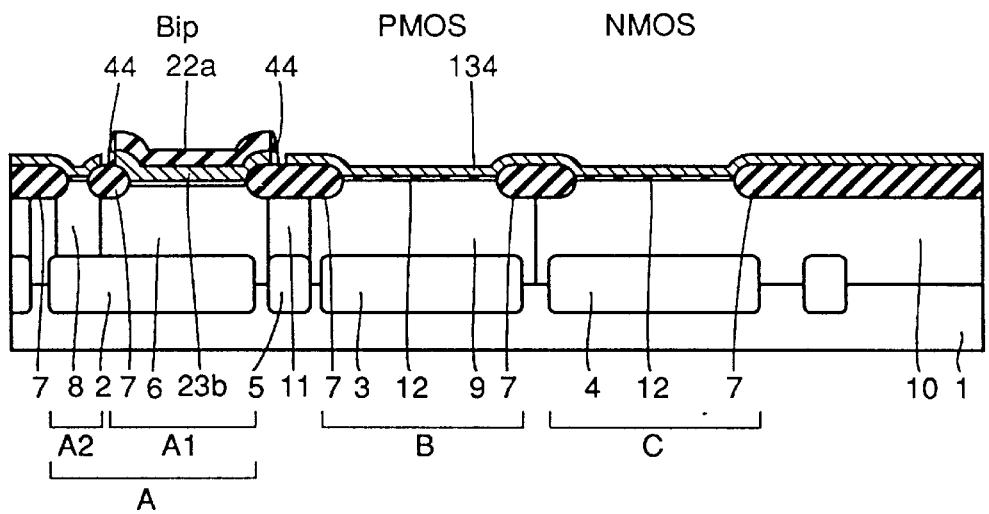

Referring to FIGS. 39 to 41, a manufacturing process of an embodiment 7 will be described below.

Through a process similar to that of the embodiment 1 shown in FIG. 1, gate oxide film 12 is formed on active region (A) of the bipolar transistor and active regions (B and C) of the CMOS transistor as shown in FIG. 39. Thereafter, polycrystalline silicon film 134 of about 500 Å in thickness and CVD oxide film 54 of about 500 Å in thickness are successively formed.

Thereafter, as shown in FIG. 40, a photoresist pattern 42 is formed, and dry etching is effected on underlying CVD oxide film 54 and polycrystalline silicon film 134 masked with photoresist pattern 42. Thereby, a structure shown in FIG. 40 is formed. Then, photoresist pattern 42 is removed. Thereafter, a process similar to that of the embodiment 1 shown in FIGS. 4 and 5 is performed.

After depositing a CVD oxide film (not shown) of about 2000 Å in thickness on the whole surface, dry etching is performed, so that side wall spacer 44 is formed at side surfaces of external base leader electrode layer 23*a* and CVD oxide film 22*a*. The etching for forming side wall spacer 44 completely removes CVD oxide film 43 on polycrystalline silicon film 134. Thereafter, a process similar to that of the embodiment 1 is performed, so that the BiCMOS element of the embodiment 7 is completed.

The embodiment 7 employs the layered film formed of polycrystalline silicon film 124 and CVD oxide film 54 instead of the layered film in the embodiment 1 formed of polycrystalline silicon film 134, nitride film 40 and CVD oxide film 41. Therefore, the steps can be smaller in number than those of the embodiment 1.

(Embodiment 8)

Referring to FIGS. 42A and 42B to FIGS. 44A and 44B, a manufacturing process of an embodiment 8 will be described below.

Figure 42A:
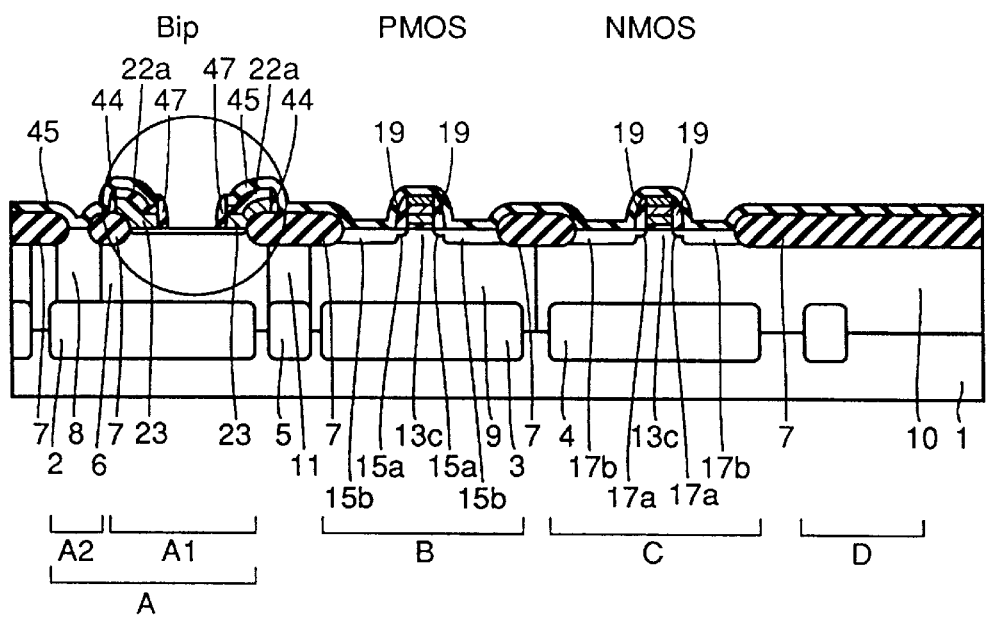
FIGS. 42A, 42B, 43, 44A and 44B are cross sections showing a process of manufacturing a BiCMOS element of an embodiment 8 of the invention.
Figure 42B:
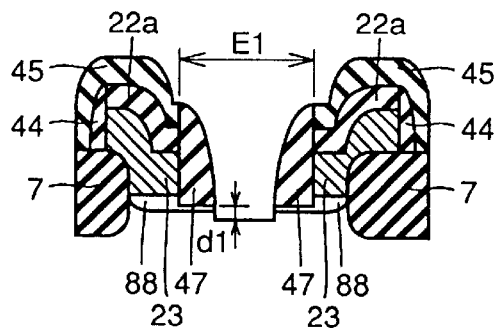

A manufacturing process similar to that of the embodiment 1 shown in FIGS. 1 to 13 is performed to form a structure having opening E1 for the emitter. Thereafter, photoresist pattern 46 is removed. A CVD oxide film (not shown) of about 2000 Å in thickness is deposited on the whole surface, and then is dry-etched to form side wall spacer 47 at side surfaces of external base leader electrode 23 and CVD oxide film 22*a* and CVD oxide film 45 in opening E1 for the emitter. Although not discussed in the foregoing embodiments 1 to 7, the surface of silicon substrate 1 is actually shaved by d1 when forming side wall spacer 47, as shown in FIG. 42B.

Figure 43:
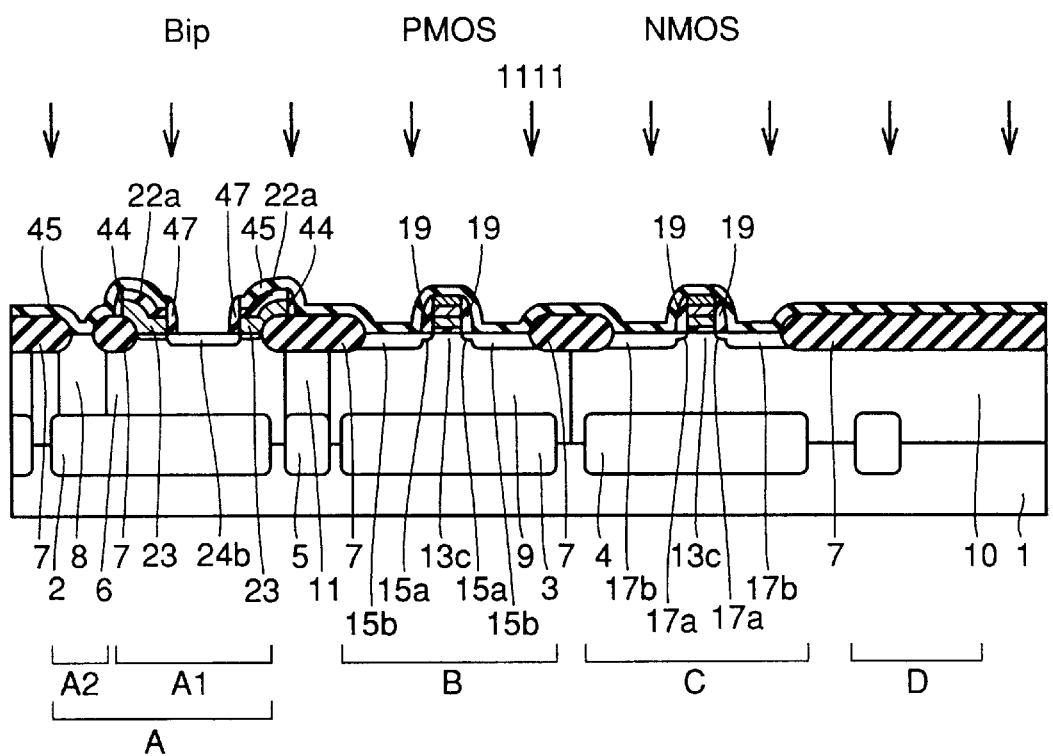

Into the above structure, P-type impurity 111 is implanted for forming true base region 24*b* as shown in FIG. 43. In this implantation, for example, ions of $BF_2^+$ are implanted under the conditions of 10 KeV and $3\times10^{13}cm^{-2}$.

Figure 44A:
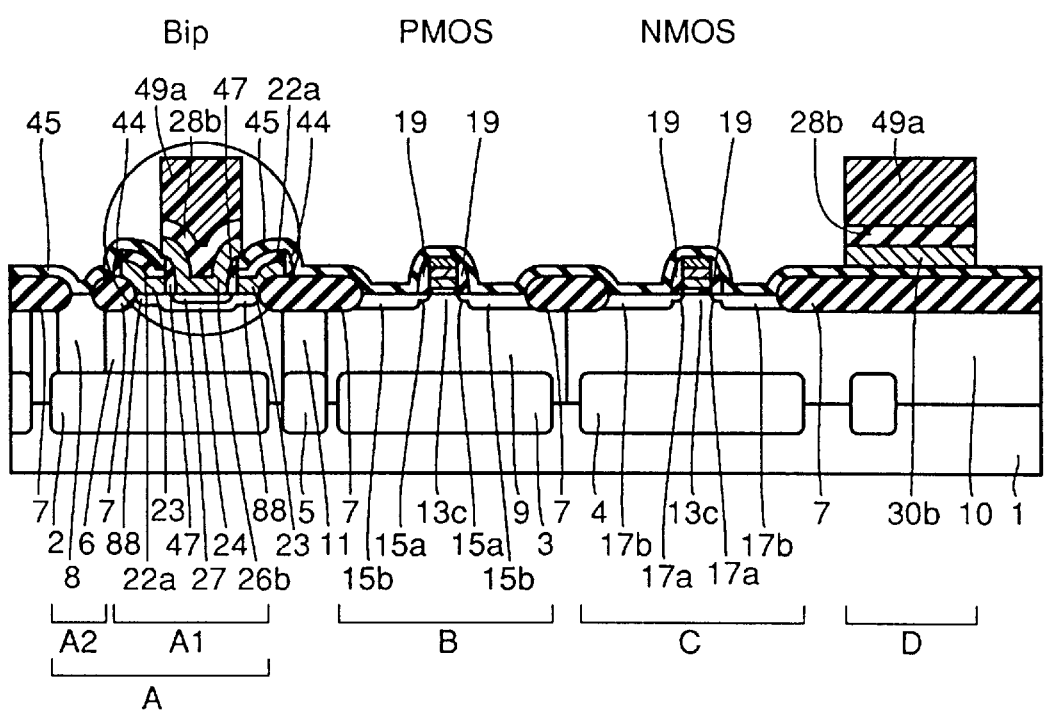
Figure 44B:
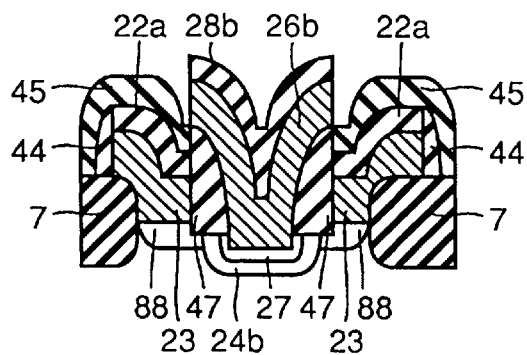

Thereafter, a polycrystalline silicon film (not shown) of about 1000 Å in thickness is formed on the whole surface, and N-type impurity is implanted into the polycrystalline silicon film. Then, a CVD oxide film (not shown) of about 2000 Å in thickness is deposited on the whole surface, and photoresist pattern 49*a* is formed at a predetermined region on the CVD oxide film as shown in FIG. 44A. With a mask formed of photoresist pattern 49*a*, the underlying CVD oxide film and the polycrystalline silicon film are patterned to form simultaneously emitter electrode 26*b*, first polycrystalline silicon resistance 20*b* and patterned CVD oxide film 28*b* as shown in FIGS. 44A and 44B. Thereafter, photoresist pattern 49*a* is removed. Then, heat treatment is performed to diffuse N-type impurity from emitter electrode 26*b* into silicon substrate, so that emitter region 27 is formed. Then, the BiCMOS element of the embodiment 8 is completed through a process similar to that of the embodiment 1 shown in FIG. 18.

In the embodiment 8, implantation of P-type impurity 1111 for forming true base region 24*b* is performed after forming side wall spacer 47 in opening E1 for the emitter. Therefore, connection between true base region 24*a* and external base region 88 is made by diffusion of the P-type impurity from external base electrode 23 and from true base region 24*b*. According to the embodiment 8, as described above, the true base implantation is performed after forming side wall spacer 47, so that widths of emitter region 27 and true base region 24*b*, which are finally formed, can be controlled independently of a shaved depth d1. Therefore, it is possible to suppress variation in base width and impurity concentration, so that the variation in electrical characteristics of the bipolar transistor can be suppressed.

(Embodiment 9)

Referring to FIGS. 45A and 45B to 47A and 47B, a process of an embodiment 9 will be described below.

A manufacturing process similar to that of the embodiment 1 shown in FIGS. 1 to 13 is performed to form a structure having opening E1 for the emitter. Thereafter, photoresist pattern 46 is removed.

Figure 45A:
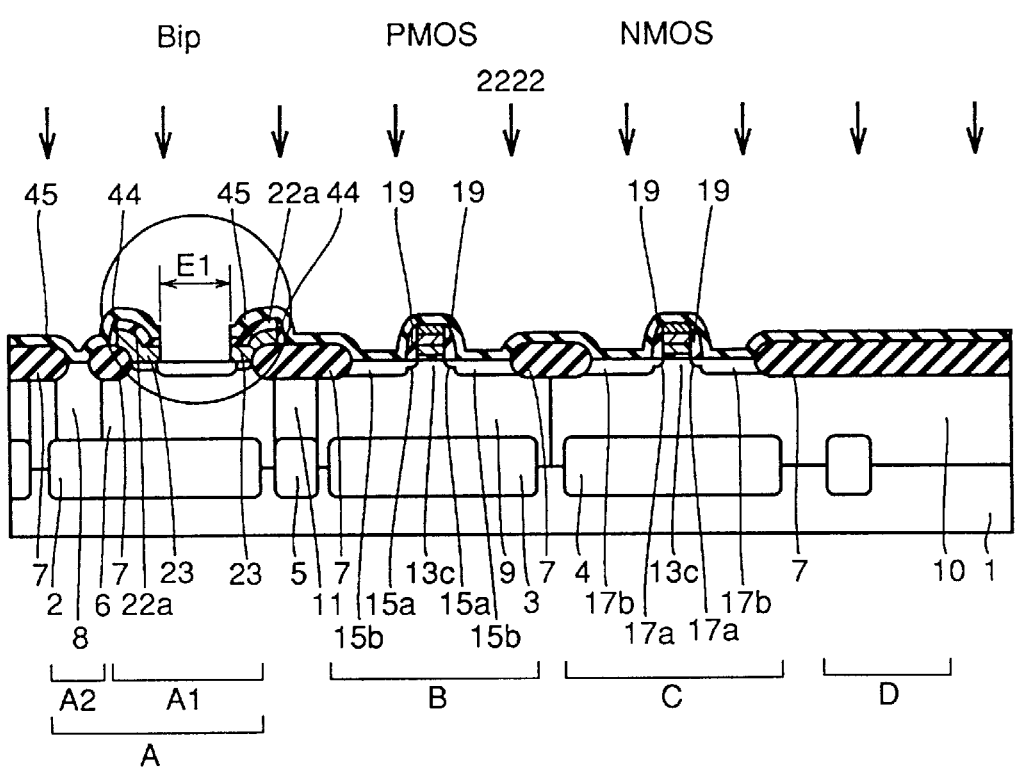
FIGS. 45A, 45B, 46A, 46B, 47A and 47B are cross sections showing a process of manufacturing a BiCMOS element of an embodiment 9 of the invention.
Figure 45B:
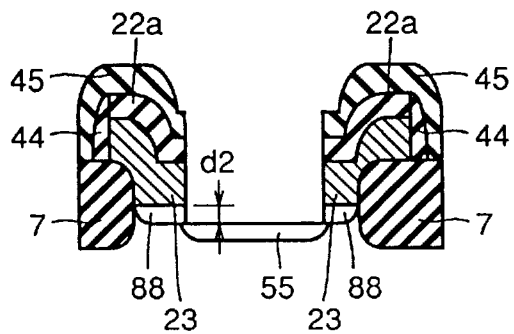

As shown in FIG. 45A, P-type impurity 2222 is implanted for connecting true base region 24*a* and external base region 88, which will be described later. Thereby, an impurity region 55 is formed as shown in FIG. 45B. By the etching for forming opening E1 for the emitter, the surface of silicon substrate 1 is shaved by d2 because the external base leader electrode 23 and silicon substrate 1 are continuously formed.

Figure 46A:
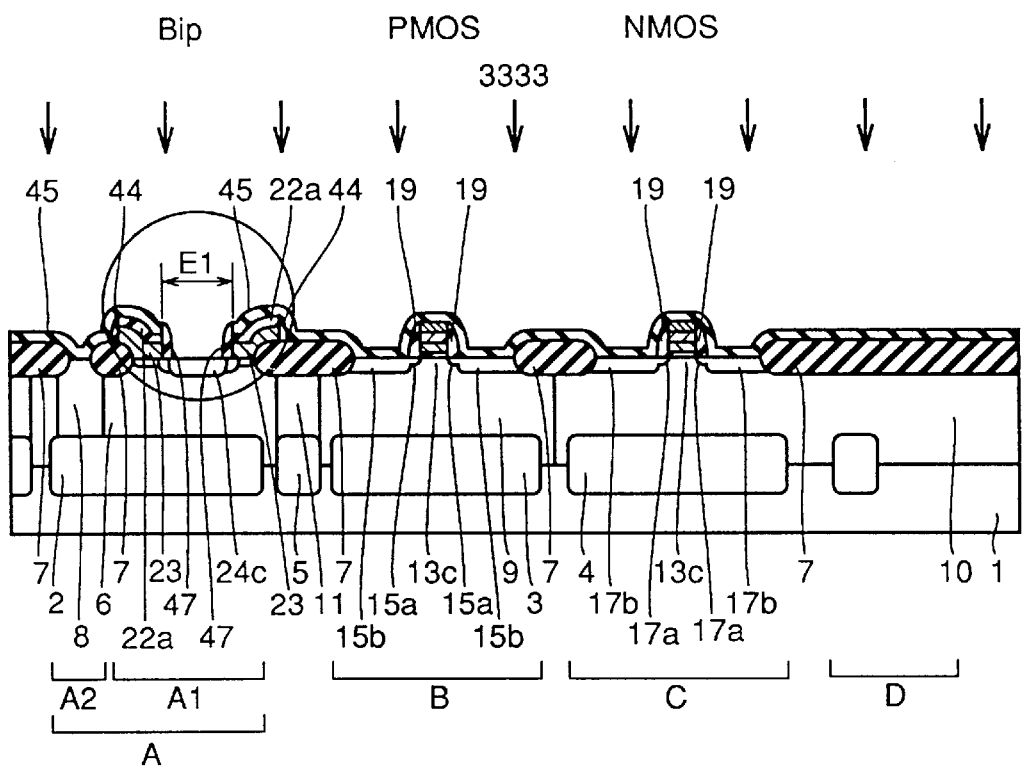
Figure 46B:
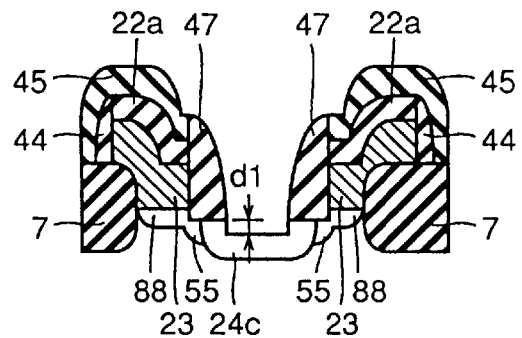

After this, a CVD oxide film (not shown) of about 2000 Å in thickness is deposited on the whole surface, and then is dry-etched to form side wall spacer 47 at the side surface of external base leader electrode 23 in opening E1 for the emitter. In this case, the silicon substrate is shaved by d1 similarly to the embodiment 8, as shown in FIG. 46B. Thereafter, P-type impurity 3333 for forming true base region 24*c* is implanted as shown in FIG. 46A.

Figure 47A:
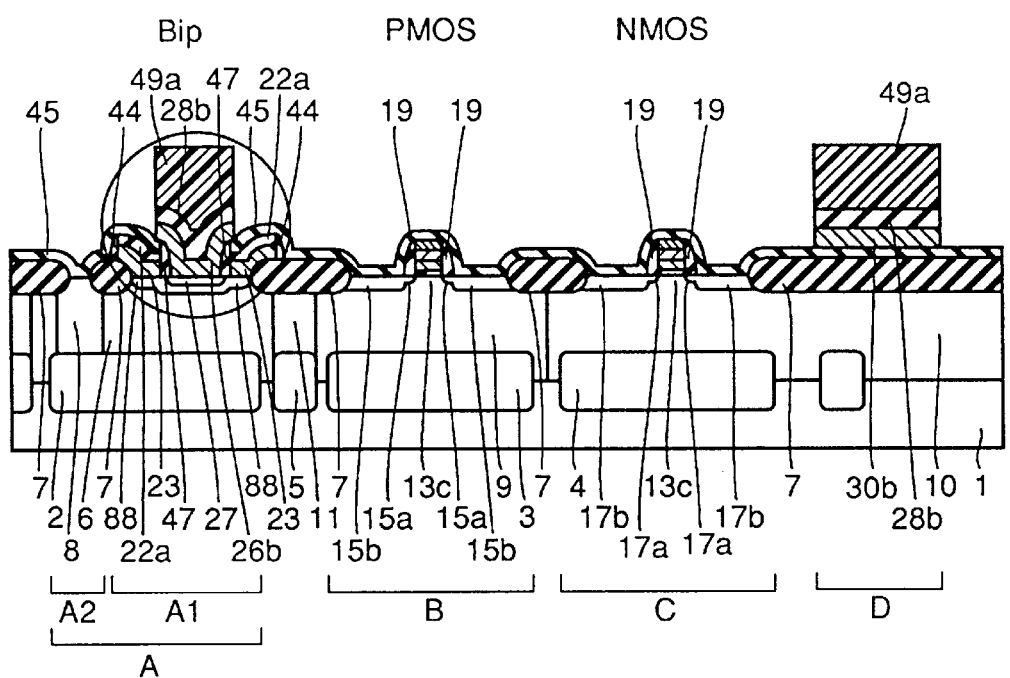
Figure 47B:
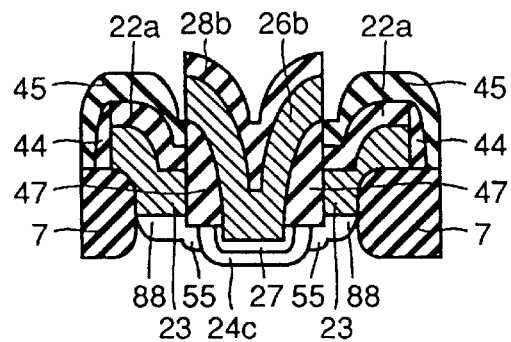

Thereafter, a polycrystalline silicon film (not shown) of about 1000 Å in thickness is deposited on the whole surface, and then N-type impurity is implanted into the polycrystalline silicon film. After depositing a CVD oxide film (not shown) of about 2000 Å in thickness on the whole surface, photoresist pattern 49*a* shown in FIGS. 47A and 47B is formed at a predetermined region on the CVD oxide film. Using this photoresist pattern 49*a* as a mask, the underlying CVD oxide film and polycrystalline silicon film are dry-etched to form simultaneously emitter electrode 26*b*, first polycrystalline silicon resistance layer 30*b* and CVD oxide film 28*b* as shown in FIGS. 47A and 47B. The N-type impurity is diffused from emitter electrode 26*b* into silicon substrate 1 by a heat treatment in a later step, so that emitter region 27 is formed.

In the embodiment 9, the ion implantation for forming impurity region 55, which connects true base region 24*c* to external base region 88, is formed after forming opening E1 for the emitter. Therefore, it is possible to prevent effectively the variation in concentration profile at a junction between the true base region 24c and external base region 88, which may be caused by that fact that the surface of silicon substrate 1 is shaved due to the processing for forming opening E1 for the emitter. After forming the side wall spacer 47 in opening E1 for the emitter, ion-implantation for forming true base region 24c is performed. Therefore, the base width and the impurity concentration can be controlled without an influence by the etching for side wall spacer 47. As described above, implantation into the base regions is performed two times, so that the variation in base width and impurity concentration are further reduced compared with the embodiment 8 already described. As a result, electrical characteristics of the bipolar transistor can be further reduced.

(Embodiment 10)

Referring to FIGS. 48 to 58, a manufacturing process of an embodiment 10 will be described below.

Figure 48:
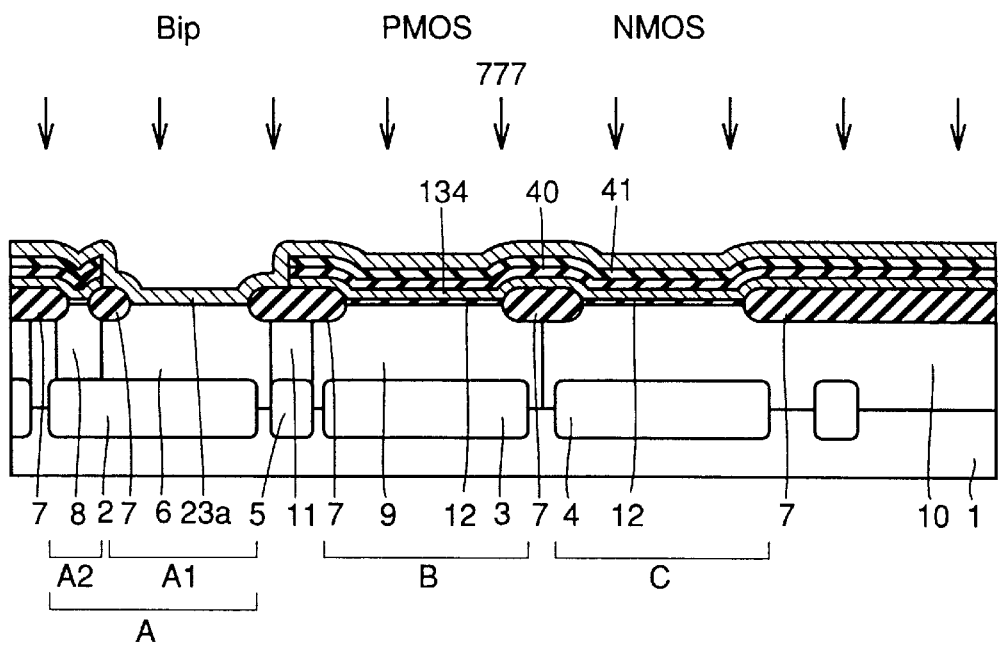
FIGS. 48 to 58 are cross sections showing a process of manufacturing a BiCMOS element of an embodiment 10 of the invention.

A process similar to that of the embodiment 1 shown in FIGS. 1 to 3 is performed. Then, as shown in FIG. 48, polycrystalline silicon film 23a of about 1000 Å in thickness is deposited on the whole surface, and then P-type impurity 777 is ion-implanted into polycrystalline silicon film 23a. In this implantation, for example, ions of $BF_2^+$ are implanted under the conditions of 40 KeV and $4 \times 10^{15} cm^{-2}$.

After depositing a CVD oxide film (not shown) of about 3000 Å in thickness on the whole surface, a photoresist pattern 56 is formed at a predetermined region on the CVD oxide film. Using photoresist pattern 56 as a mask, the underlying CVD oxide film and polycrystalline silicon film 23a are dry-etched to form patterned external base leader electrode 23 and CVD oxide film 22a. This patterning also forms opening E1 for the emitter. Thereafter, photoresist pattern 56 is removed.

Figure 50:
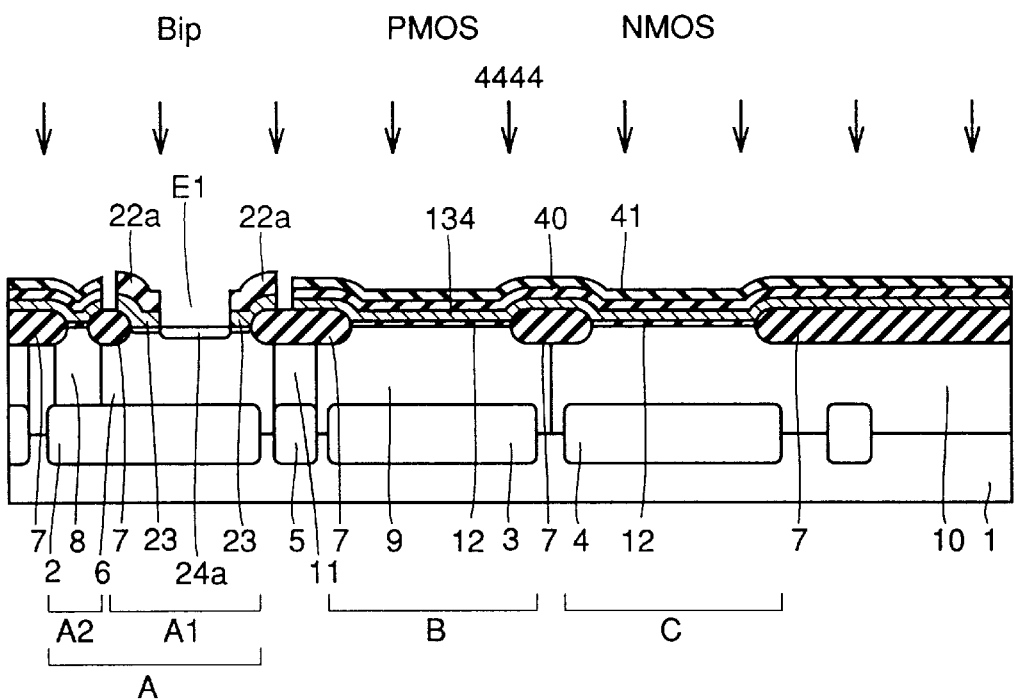
Figure 51:
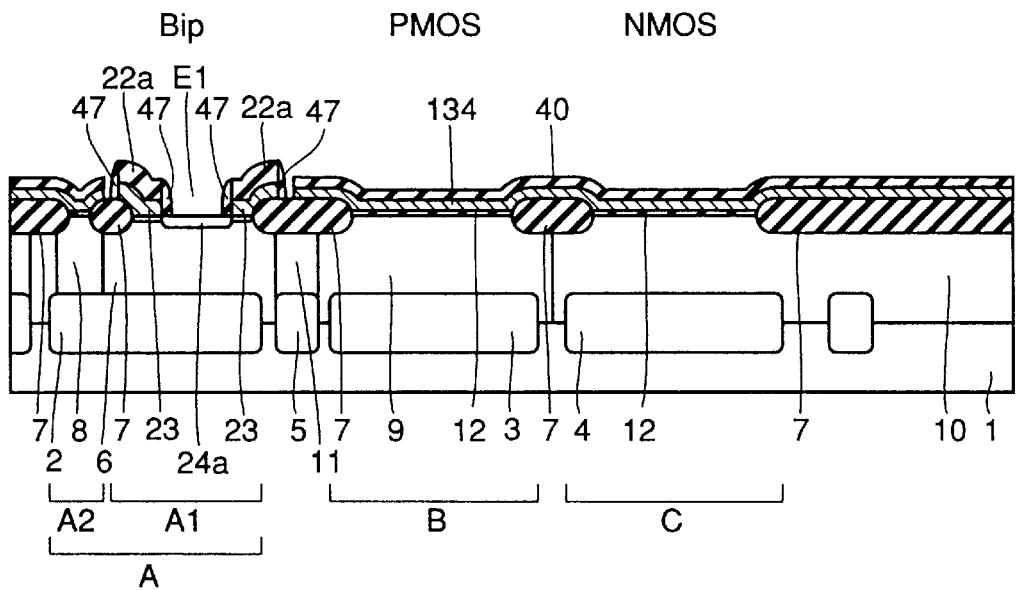

As shown in FIG. 50, ion-implantation of P-type impurity 4444 is performed for forming true base region 24a. In this implantation, for example, ions of $BF_2^+$ are implanted under the conditions of 20 KeV and $8 \times 10^{13} cm^{-2}$. Thereafter, a CVD oxide film (not shown) of about 2000 Å in thickness is deposited on the whole surface, and the CVD oxide film is dry-etched to form side wall spacer 47 at the side surfaces of base leader electrode 23 and CVD oxide film 22a as shown in FIG. 51. This etching for forming side wall spacer 47 also removes CVD oxide film 41 located on the collector wall region 8 and the active region of the CMOS transistor. Thereby, the manufacturing process can be simplified compared with the case where CVD oxide film 41 is removed by an independent step. Thereafter, nitride film 40 is removed.

Figure 52:
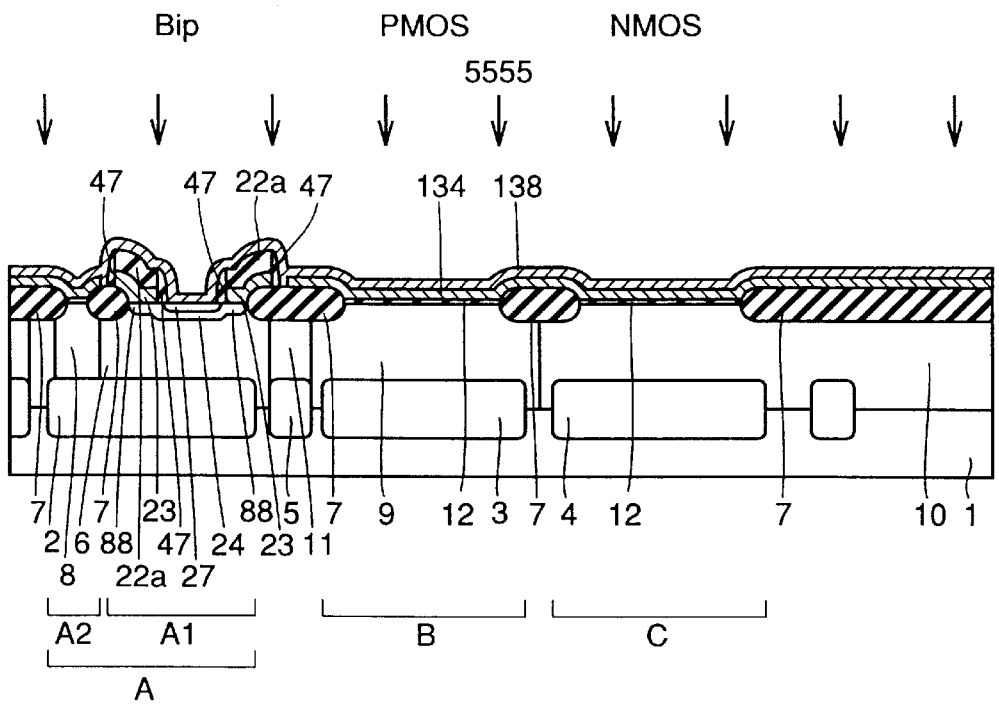

As shown in FIG. 52, polycrystalline silicon film 138 of about 1000 Å in thickness is deposited on the whole surface, and then N-type impurity 5555 is ion-implanted. In this implantation, for example, ions of $As^+$ are implanted under the conditions of 50 KeV and $8 \times 10^{16} cm^{-2}$. N-type impurity 5555 implanted into polycrystalline silicon film 138 is thermally diffused into the emitter formation region, so that emitter region 27 is formed. The polycrystalline silicon film 138 may be formed by depositing a doped polycrystalline silicon film containing doped impurity. In this case, implantation of N-type impurity 5555 is not essential.

Figure 53:
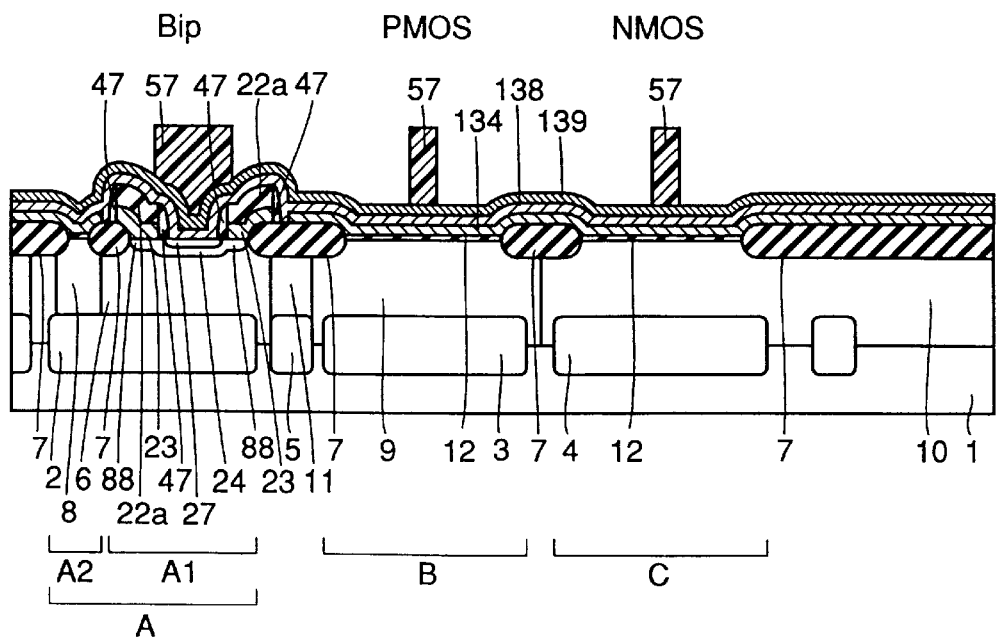
Figure 54:
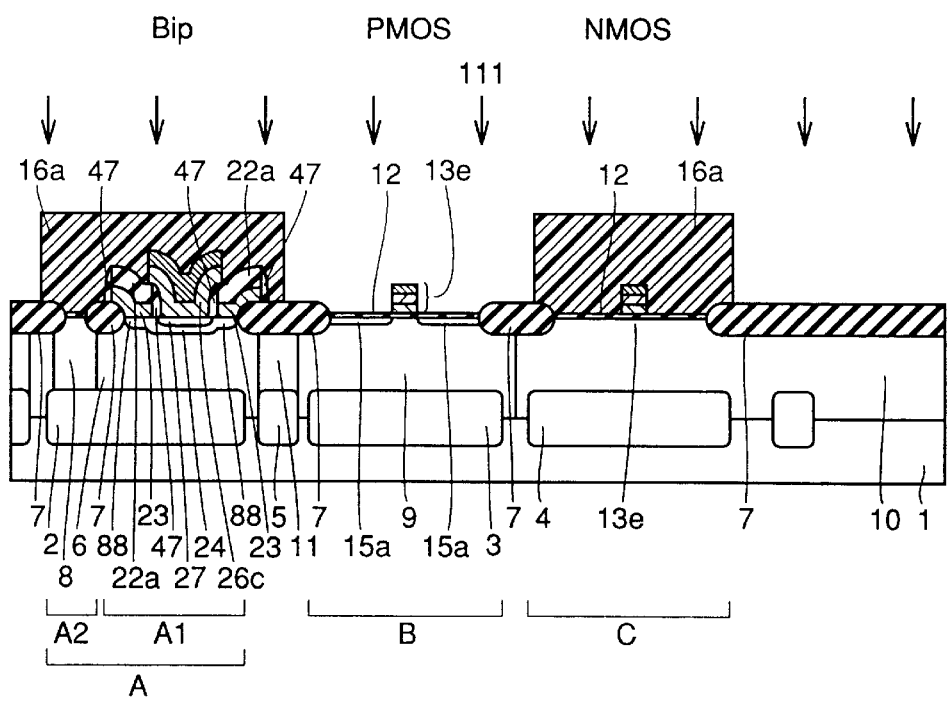

As shown in FIG. 53, a tungsten silicide (WSi) film 139 of about 1000 Å in thickness is deposited. A photoresist pattern 57 is formed at a predetermined region on tungsten silicide film 139. With photoresist pattern 57 used as a mask, patterning is performed to form simultaneously an emitter electrode 26c and a gate electrode 13e as shown in FIG. 54.

Thereafter, photoresist pattern 57 (see FIG. 53) is removed. Then, processing is performed to form photoresist pattern 16a covering bipolar transistor part (A1 and A2) and NMOS transistor part (C) as shown in FIG. 54. P-type impurity 111 is implanted into the surface of N-type well region 9 masked with photoresist pattern 16a and gate electrode 13e of PMOS transistor part (B), so that lightly doped $P^-$-type source/drain regions 15a are formed. In this implantation, for example, ions of $BF_2^+$ are implanted under the conditions of 25 KeV and $7 \times 10^{13} cm^{-2}$. Thereafter, photoresist pattern 16a is removed.

Figure 55:
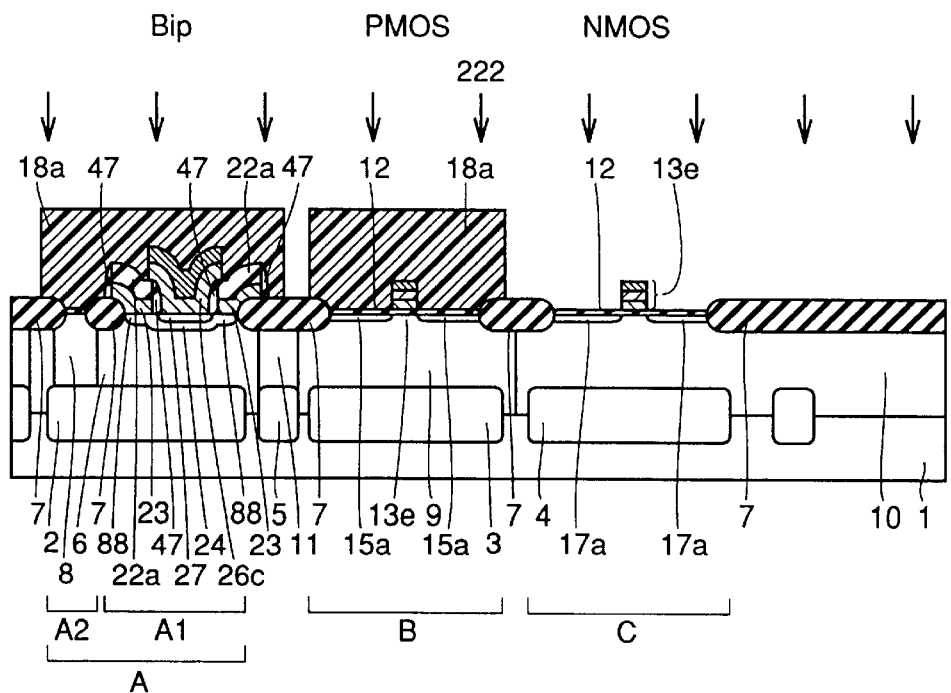

As shown in FIG. 55, processing is performed to form photoresist pattern 18a covering bipolar transistor part (A1 and A2) and PMOS transistor part (B). N-type impurity 222 is ion-implanted into the surface of P-type well region 10 masked with photoresist pattern 18a and gate electrode 13e of NMOS transistor part (C), so that lightly doped $N^-$-type source/drain regions 17a are formed. In this implantation, for example, ions of $As^+$ are implanted under the conditions of 60 KeV and $3 \times 10^{13} cm^{-2}$. Thereafter, photoresist pattern 18a is removed.

Figure 56:
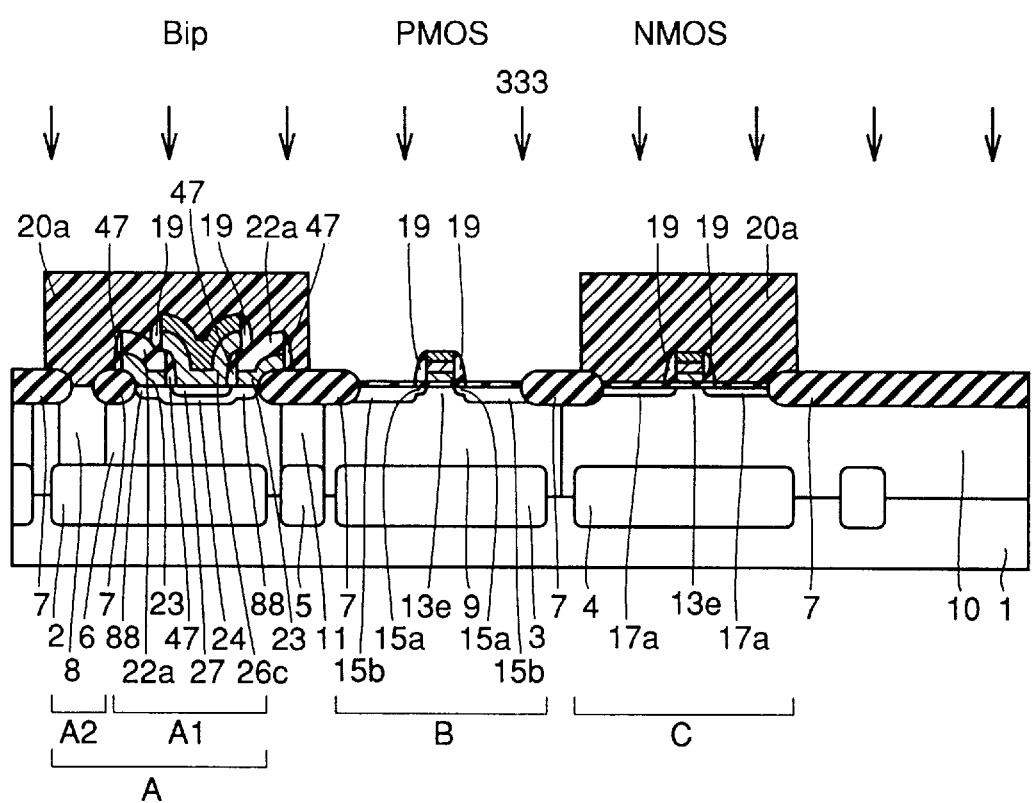

Then, a CVD oxide film (not shown) of about 2000 Å in thickness is deposited on the whole surface, and the CVD oxide film is dry-etched to form side wall spacer 19 as shown in FIG. 56. Thereafter, processing is performed to form photoresist pattern 20a covering bipolar transistor part (A1 and A2) and NMOS transistor part (C). P-type impurity 333 is ion-implanted into the surface of N-type well region 9 masked with photoresist pattern 20a, gate electrode 13e and side wall spacer 19, so that heavily doped $P^+$-type source/drain regions 15b are formed. In this implantation, for example, ions of $BF_2^+$ are implanted under the conditions of 20 KeV and $4 \times 10^{15} cm^{-2}$. Thereafter, photoresist pattern 20a is removed.

Figure 57:
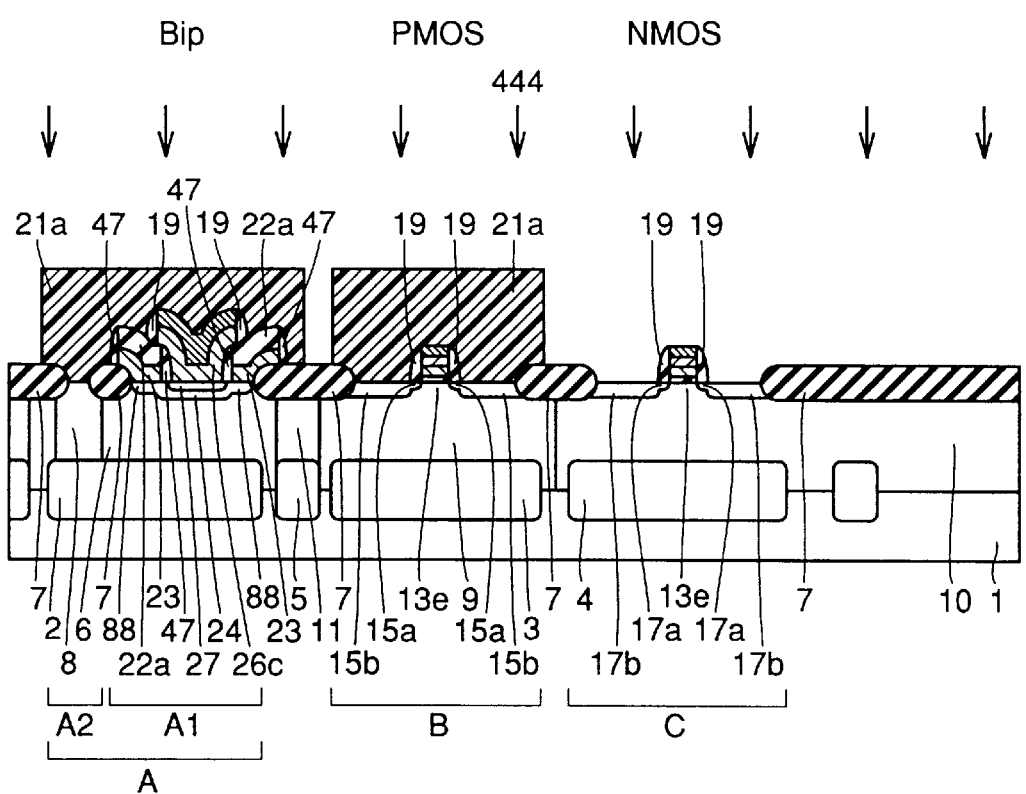

As shown in FIG. 57, processing is performed to form photoresist pattern 21a covering bipolar transistor part (A1 and A2) and PMOS transistor part (B). N-type impurity 444 is ion-implanted into the surface of P-type well region 10 masked with photoresist pattern 21a, gate electrode 13e of NMOS transistor part (C) and side wall spacer 19, so that heavily doped $N^+$-type source/drain regions 17b are formed. In this implantation, for example, ions of $As^+$ are implanted under the conditions of 50 KeV and $4 \times 10^{15} cm^{-2}$. Thereafter, photoresist pattern 21a is removed.

Figure 58:
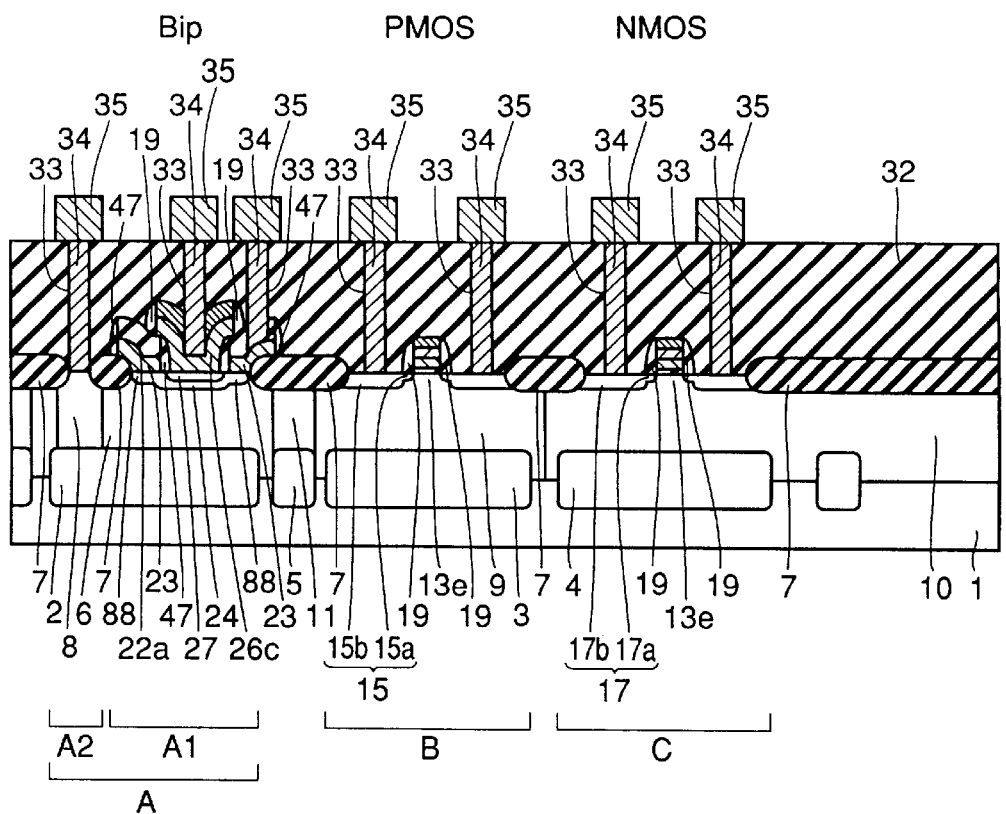

As shown in FIG. 58, interlayer insulating film 32 is formed, and contact holes 33 are formed at predetermined regions of interlayer insulating film 32. Each contact hole 33 is filled with metal film 34 made of tungsten film, and metal interconnection 35 made of aluminum or the like is formed of the upper surface of each metal film 34. Thereby, the BiCMOS element of the embodiment 10 is completed.

According to the manufacturing process of the embodiment 10 described above, the layered film including polycrystalline silicon film 134, which will ultimately form a portion of the gate electrode, covers CMOS transistor part (B and C) and collector wall portion (A2) during formation of base/emitter active region (A1) of the bipolar transistor. Thereby, the step of forming the gate electrode can also be utilized as the step of forming the etching protection film. As a result, it is possible to suppress an etching damage to CMOS transistor part (B and C) and collector wall part (A2) during formation of base/emitter active region (A1) of the bipolar transistor while simplifying the manufacturing process. In the step shown in FIG. 51, the etching is performed for forming side wall spacer 47 at the side surface of external base leader electrode 23 in opening E1 for the emitter, and this etching simultaneously removes CVD oxide film 41 as the etching protection film in the CMOS transistor part. Therefore, formation of side wall spacer 47 and removable of the etching protection film, i.e., CVD oxide film 41 can be performed simultaneously. Thereby, the manufacturing process can be further simplified. As shown in FIG. 54, emitter electrode 26c and gate electrode 13e can be formed simultaneously, which also simplifies the manufacturing process.

According to the manufacturing process of the embodiment 10, as described above, the etching damage to the bipolar transistor part (A) and CMOS transistor part (B and C) can be suppressed while simplifying the manufacturing process. Further, bipolar transistor part (A) is formed prior to formation of CMOS transistor part (B and C), so that heat treatment for forming CMOS transistor part (B and C) is effected also on emitter/base active region (A1) of bipolar transistor part (A). This increases an activation factor of the emitter/base region, so that a large current amplification factor ($h_{FE}$) of the bipolar transistor and a large current can be achieved.

(Embodiment 11)

Referring to FIGS. 59 to 67, a process of manufacturing a BiCMOS element of an embodiment 11 will be described below.

Figure 59:
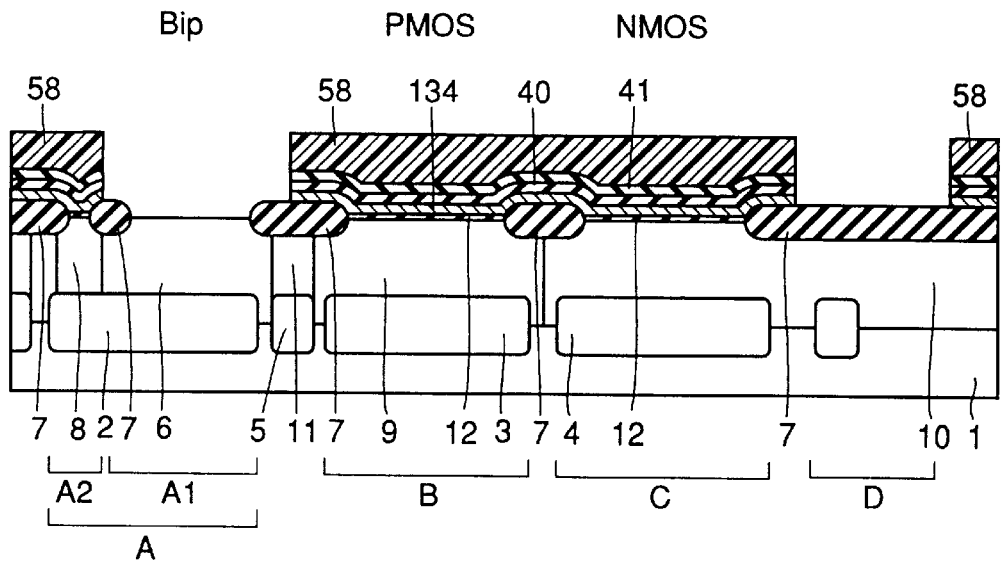
FIGS. 59 to 67 are cross sections showing a process of manufacturing a BiCMOS element of an embodiment 11 of the invention.

First, the structure shown in FIG. 2 is formed by a manufacturing process similar to that of the embodiment 1 shown in FIGS. 1 and 2. Thereafter, a photoresist pattern 58 shown in FIG. 59 is formed at a predetermined region on CVD oxide film 41. Dry etching is effected on CVD oxide film 41, nitride film 40, polycrystalline silicon film 134 and gate oxide film 12 masked with photoresist pattern 58, so that portions of them located at base/emitter active region (A1) of the bipolar transistor and polycrystalline silicon resistance part (D) are removed. Thereafter, photoresist pattern 58 is removed.

Figure 60:
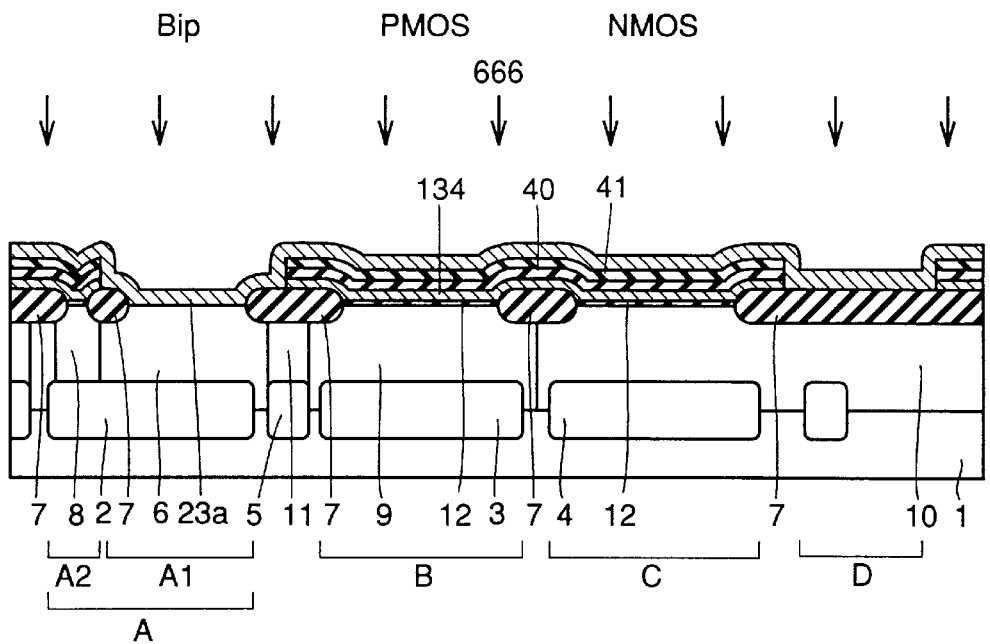

As shown in FIG. 60, polycrystalline silicon film 23a of about 1000 Å in thickness is formed on the whole surface, and then P-type impurity 6666 is ion-implanted. In this implantation, for example, ions of $BF_2^+$ are implanted under the conditions of 40 KeV and $3\times10^{13}cm^{-2}$. This implantation determines the resistance value of a P-type polycrystalline silicon resistance 30d which will be formed later. Therefore, an implantation dose and an implantation energy for this ion implantation must be controlled in accordance with an intended resistance value of polycrystalline silicon resistance 30d.

Figure 61:
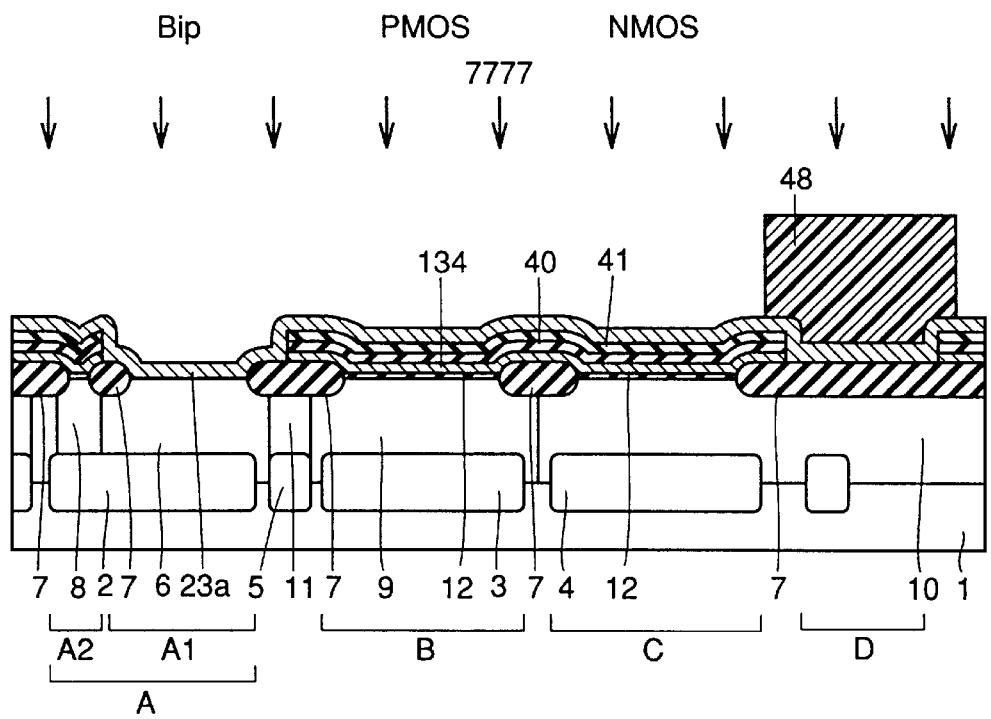

As shown in FIG. 61, photoresist pattern 48 is formed on a portion at which P-type polycrystalline silicon resistance 30d will be formed later. P-type impurity 7777 is implanted into polycrystalline silicon film 23a masked with photoresist pattern 48. The implantation of P-type impurity 6666 and the implantation of P-type impurity 7777 determine the impurity implantation dose at external base leader electrode 23 which will be finally formed. Thereafter, photoresist pattern 48 is removed.

Figure 62:
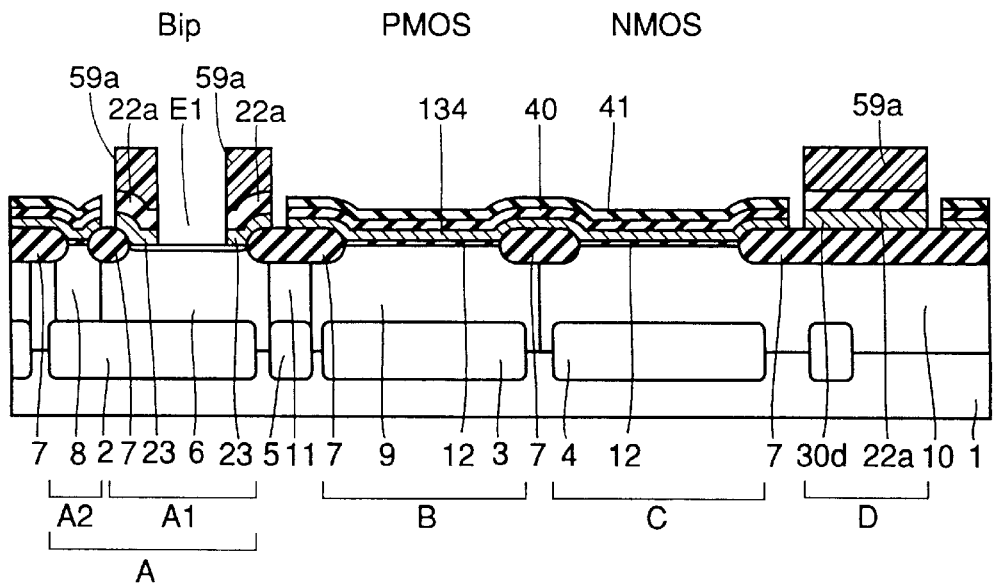

A CVD oxide film (not shown) of about 3000 Å in thickness is deposited on the whole surface of polycrystalline silicon film 23a, and then a photoresist pattern 59a shown in FIG. 62 is formed at a predetermined region on the CVD oxide film. Using this photoresist pattern 59a as a mask, dry etching is performed to form simultaneously external base leader electrode 23, P-type polycrystalline silicon resistance 30d and CVD oxide film 22a. Opening E1 for the emitter is simultaneously formed. Thereafter, photoresist pattern 59a is removed.

Figure 63:
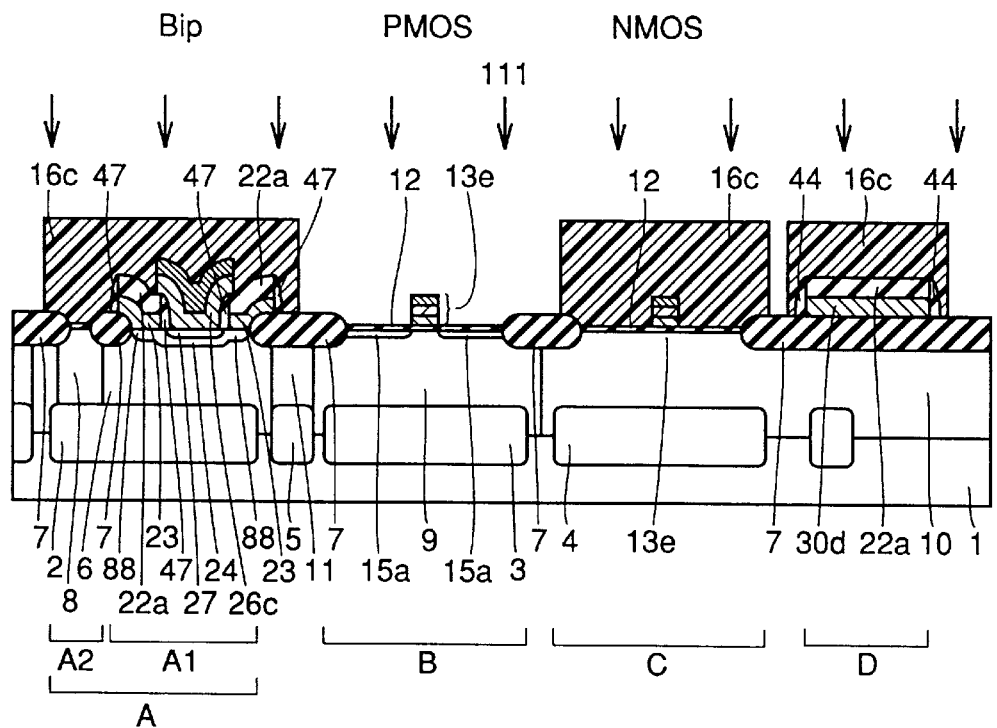

Thereafter, gate electrode 13e and emitter electrode 26c shown in FIG. 63 are simultaneously patterned through a process similar to that of the embodiment 10 shown in FIGS. 50 to 53. As shown in FIG. 63, processing is then performed to form photoresist pattern 16c covering bipolar transistor part (A1 and A2), NMOS transistor part (C) and polycrystalline silicon resistance part (D). P-type impurity 111 is ion-implanted into the surface of N-type well region 9 masked with photoresist pattern 16c and gate electrode 13e of PMOS transistor part (B), so that lightly doped P⁻-type source/drain regions 15a are formed. In this implantation, for example, ions of $BF_2^+$ are implanted under the conditions of 25 KeV and $7\times10^{13}cm^{-2}$. Thereafter, photoresist pattern 16c is removed.

Figure 64:
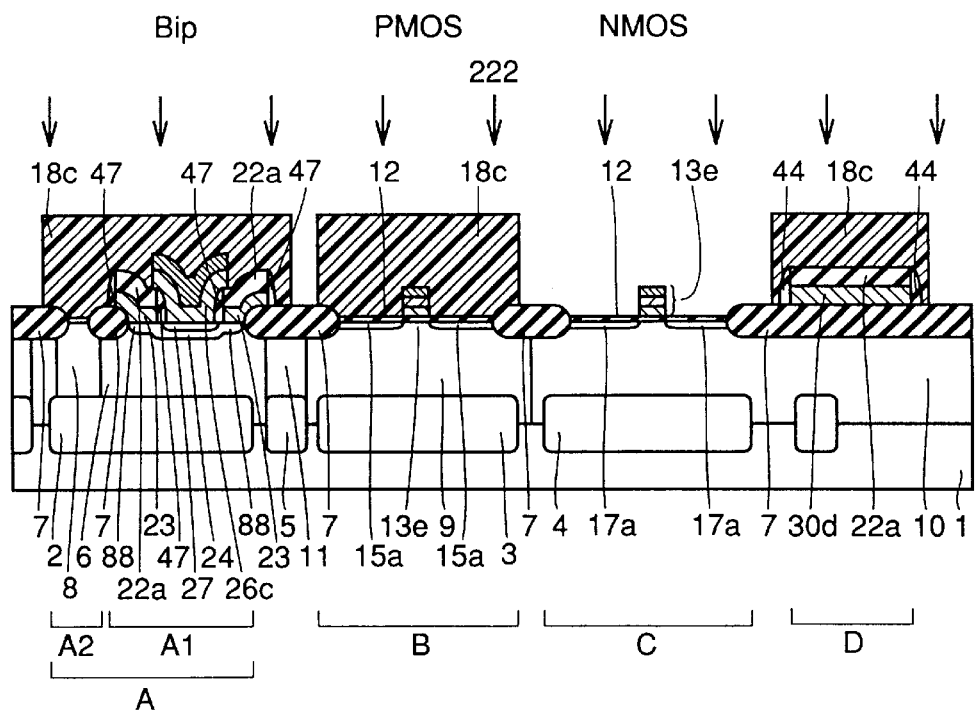

As shown in FIG. 64, processing is performed to form photoresist pattern 18c covering bipolar transistor part (A1 and A2), NMOS transistor part (B) and polycrystalline silicon resistance part (D). N-type impurity 222 is ion-implanted into the surface of P-type well region 10 masked with photoresist pattern 18c and gate electrode 13e of NMOS transistor part (C), so that lightly doped N⁻-type source/drain regions 17a are formed. In this implantation, for example, ions of As⁺ are implanted under the conditions of 60 KeV and $3\times10^{13}cm^{-2}$. Thereafter, photoresist pattern 18c is removed.

Figure 65:
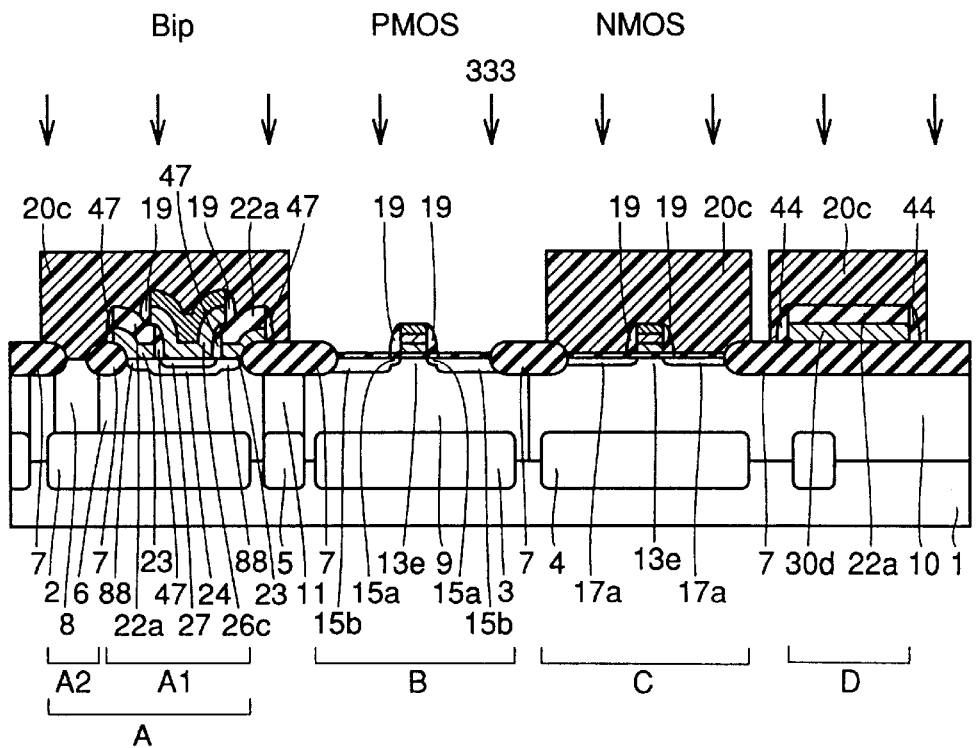

Then, a CVD oxide film (not shown) of about 2000 Å in thickness is formed and then is dry-etched to form side wall spacer 19 at the side surface of gate electrode 13e as shown in FIG. 65. Thereafter, processing is performed to form photoresist pattern 20c covering bipolar transistor part (A1 and A2), NMOS transistor part (C) and polycrystalline silicon resistance part (D). P-type impurity 333 is ion-implanted into the surface of N-type well region 9 masked with photoresist pattern 20c, gate electrode 13e of PMOS transistor part (B) and side wall spacer 19, so that heavily doped P⁺-type source/drain regions 15b are formed. In this implantation, for example, ions of $BF_2^+$ are implanted under the conditions of 20 KeV and $4\times10^{15}cm^{-2}$. Thereafter, photoresist pattern 20c is removed.

Figure 66:
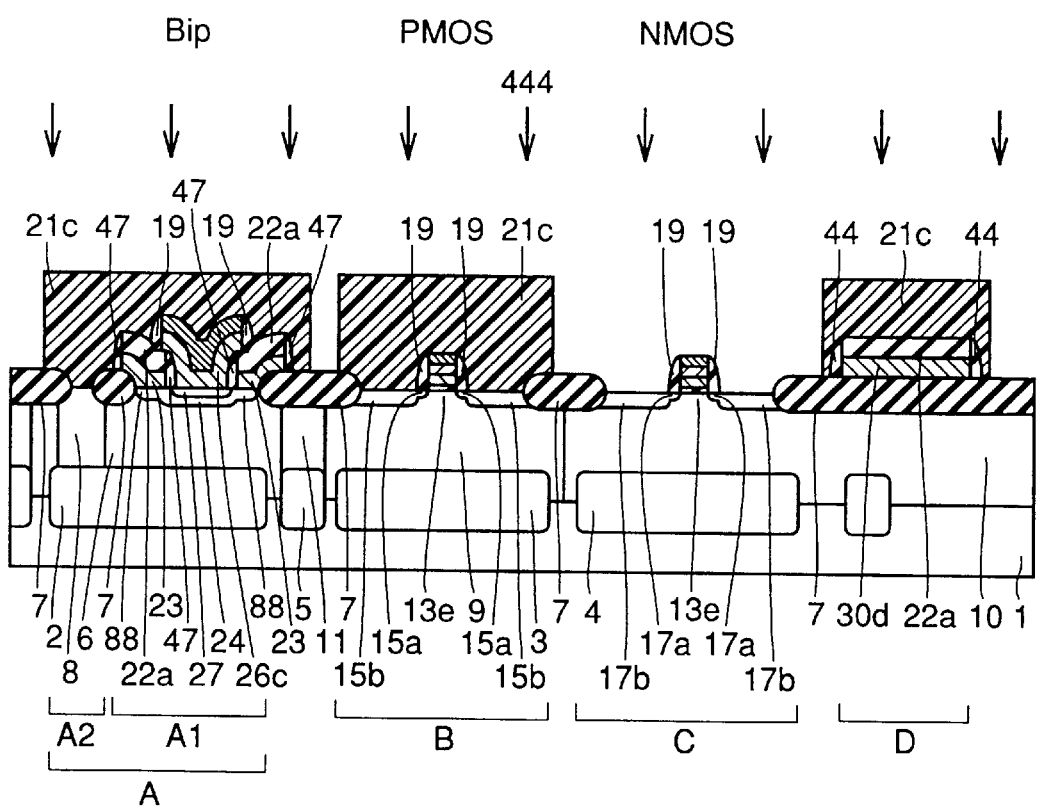

As shown in FIG. 66, processing is performed to form a photoresist pattern 21c covering bipolar transistor part (A1 and A2), PMOS transistor part (B) and polycrystalline silicon resistance part (D). N-type impurity 444 is ion-implanted into the surface of P-type well region 10 masked with photoresist pattern 21c, gate electrode 13e of NMOS transistor part (C) and side wall spacer 19, so that heavily doped N⁺-type source/drain regions 17b are formed. In this implantation, for example, ions of As⁺ are implanted under the conditions of 50 KeV and $4\times10^{15}cm^{-2}$. Thereafter, photoresist pattern 21c is removed.

Figure 67:
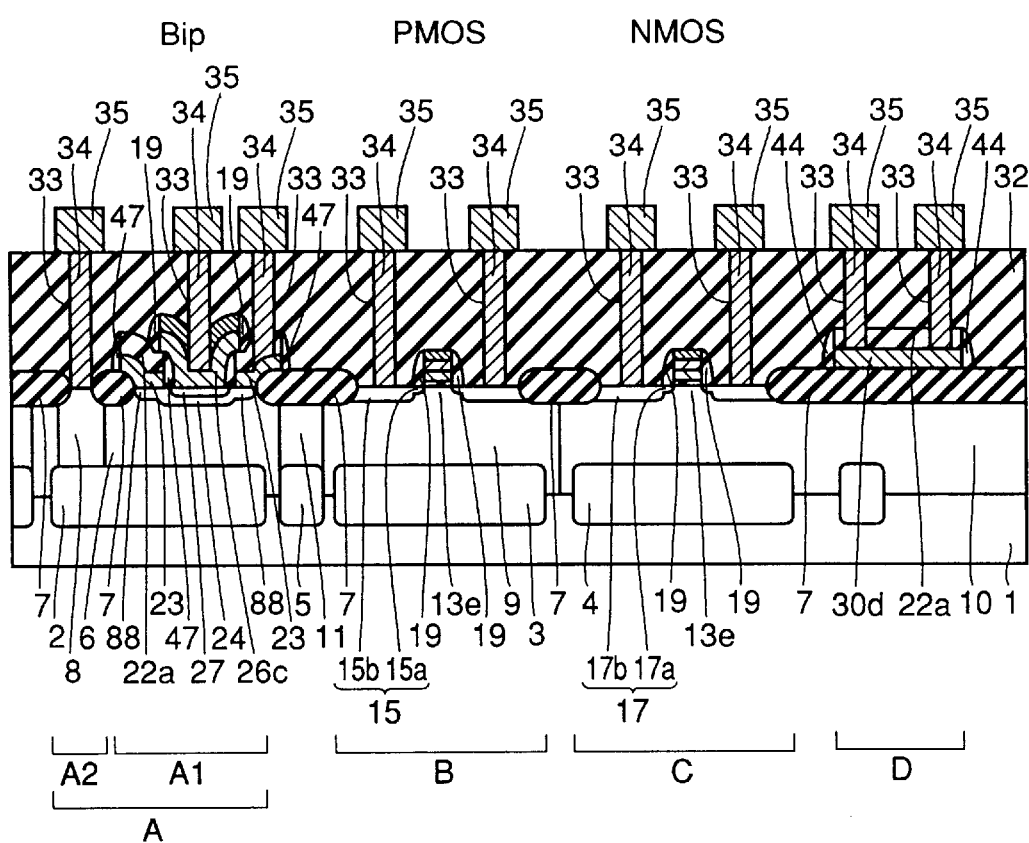

As shown in FIG. 67, interlayer insulating film 32 is formed, and contact holes 33 are formed at predetermined regions of interlayer insulating film 32. Each contact hole 33 is filled with metal film 34 made of, e.g., tungsten, and metal interconnection 35 made of, e.g., aluminum is formed of the upper surface of each metal film 34. Thereby, the BiCMOS element of the embodiment 11 is completed.

According to the manufacturing process of the embodiment 11, as shown in FIG. 62, external base electrode 23 and polycrystalline silicon resistance 30d are simultaneously formed. Therefore, the number of steps of forming the polycrystalline silicon film and the number of steps for the dry etching each can be reduced by one compared with the case where polycrystalline silicon resistance 30d is formed in the independent steps. Therefore, the steps for the dry etching can be reduced in number while simplifying the manufacturing process, so that damage by the dry etching can be reduced.

(Embodiment 12)

Referring to FIGS. 68 to 71, a manufacturing process of an embodiment 12 will be described below.

By a process similar to that already described in connection with the embodiment 11, a structure shown in FIG. 59 is formed. Thereafter, photoresist pattern 58 is removed.

Figure 68:
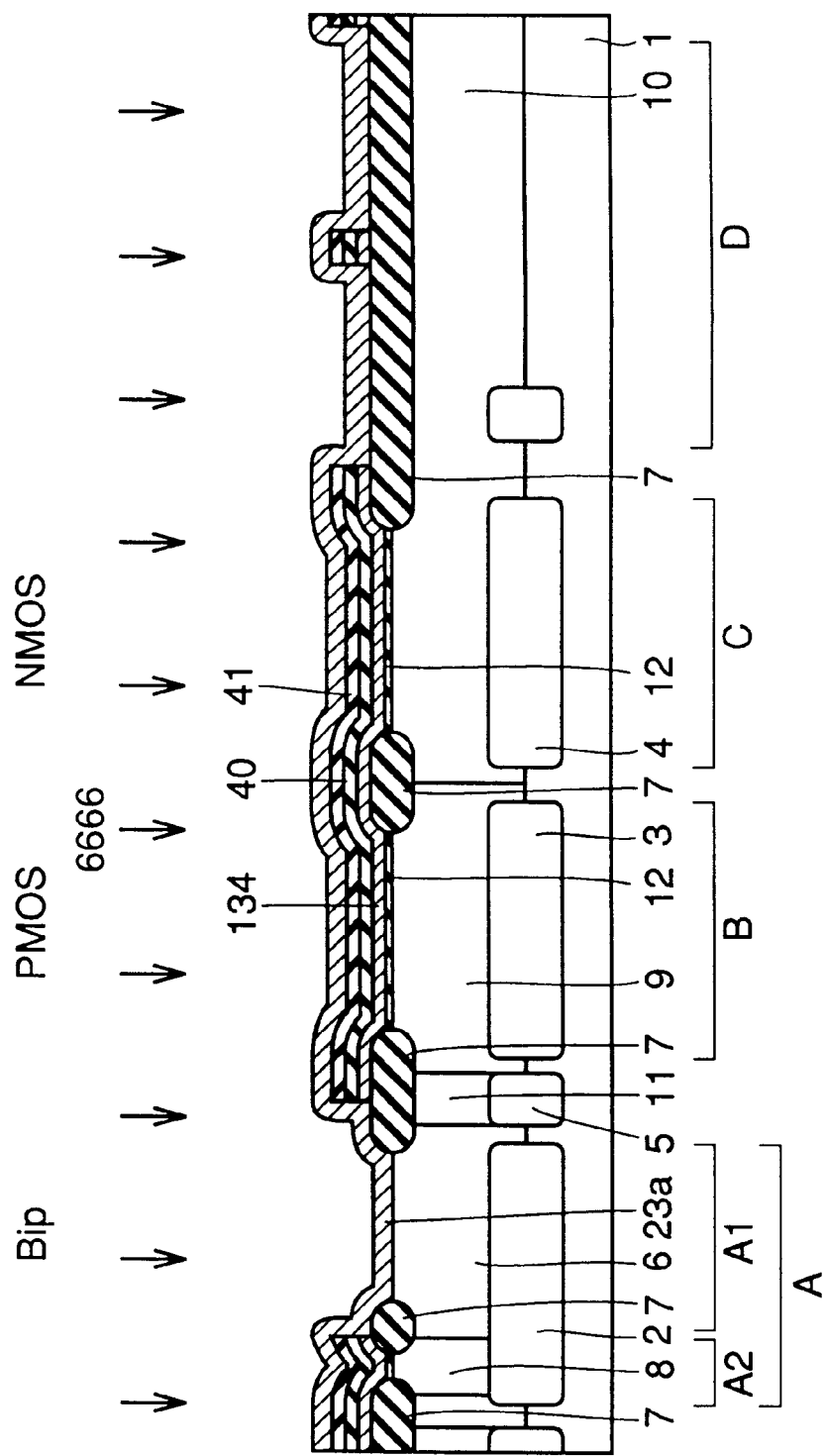
FIGS. 68 to 71 are cross sections showing a process of manufacturing a BiCMOS element of an embodiment 12 of the invention.

Then, as shown in FIG. 68, polycrystalline silicon film 23a of about 1000 Å in thickness is deposited on the whole surface, and P-type impurity 6666 is implanted into polycrystalline silicon film 23a. In this implantation, for example, ions of As$^+$ are implanted under the conditions of 50 KeV and $1 \times 10^{16} cm^{-2}$. This implantation determines the resistance value of first P-type polycrystalline silicon resistance 30d which will be formed later. Therefore, an implantation dose and an implantation energy for this ion implantation must be controlled in accordance with an intended resistance value of first polycrystalline silicon resistance 30d.

Figure 69:
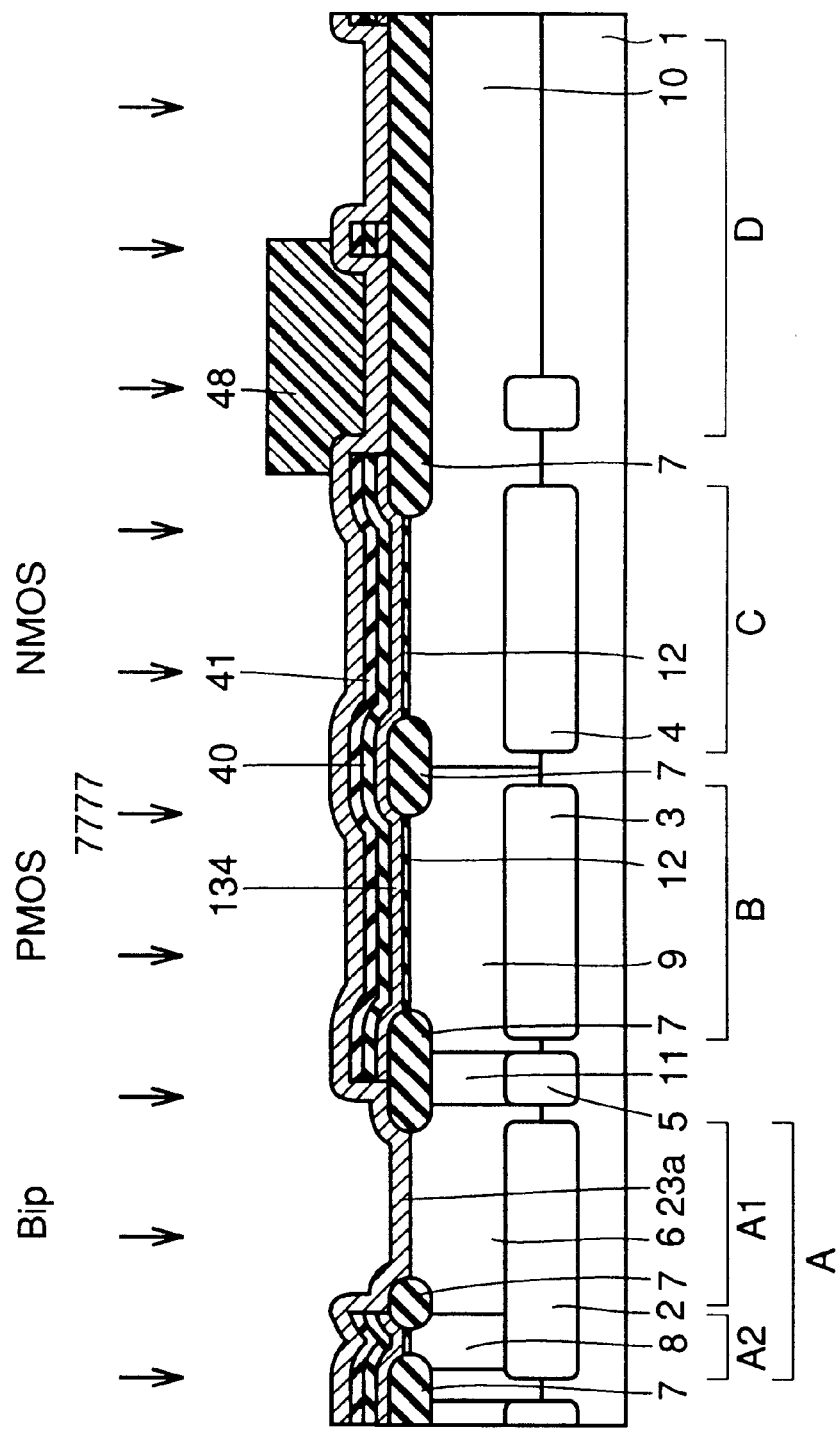

As shown in FIG. 69, photoresist pattern 48 is formed over a region at which P-type polycrystalline silicon resistance 30d will be formed later. P-type impurity 7777 is implanted into polycrystalline silicon film 23a masked with photoresist pattern 48. The implantation of P-type impurity 7777 and the former implantation of P-type impurity 6666 determine the impurity implantation dose at external base leader electrode 23 which will be finally formed. A portion of polycrystalline silicon film 23a, into which P-type impurity 6666 and 7777 are implanted by two different operations will form a second P-type polycrystalline silicon resistance 30e and external base leader electrode 23 through subsequent steps.

Figure 70:
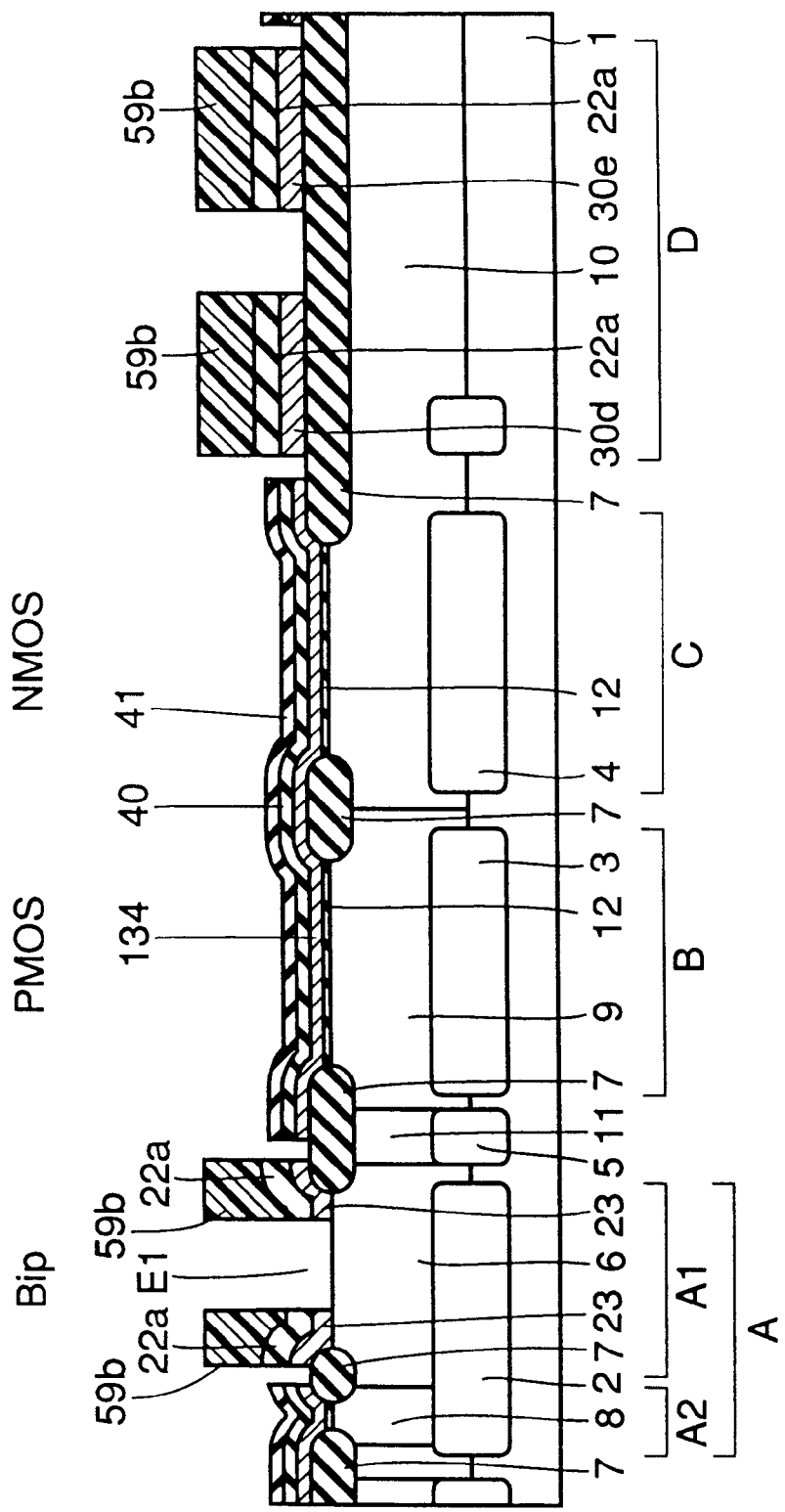

A CVD oxide film (not shown) of about 3000 Å in thickness is deposited on the whole surface of polycrystalline silicon film 23a, and then photoresist pattern 59b shown in FIG. 70 is formed at a predetermined region on the CVD oxide film. Using this photoresist pattern 59b as a mask, dry etching is effected on the underlying CVD oxide film and polycrystalline silicon film 23a (see FIG. 69) to form external base leader electrode 23, first P-type polycrystalline silicon resistance 30d, second P-type polycrystalline silicon resistance 30e and overlying CVD oxide film 22a as shown in FIG. 70. Opening E1 for the emitter is simultaneously formed. Thereafter, photoresist pattern 59b is removed.

Figure 71:
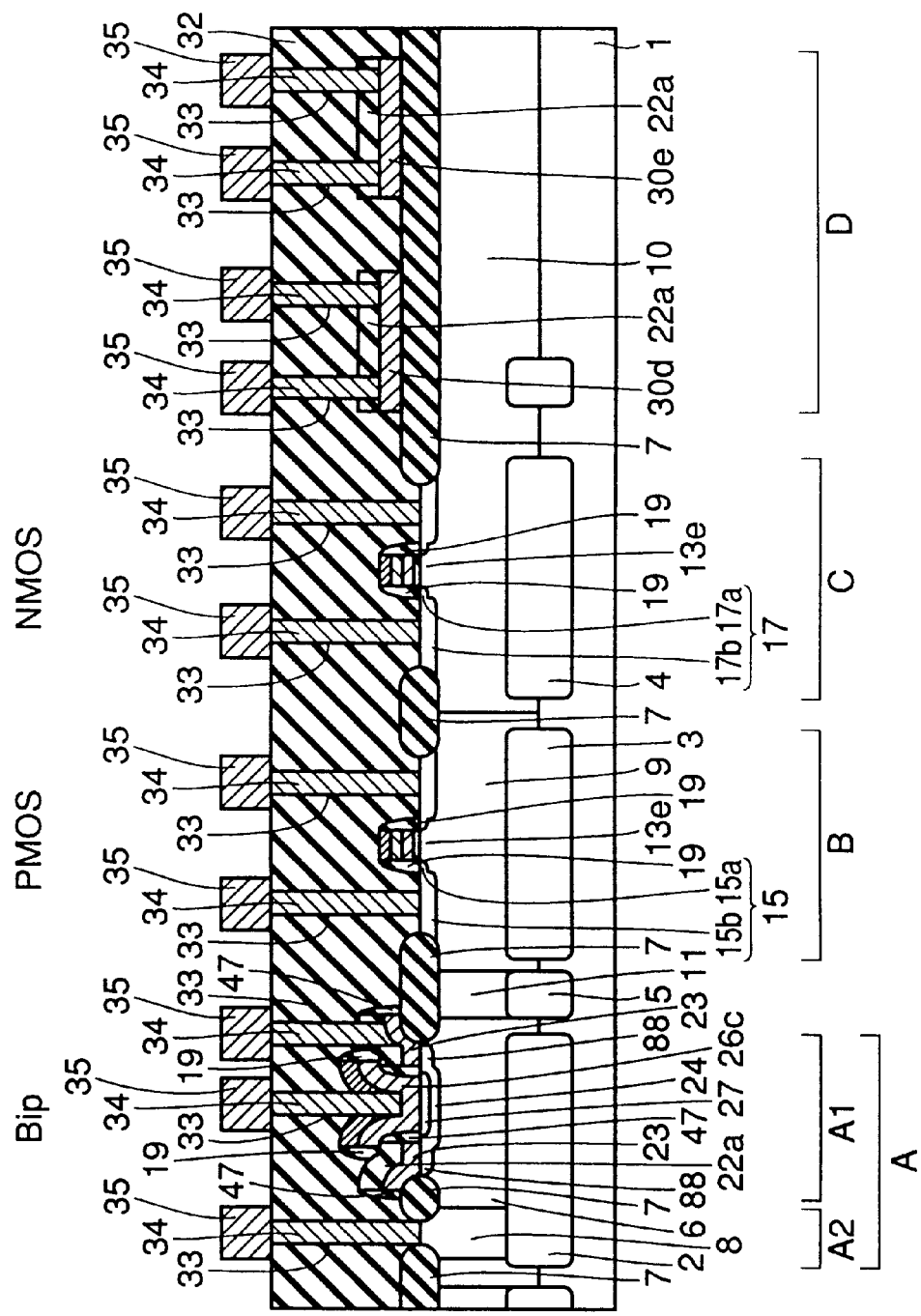

By a process similar to that in the embodiment 10 shown in FIGS. 63 to 67, the BiCMOS element of the embodiment 12 shown in FIG. 71 is completed.

According to the process of the embodiment 12 described above, external base leader electrode 23, first P-type polycrystalline silicon resistance 30d and second P-type polycrystalline silicon resistance 30e can be formed simultaneously by patterning a single film, i.e., polycrystalline silicon film 23a. Therefore, the number of steps for film formation and the number of steps for the dry etching each can be reduced by two compared with the case where these electrode and resistances are formed in independent steps, respectively. Thereby, the manufacturing process can be simplified, and the etching damage can be reduced. Since two resistances having different resistance values, i.e., first and second P-type polycrystalline silicon resistances 30d and 30e can be formed from the single polycrystalline silicon film 23a, as can also be done in the embodiment 4, the manufacturing process is suitable to high-density integration, similarly to the embodiment 4.

(Embodiment 13)

Referring to FIGS. 72 to 75, a manufacturing process of an embodiment 13 will be described below.

Figure 72:
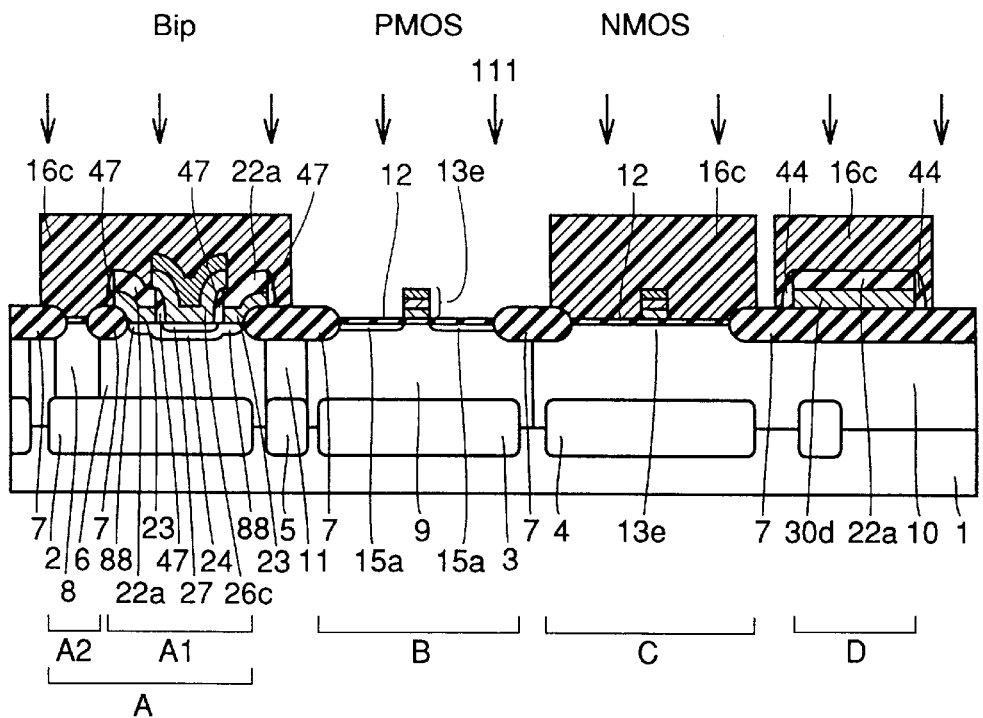
FIGS. 72 to 75 are cross sections showing a process of manufacturing a BiCMOS element of an embodiment 13 of the invention.

By a process similar to that of the embodiment 10 shown in FIGS. 48 to 53, a structure shown in FIG. 53 is formed. In the process shown in FIG. 53, dry etching is performed with a mask formed of photoresist pattern 57, so that gate electrode 13e and emitter electrode 26c are simultaneously formed as shown in FIG. 72. As shown in FIG. 72, processing is performed to form photoresist pattern 16c covering bipolar transistor part (A1 and A2), NMOS transistor part (C) and polycrystalline silicon resistance part (D). P-type impurity 111 is ion-implanted into the surface of N-type well region 9 masked with photoresist pattern 16c and gate electrode 13e of PMOS transistor part (B), so that lightly doped P$^-$-type source/drain regions 15a are formed. In this implantation, for example, ions of BF$_2^+$ are implanted under the conditions of 25 KeV and $7 \times 10^{13} cm^{-2}$. Thereafter, photoresist pattern 16c is removed.

Figure 73:
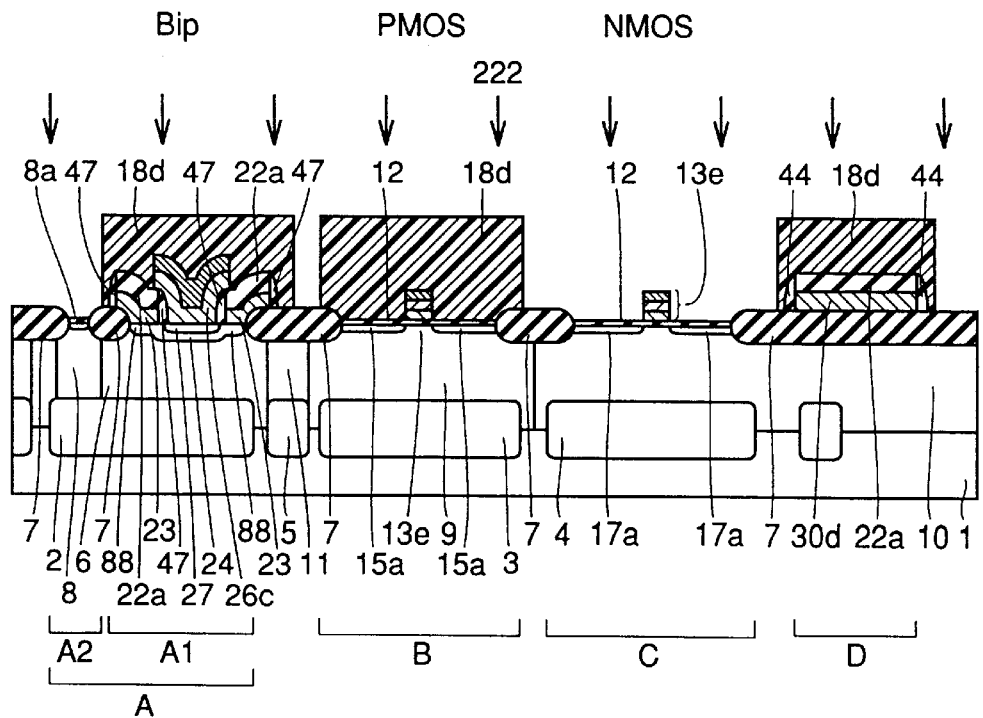

As shown in FIG. 73, processing is performed to form a photoresist pattern 18d covering emitter/base region A1 of the bipolar transistor part, PMOS transistor part (B) and polycrystalline silicon resistance part (D). N-type impurity 222 is ion-implanted into the surface of P-type well region 10 masked with photoresist pattern 18d and gate electrode 13e of NMOS transistor part (C), so that lightly doped N$^-$-type source/drain regions 17a are formed. In this implantation, N-type impurity 222 is implanted also into the surface of collector wall region 8. Thereby, N-type impurity region 8a is formed at the surface of collector wall region 8. In this implantation of N-type impurity 222, for example, ions of As$^+$ are implanted under the conditions of 60 KeV and $3 \times 10^{13} cm^{-2}$. Thereafter, photoresist pattern 18d is removed.

Figure 74:
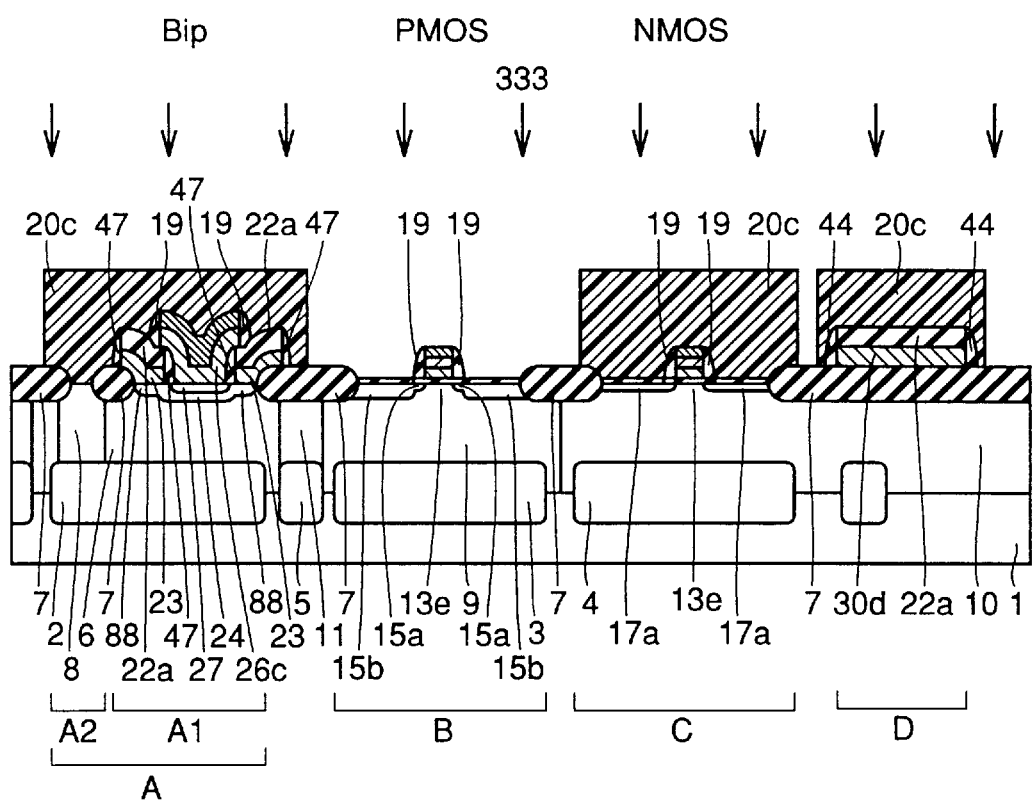

Then, as shown in FIG. 74, side wall spacer 19 shown in FIG. 74 is formed at the side surface of gate electrode 13e by a process similar to that of the embodiment 10 already described with reference to FIG. 56. Processing is performed to form photoresist pattern 20c covering bipolar transistor part (A1 and A2), NMOS transistor part (C) and polycrystalline silicon resistance part (D). P-type impurity 333 is ion-implanted into the surface of N-type well region 9 masked with photoresist pattern 20c, gate electrode 13e of PMOS transistor part (B) and side wall spacer 19, so that heavily doped P$^+$-type source/drain regions 15b are formed. In this implantation, for example, ions of BF$_2^+$ are implanted under the conditions of 20 KeV and $4 \times 10^{15} cm^{-2}$. Thereafter, photoresist pattern 20c is removed.

Figure 75:
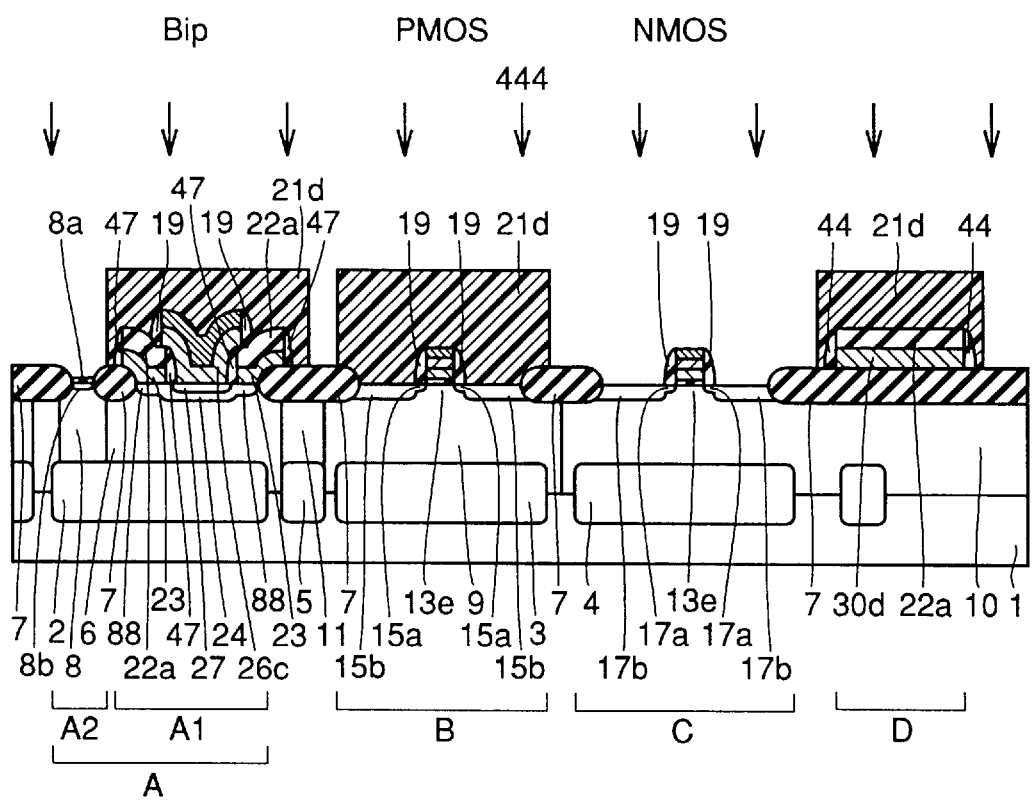

As shown in FIG. 75, processing is performed to form a photoresist pattern 21d covering base/emitter active region (A1) of the bipolar transistor part, PMOS transistor part (B) and polycrystalline silicon resistance part (D). N-type impurity 444 is ion-implanted into the surface of P-type well region 10 masked with photoresist pattern 21d, gate electrode 13e of NMOS transistor part (C) and side wall spacer 19, so that heavily doped N$^+$-type source/drain regions 17b are formed. N-type impurity 444 is implanted also into the surface of collector wall region 8. Thereby, N-type impurity region 8b is formed. In this implantation, for example, ions of As$^+$ are implanted under the conditions of 50 KeV and $4 \times 10^{15} cm^{-2}$. Thereafter, the BiCMOS element of the embodiment 13 is completed through a process similar to that of the embodiment 10.

In the manufacturing method of the embodiment 13, N-type impurity regions 8a and 8b are formed by implanting N-type impurity 222 and 444 into the surface of collector wall region 8. Therefore, in addition to the effects of the embodiments 10 to 12, such an effect can be achieved that the collector resistance can be reduced. Thereby, the drive performance and high-speed performance of the bipolar transistor can be improved, so that the total performance of the bipolar transistor can be improved.

(Embodiment 14)

Referring to FIGS. 76 to 80A and 80B, a manufacturing process of an embodiment 14 will be described below.

By a process similar to that of the embodiment 10 shown in FIGS. 48 to 52, a structure shown in FIG. 52 is completed.

Figure 76:
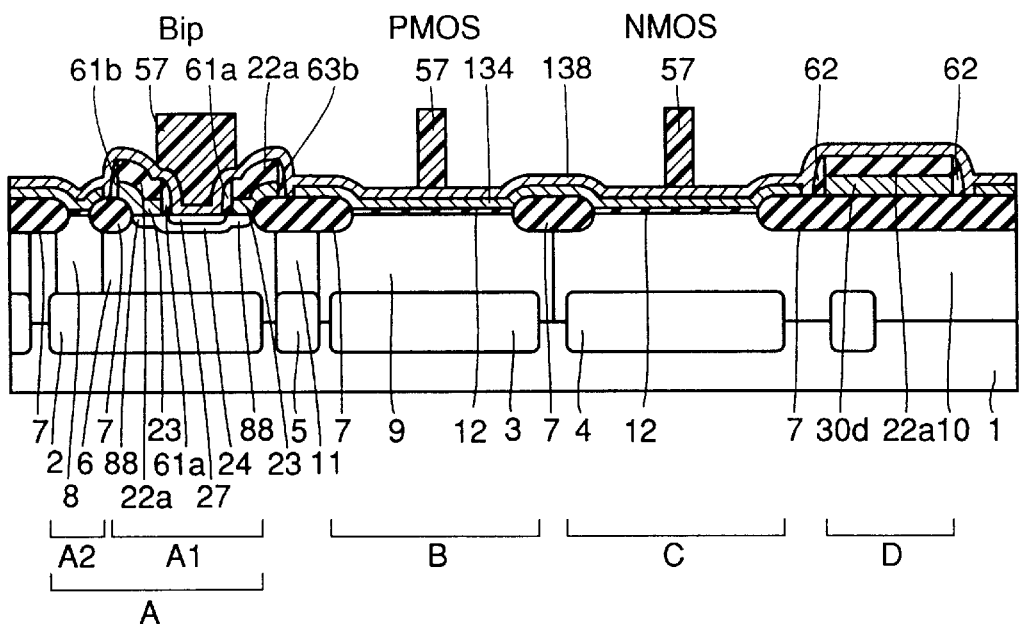
FIGS. 76, 77, 78A, 78B, 79A, 79B, 80A and 80B are cross sections showing a process of manufacturing a BiCMOS element of an embodiment 14 of the invention.

Thereafter, processing of forming a tungsten silicide film on polycrystalline silicon film 138 is not performed in contrast to the manufacturing process of the embodiment 10, and a photoresist pattern 57 is formed at a predetermined region on polycrystalline silicon film 138 as shown in FIG. 76. Using photoresist pattern 57 as a mask, dry etching is effected on underlying polycrystalline silicon films 138 and 134 and gate oxide film 12. Thereby, a gate electrode 13f and an emitter electrode 26d are simultaneously formed as shown in FIG. 77.

Figure 77:
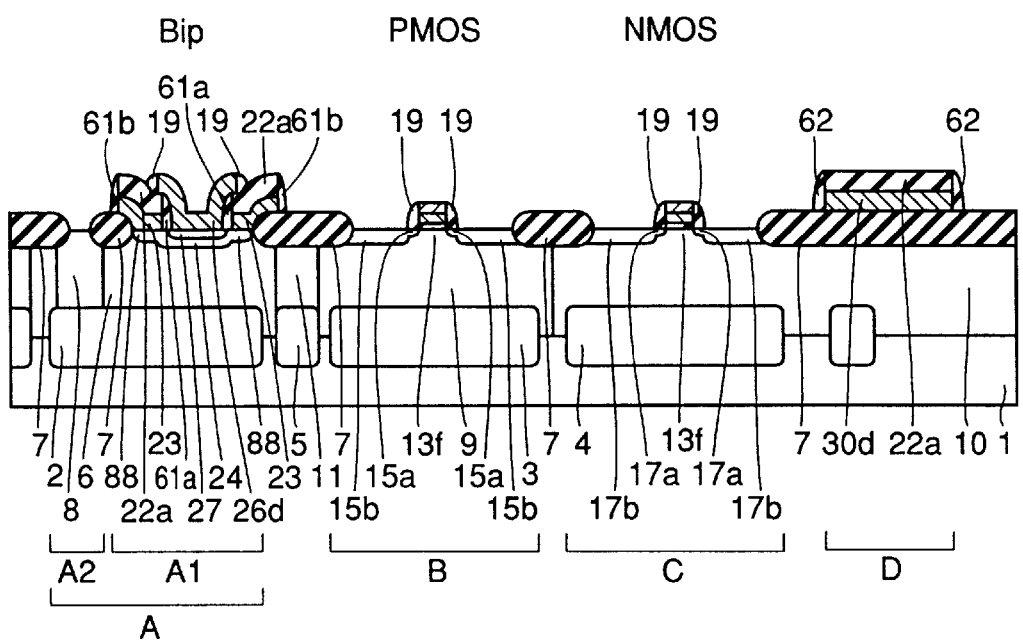

Thereafter, source/drain regions 15 and 17 of the CMOS transistor shown in FIG. 77 are formed through a process similar to that of the embodiment 11 shown in FIGS. 63 to 66. Also, side wall spacers 61a and 61b are formed at side surfaces of external base leader electrode 23 and CVD oxide film 22a. Further, a side wall spacer 62 is formed at the side surfaces of polycrystalline silicon resistance 30d and overlying CVD oxide film 22a.

Figure 78A:
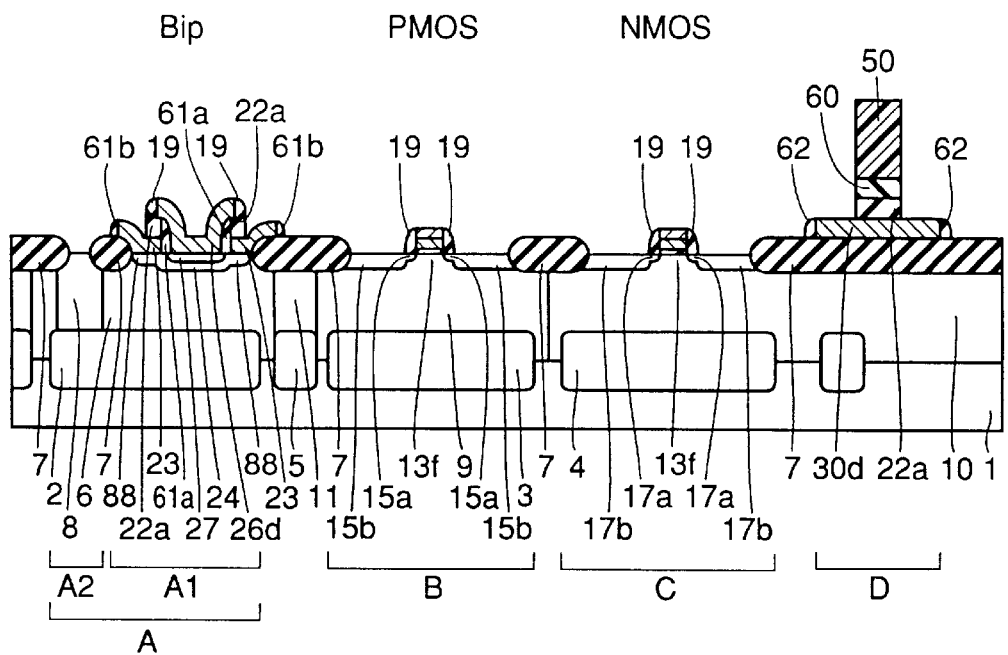
Figure 78B:
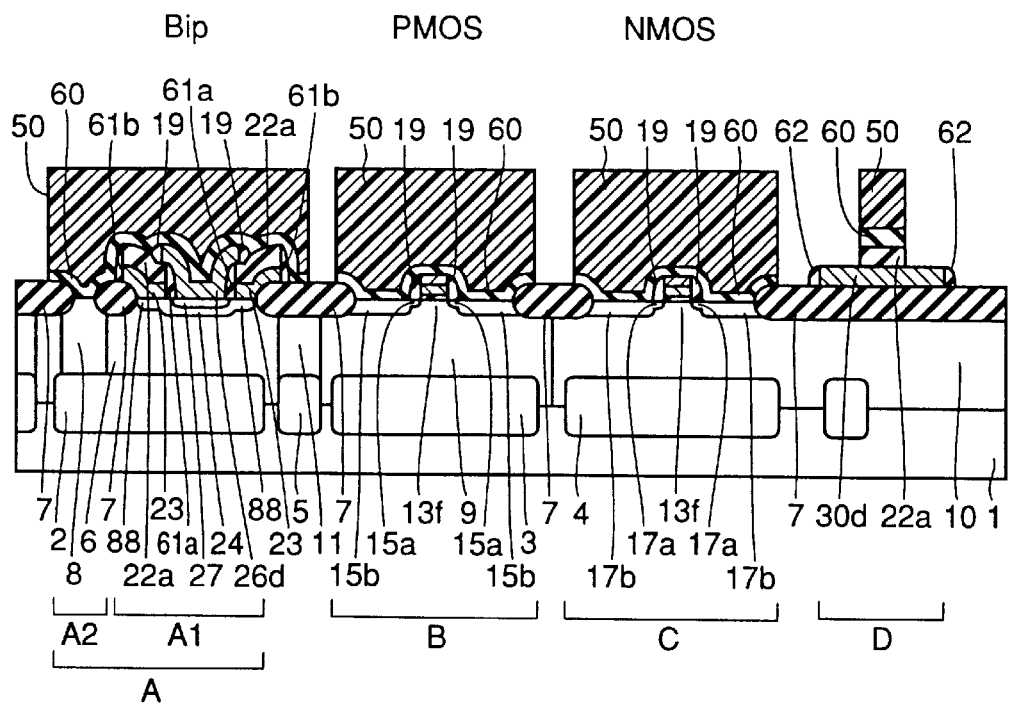

After forming a CVD oxide film (not shown) on the whole surface of the above structure, photoresist pattern 50 is formed over a region of the CVD oxide film at which metal silicide film 39 is not formed, as shown in FIG. 78. Using photoresist pattern 50 as a mask, the underlying CVD oxide film is dry-etched, so that a CVD oxide film 60 is formed as shown in FIGS. 78A and 78B. Thereafter, photoresist pattern 50 is removed.

Figure 79A:
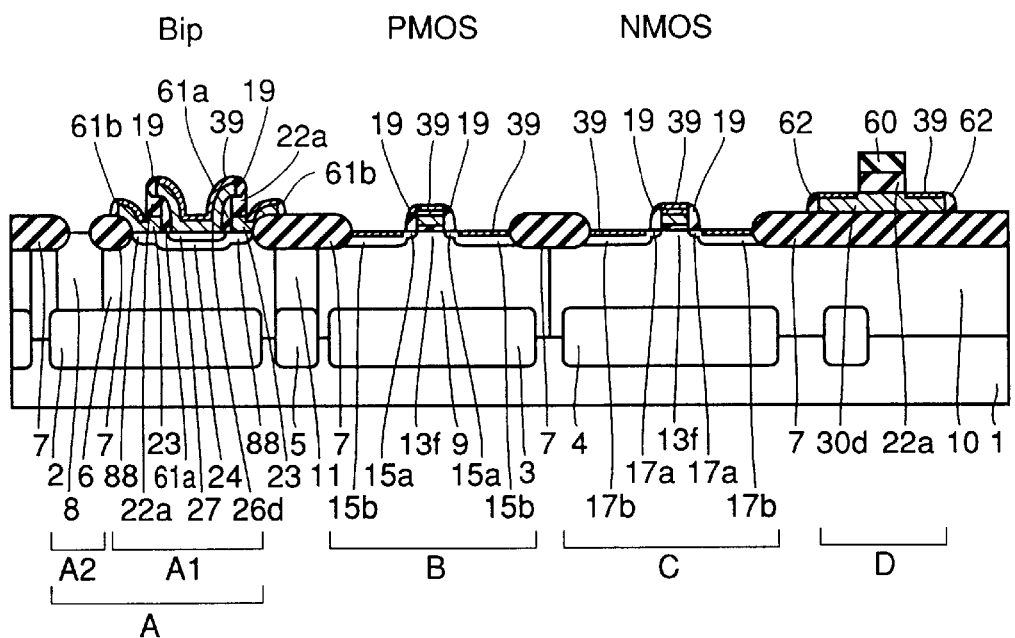
Figure 79B:
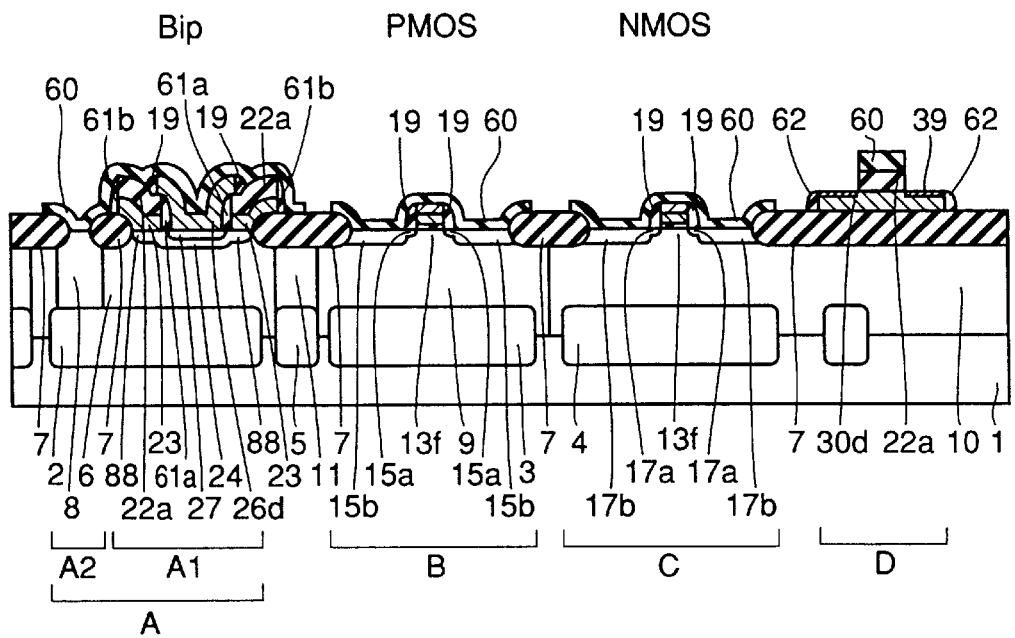

A metal film of, e.g., cobalt is deposited on the whole surface of the above structure, and lamp annealing is performed several times. Thereby, metal film located on the silicon and polycrystalline silicon change into metal silicide film. Thereafter, portions of the metal film which did not change into the metal silicide film are removed, so that metal silicide films 39 are formed only on the silicon and polycrystalline silicon as shown in FIGS. 79A and 79B. The bipolar transistor and CMOS transistor which are provided with metal silicide films 39 as well as the bipolar transistor and CMOS transistor not provided with metal silicide film 39 can be selectively formed. Metal silicide film 39 formed at the surface of emitter electrode 26d is spaced from the metal silicide film 39 formed at the surface of external base leader electrode 23 by side wall spacer 19 and CVD oxide film 22a. This prevents short-circuiting between emitter electrode 26d and external base leader electrode 23.

Figure 80A:
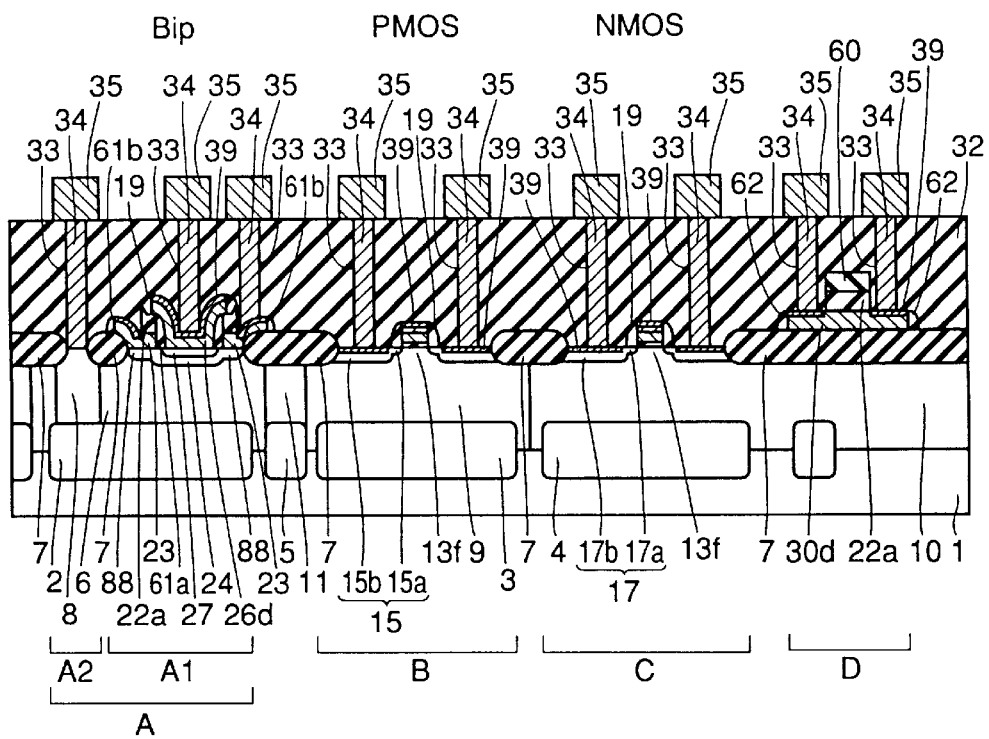
Figure 80B:
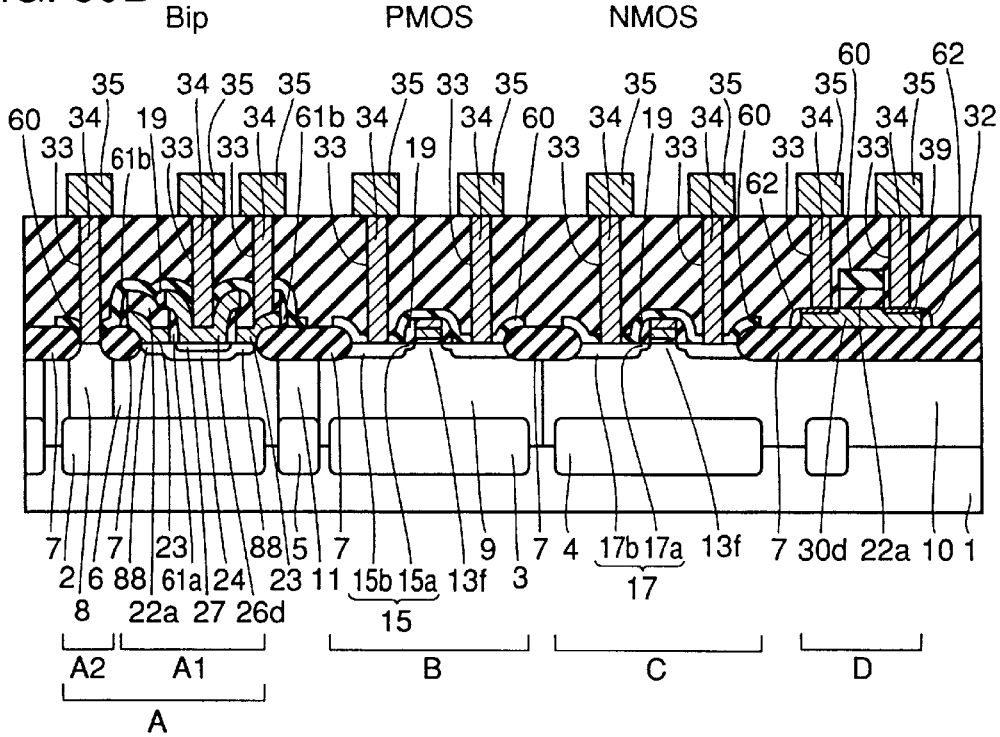
Figure 81:
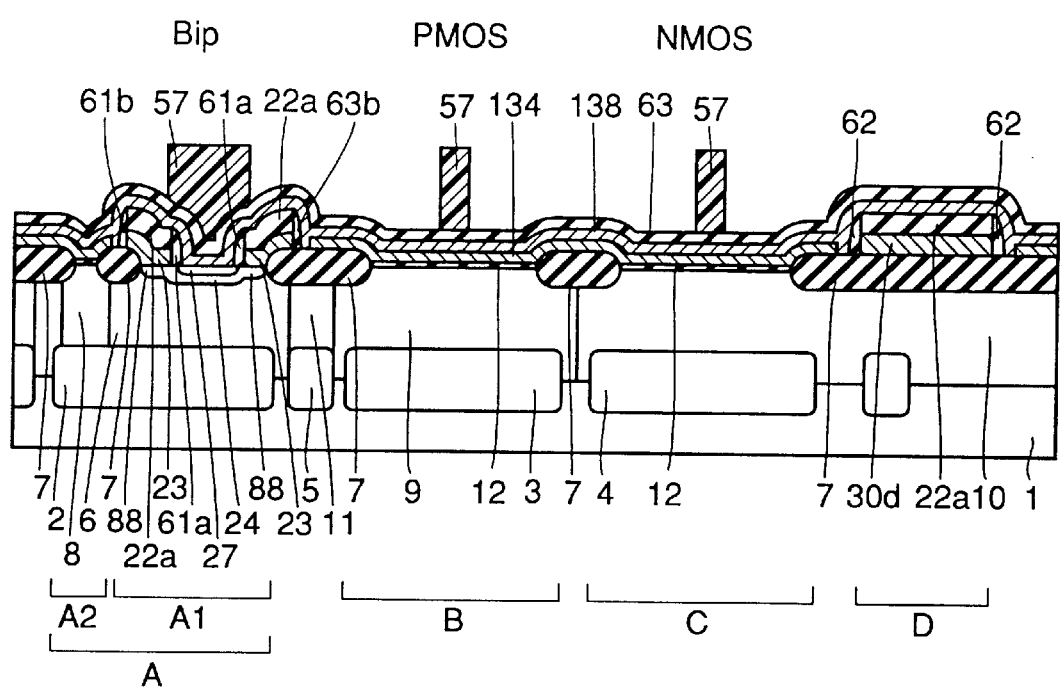
FIGS. 81, 82A, 82B, 83A and 83B are cross sections showing a process of manufacturing a BiCMOS element of an embodiment 15 of the invention.

Thereafter, as shown in FIGS. 80A and 80B, interlayer insulating film 32 is formed, and contact holes 33 are formed at predetermined regions of interlayer insulating film 32. Processing is performed to fill each contact hole 33 with metal film 34 made of, e.g., tungsten. Metal interconnection 35 made of, e.g., aluminum is then formed on the supper surface of each metal film 34, so that the BiCMOS element of the embodiment 14 is completed.

Figure 112:
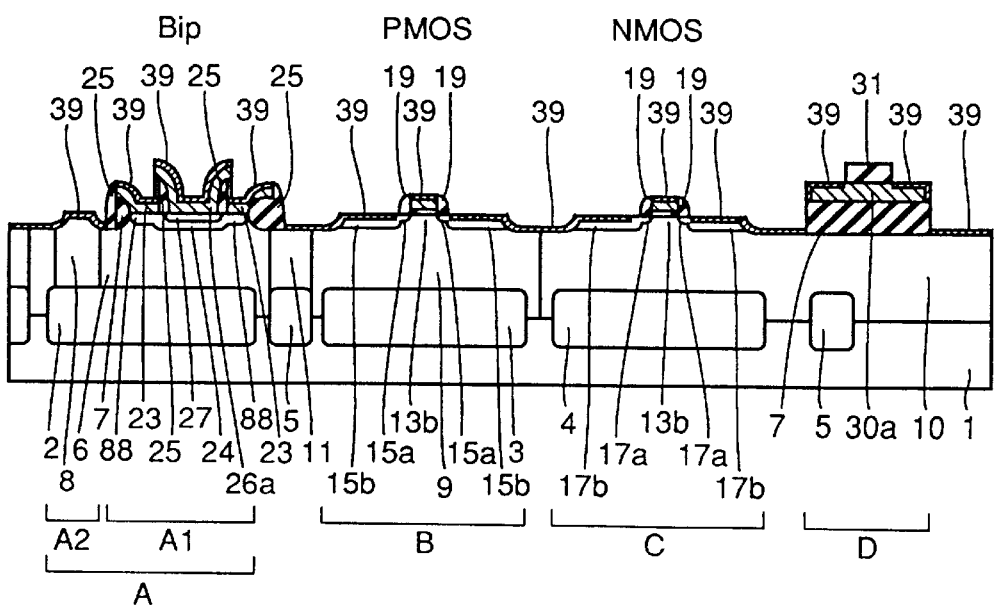

According to the manufacturing process of the embodiment 14, as described above, the layered film formed of polycrystalline silicon film 134, nitride film 40 and CVD oxide film 41 covers the surface except for that of emitter/base active region (A1) during formation of external base leader electrode 23 of the bipolar transistor, as is done in the embodiment 6 already described. Therefore, reduction in film thickness of field oxide film 7 can be suppressed. Thereby, such a disadvantage can be prevented that metal silicide film 39 short-circuits source/drain regions 17 of NMOS transistor part (C) and source/drain regions of PMOS transistor part (B) as shown in FIG. 112. Further, the bipolar transistor and the CMOS transistor, which are provided with metal silicide films 39 and have low resistances and high-speed performances, as well as the ordinary transistor not provided with metal silicide film 39 can be formed simultaneously.

(Embodiment 15)

Referring to FIGS. 81 to 83A and 83B, a manufacturing process of an embodiment 15 will be described below.

Figure 82A:
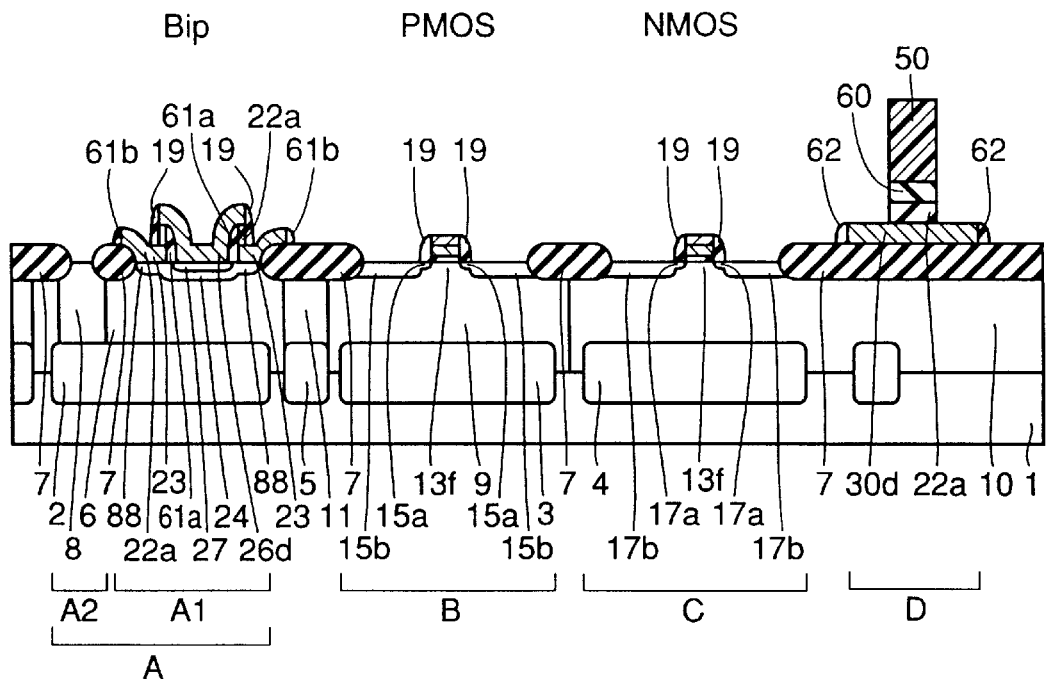
Figure 82B:
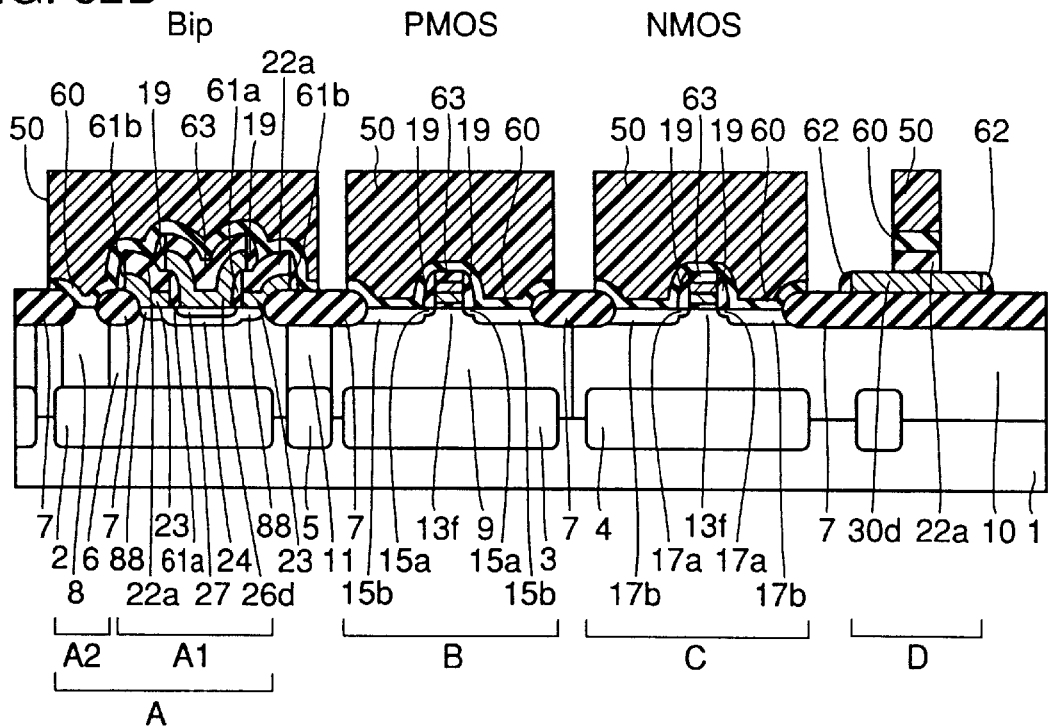

Similarly to the embodiment 14, N-type impurity 555 is implanted after depositing polycrystalline silicon film 138 for the emitter electrode. In this case, a tungsten silicide film is not deposited on polycrystalline silicon film 138. Then, a CVD oxide film 63 is deposited on the surface of polycrystalline silicon film 138, and thereafter photoresist pattern 57 is formed at a predetermined region on CVD oxide film 63. Patterning is performed with a mask formed of photoresist pattern 57, so that gate electrode 13f and emitter electrode 26d are formed simultaneously as shown in FIGS. 82A and 82B.

Figure 83A:
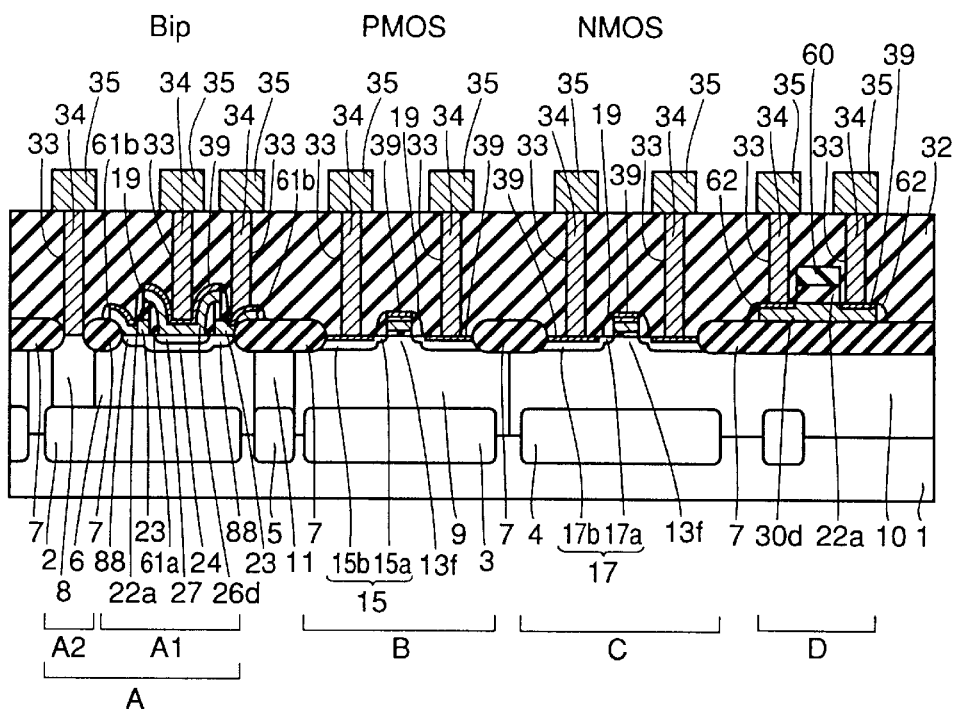
Figure 83B:
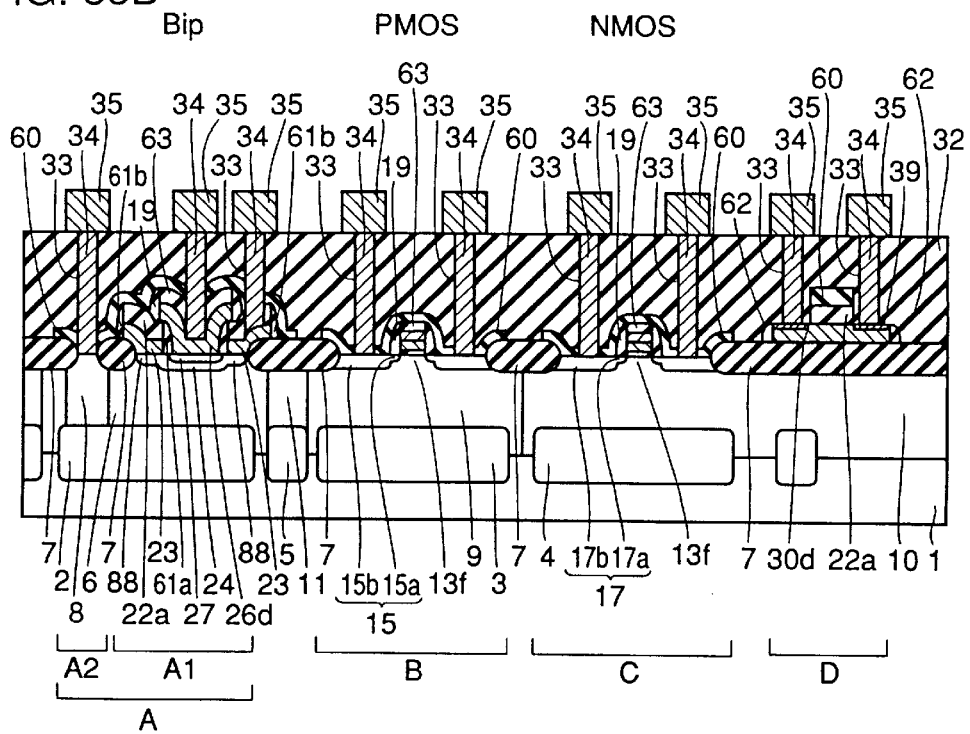

Thereafter, source/drain regions 15 and 17 of the CMOS transistor are formed through a process similar to that of the embodiment 11 shown in FIGS. 63 to 66. Thereafter, a CVD oxide film (not shown) of about 1000 Å in thickness is deposited, and photoresist pattern 50 is formed at predetermined regions on the CVD oxide film. Photoresist pattern 50 thus formed covers regions at which metal silicide films 39 will not be formed by a later process. Patterning is performed with a mask formed of photoresist pattern 50, so that CVD oxide film 60 is formed as shown in FIGS. 82A and 82B. Thereafter, photoresist pattern 50 is removed. Through the same process as that of the embodiment 14 shown in FIGS. 79A and 79B, the BiCMOS element of the embodiment 15 is completed as shown in FIGS. 83A and 83B.

Similarly to the embodiment 14 already described, this embodiment 15 can suppress reduction in film thickness of field oxide film 7, so that short-circuiting due to formation of metal silicide film 39 can be prevented, and further the transistor provided with metal silicide film 39 and having a high-speed performance as well as the ordinary transistor not provided with metal silicide film 39 can be formed easily.

(Embodiment 16)

Figure 84:
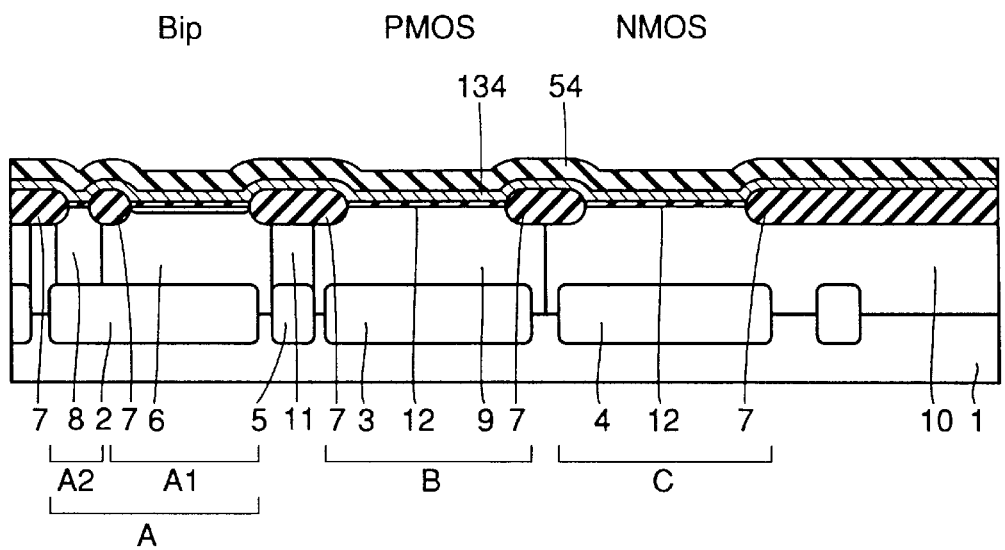
FIGS. 84 and 85 are cross sections showing a process of manufacturing a BiCMOS element of an embodiment 16 of the invention.
Figure 85:
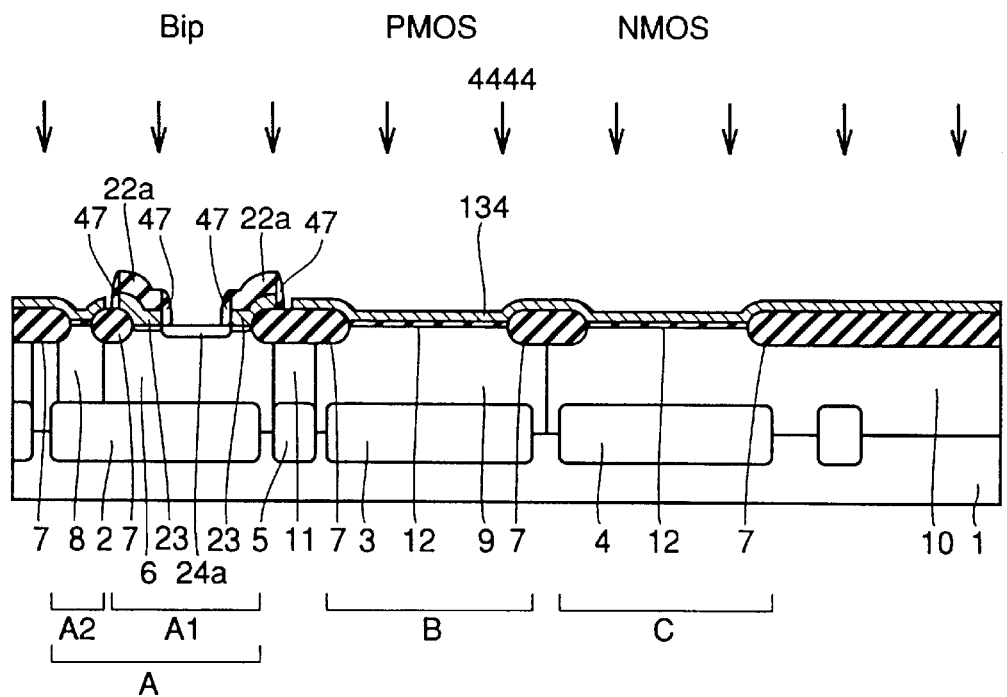

Referring to FIGS. 84 and 85, a manufacturing process of an embodiment 16 will be described below.

Figure 49:
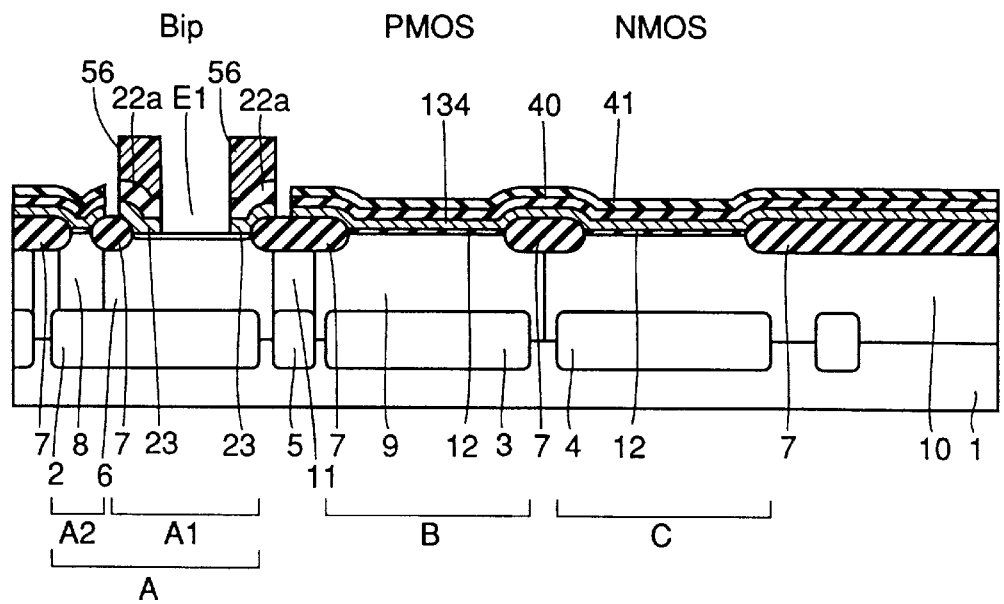

First, the structure shown in FIG. 1 is formed through the same process as that of the embodiment 1 shown in FIG. 1. Thereafter, as shown in FIG. 84, gate oxide film 12 is formed on the surface of silicon substrate 1 and more specifically at bipolar transistor part (A1 and A2), PMOS transistor part (B) and NMOS transistor part (C). Polycrystalline silicon film 134 of about 500 Å in thickness is formed on gate oxide film 12 and field oxide film 7, and CVD oxide film 54 of about 500 Å in thickness is formed on polycrystalline silicon film 134. Thereafter, polycrystalline silicon film 134 and CVD oxide film 54 located on base/emitter active region (A1) are removed through the same process as that of the embodiment 1 shown in FIG. 3. Thereafter, the same process as that of the embodiment 10 shown in FIGS. 48 and 49 are performed to form external base leader electrode 23 shown in FIG. 85. Thereafter, impurity 444 is implanted for forming true base region 24a. Then, a CVD oxide film (not shown) of about 2000 Å in thickness is deposited on the whole surface and subsequently is dry-etched, so that side wall spacer 47 is formed at the side surface of external base leader electrode 23. This etching for forming the side wall spacer 47 is performed such that CVD oxide film 54 located on polycrystalline silicon film 134 may be removed completely. Thereby, the upper surface of polycrystalline silicon film 134 is exposed. The steps following the above step are the same as those of the embodiment 10 shown in FIGS. 52 to 58, so that the BiCMOS element of the embodiment 16 is completed.

According to the manufacturing process of the embodiment 16, as described above, the etching protection film for the region of the CMOS transistor part (B and C) is formed of the layered film formed of polycrystalline silicon film 134, nitride film 40 and CVD oxide film 41 instead of the layered film formed of polycrystalline silicon film 134 and CVD oxide film 54. This can reduce the steps in number.

(Embodiment 17)

A manufacturing process of an embodiment 17 will be described below with reference to FIGS. 86 and 87.

The structure shown in FIG. 49 is formed through a process similar to that of the embodiment 10 shown in FIGS. 48 and 49. Thereafter, photoresist pattern 56 is removed.

Figure 86:
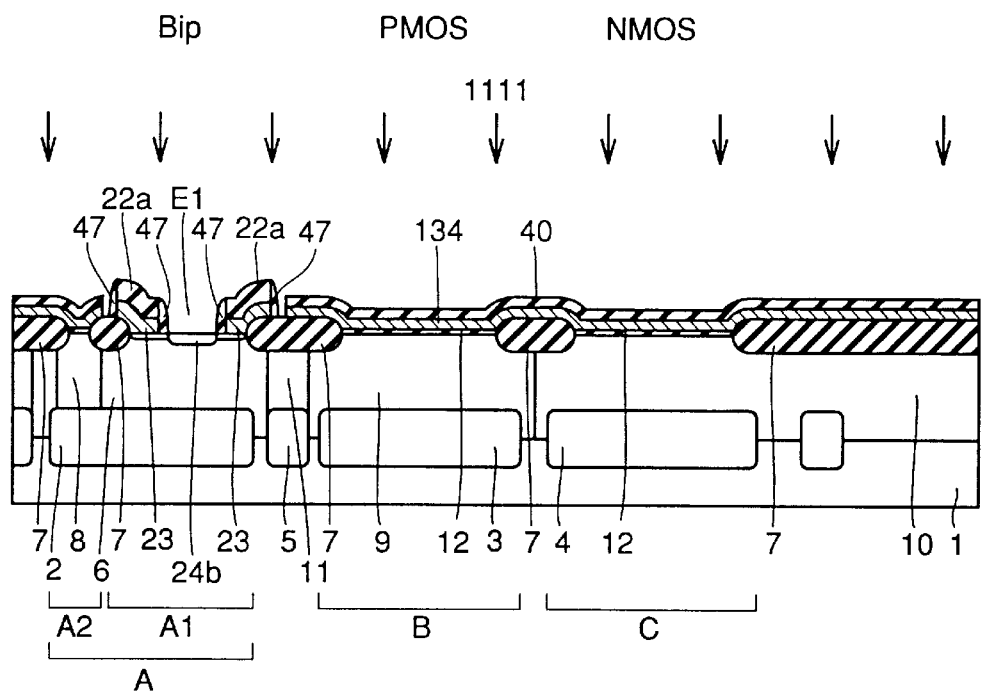
FIGS. 86 and 87 are cross sections showing a process of manufacturing a BiCMOS element of an embodiment 17 of the invention.
Figure 87:
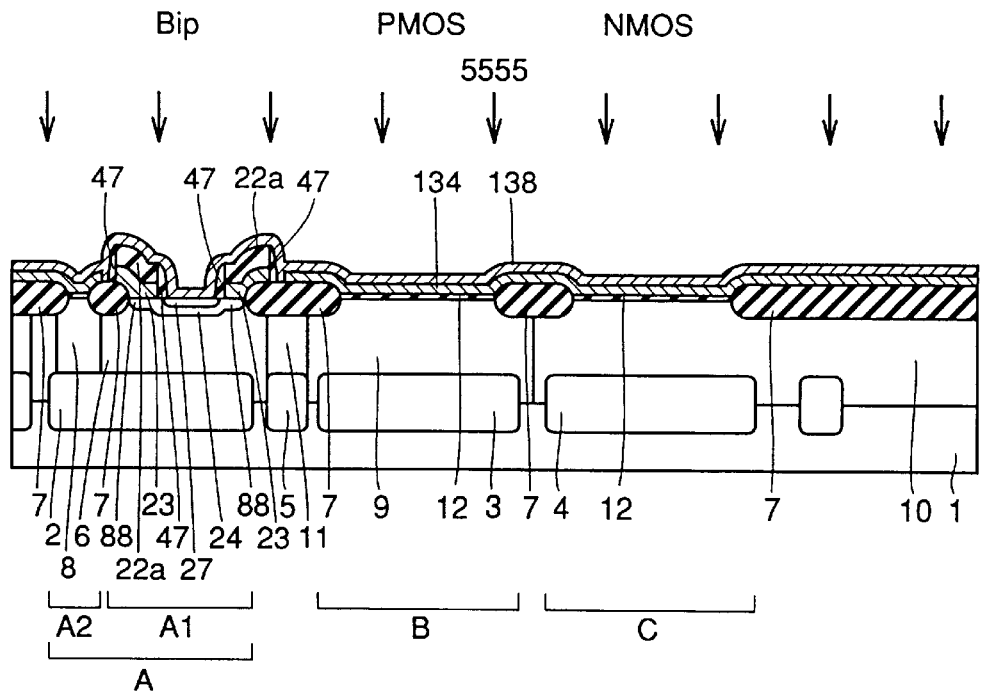

A CVD oxide film (not shown) of about 2000 Å in thickness is deposited on the whole surface, and then is dry-etched to form side wall spacer 47 at the side surface of external base leader electrode 23 as shown in FIG. 86. This dry etching for forming side wall spacer 47 also removes CVD oxide film 41 (see FIG. 49) on nitride film 40. Thereafter, implantation of P-type impurity 1111 is performed for forming true base region 24b. In this implantation, for example, ions of $BF_2^+$ are implanted under the conditions of 10 KeV and $3\times10^{13} cm^{-2}$. Thereafter, nitride film 40 is removed. As shown in FIG. 87, polycrystalline silicon film 138 of about 1000 Å in thickness is deposited on the whole surface, and N-type impurity 5555 is implanted into the surface of polycrystalline silicon film 138.

Subsequently, a tungsten silicide film (not shown) of about 1000 Å in thickness is deposited on the whole surface, and then is patterned to form a gate electrode (not shown) formed of polycrystalline silicon films 134 and 138 and the tungsten silicide film. Thereafter, the BiCMOS element of the embodiment 17 is completed through a process similar to that of the embodiment 10.

Similarly to the embodiment 8 already described, this embodiment 17 employs true base region 24b which is formed by implanting P-type impurity 1111 after forming side wall spacer 47 in opening E1 for the emitter. Thereby, a depth of the external base region 24b can be controlled without being affected by the fact that the surface of the silicon substrate is shaved during formation of side wall spacer 47. Thereby, it is possible to suppress variation in impurity concentration profile of the emitter/base, so that the variation in electrical characteristics of the bipolar transistor can be suppressed.

(Embodiment 18)

Figure 88:
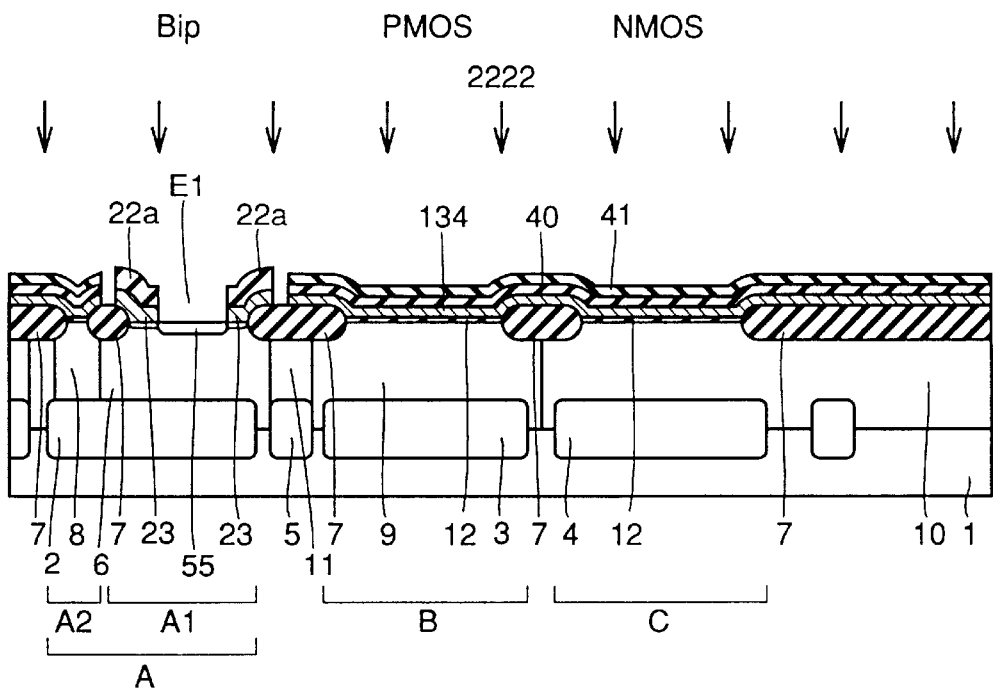
FIGS. 88 to 90 are cross sections showing a process of manufacturing a BiCMOS element of an embodiment 18 of the invention.
Figure 89:
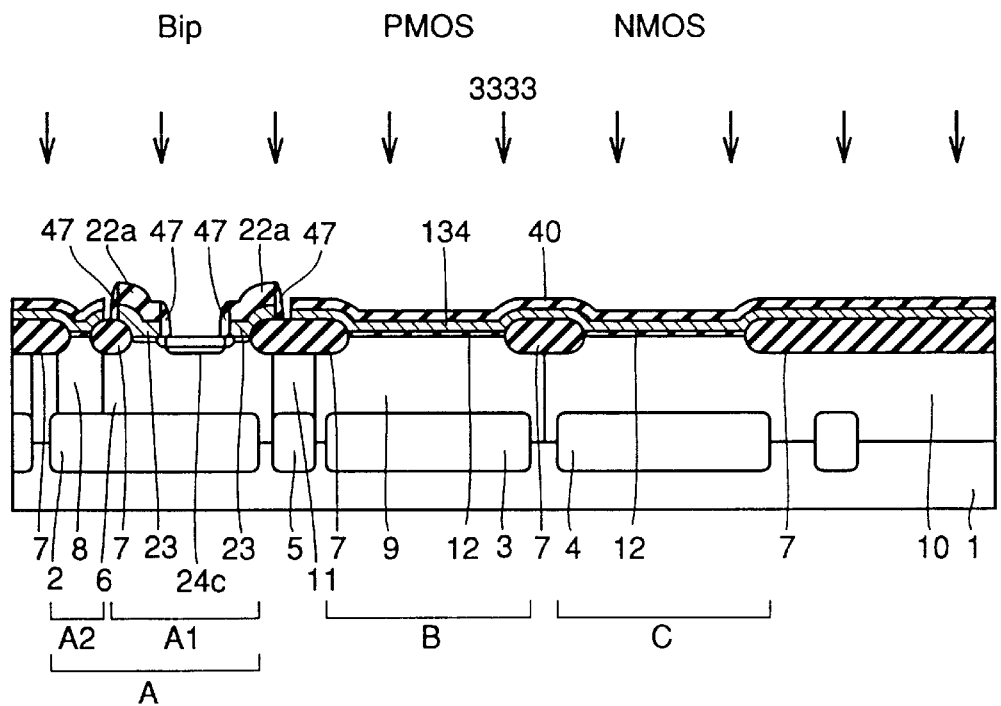
Figure 90:
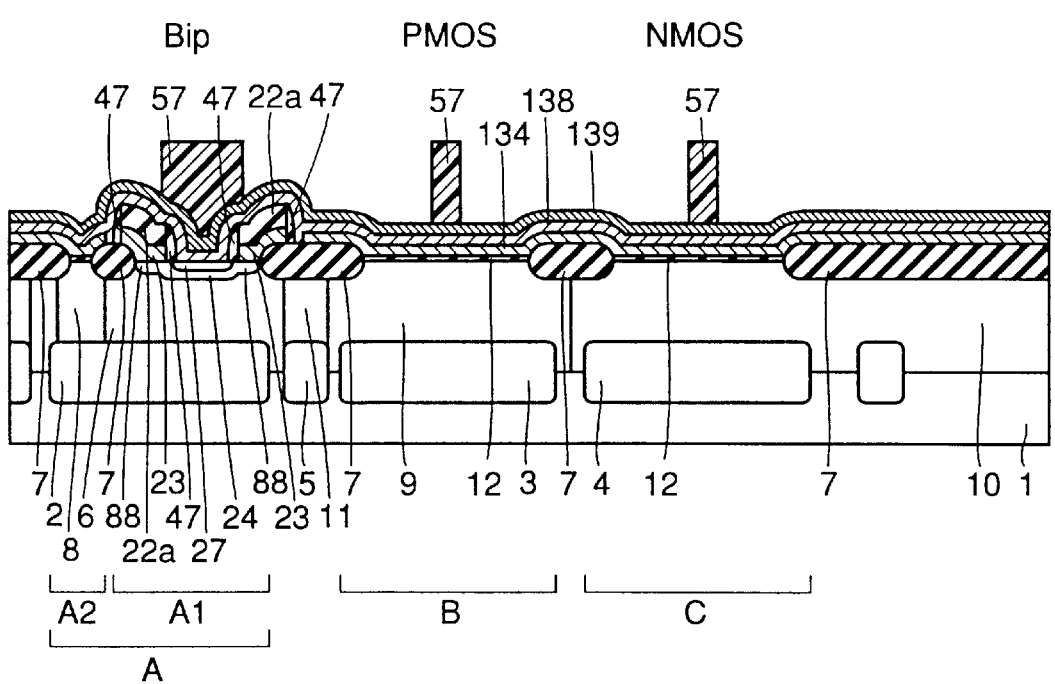

Referring to FIGS. 88 to 90, a manufacturing process of an embodiment 18 will be described below.

First, the structure shown in FIG. 49 is formed through the same process as that of the embodiment 10 shown in FIGS. 48 and 49. Thereafter, photoresist pattern 56 is removed. As shown in FIG. 88, P-type impurity 2222 is implanted for forming P-type impurity region 55 which will make a connection between true base region 24c and external base region 88 to be formed later. In this implantation, for example, ions of $BF_2^+$ are implanted under the conditions of 10 KeV and $3\times10^{13} cm^{-2}$. This manufacturing process is similar to that of the embodiment 9.

A CVD oxide film (not shown) of about 2000 Å in thickness is deposited on the whole surface, and then is dry-etched to form side wall spacer 47 at the side surface of external base leader electrode 23. After forming side wall spacer 47, P-type impurity 3333 is implanted for forming true base region 24c. As described above, this embodiment 18 employs two implanting operations (2222 and 3333) for the base implantation, so that the variations in base width and impurity concentration can be suppressed, similarly to the embodiment 9. FIG. 90 shows a step after forming emitter region 27.

(Embodiment 19)

Figure 91:
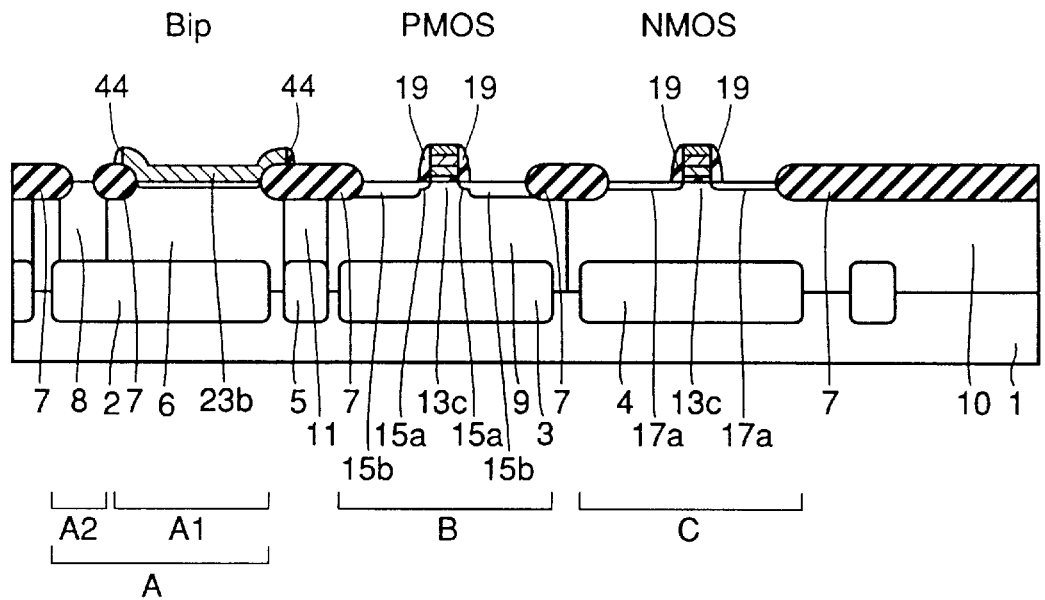
FIGS. 91 and 92 are cross sections showing a process of manufacturing a BiCMOS element of an embodiment 19 of the invention.

A manufacturing process of an embodiment 19 will be described below with reference to FIGS. 91 and 92.

First, the structure shown in FIG. 9 is formed through a process similar to that of the embodiment 1 shown in FIGS. 1 to 9. Thereafter, a CVD oxide film (not shown) of about 2000 Å in thickness is deposited, and then is dry-etched to form side wall spacer 19 at the side surface of gate electrode 13c as shown in FIG. 91. This dry etching for forming side wall spacer 19 is performed to remove completely CVD oxide film 22 (see FIG. 9) on external base leader electrode layer 23b, so that the surface of external base leader electrode layer 23b is exposed.

Figure 11:
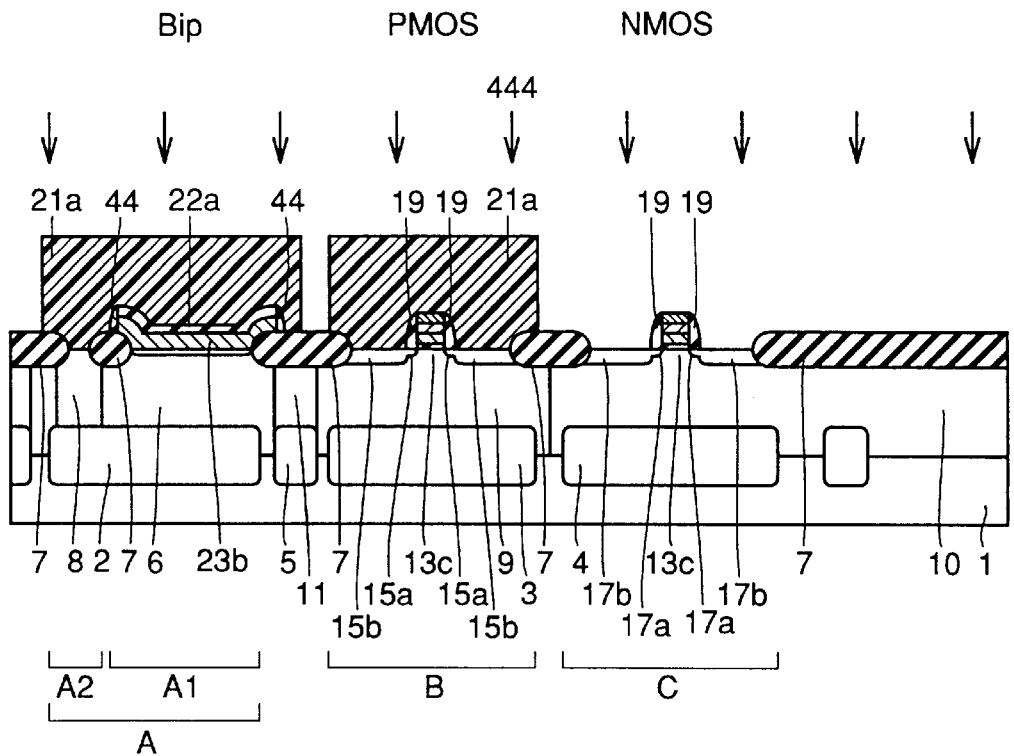
Figure 92:
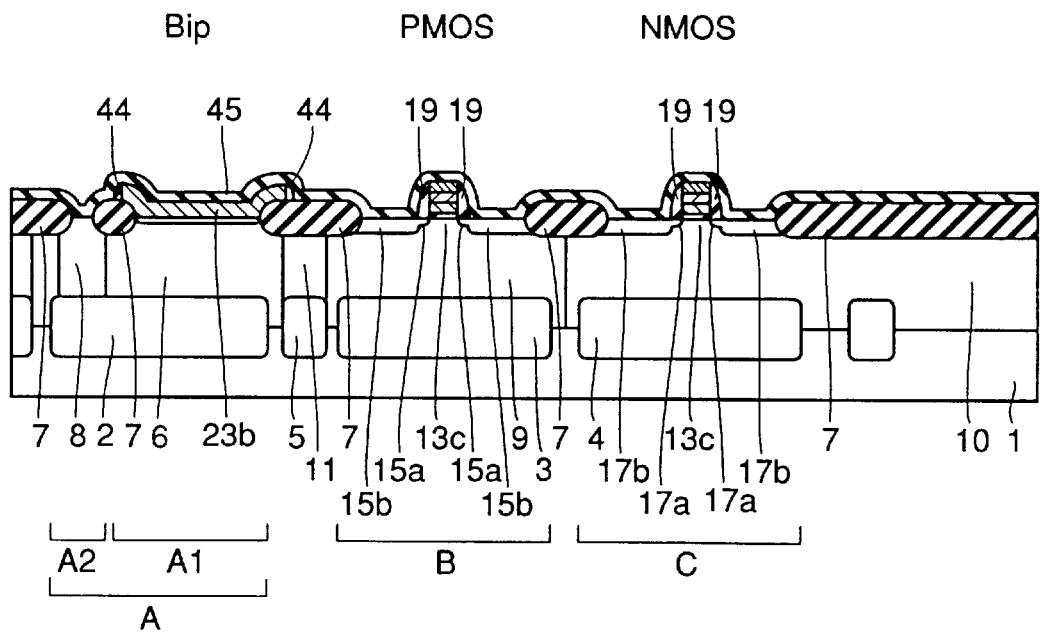
Figure 93:
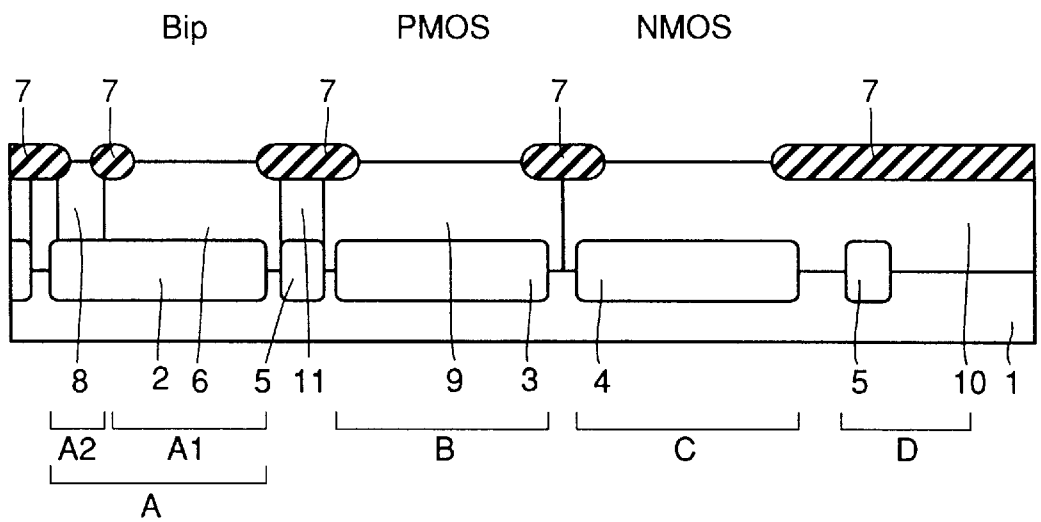
FIGS. 93 to 106 are cross sections showing a process of manufacturing a first BiCMOS element in the prior art.
Figure 94:
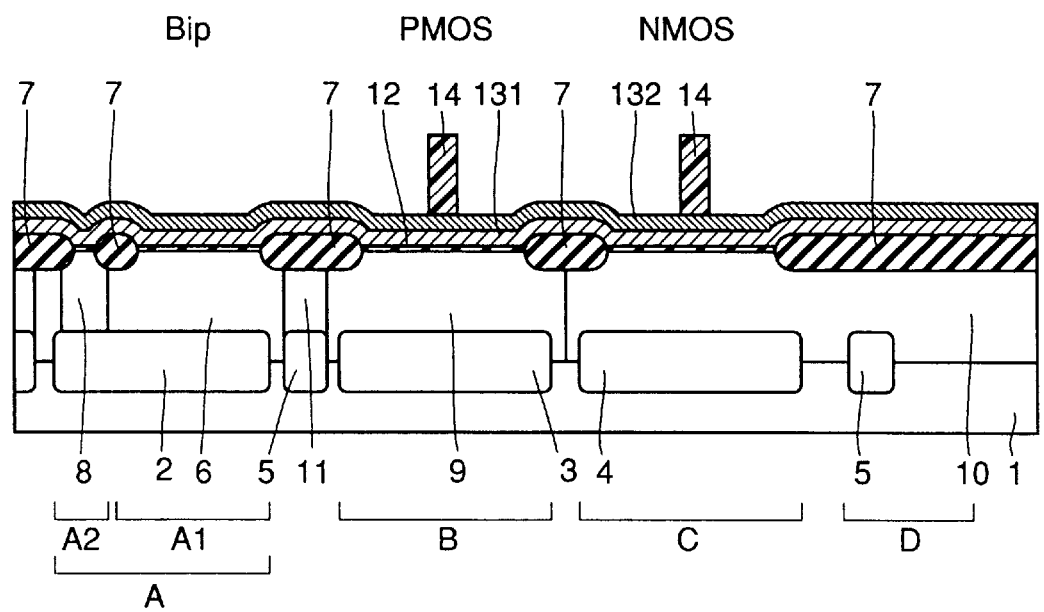
Figure 95:
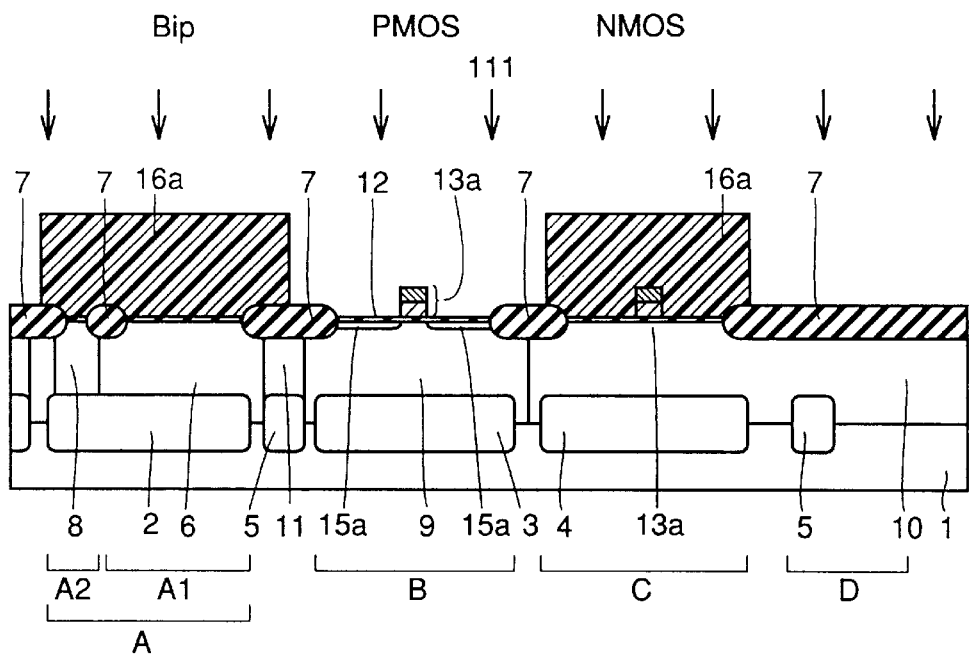
Figure 96:
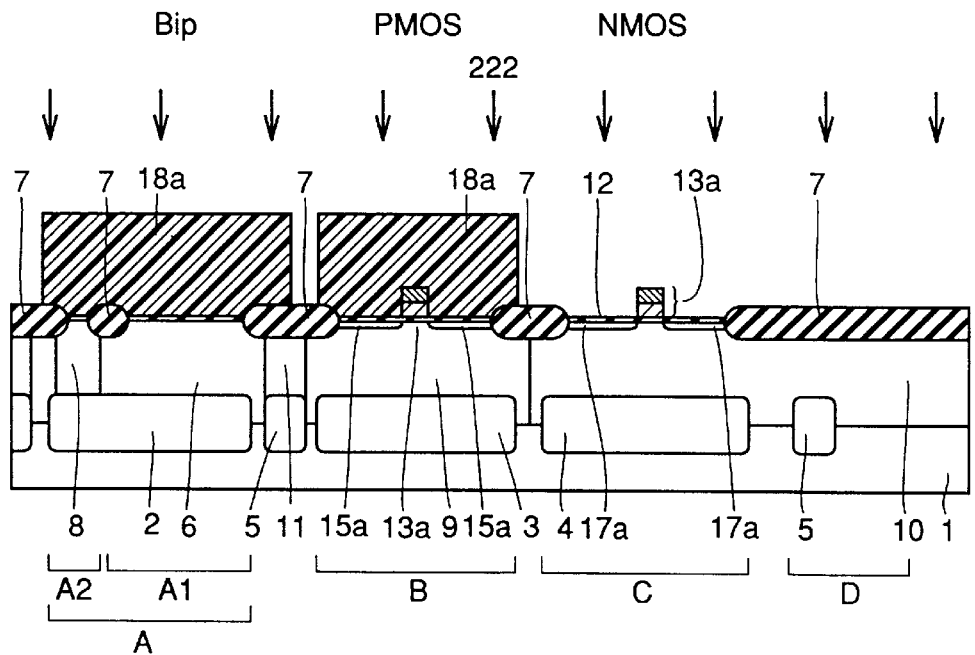
Figure 97:
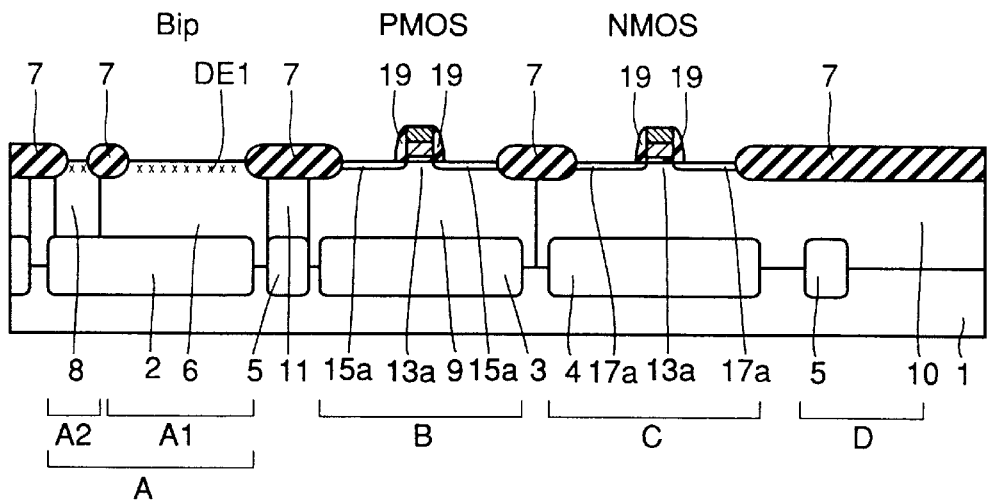
Figure 98:
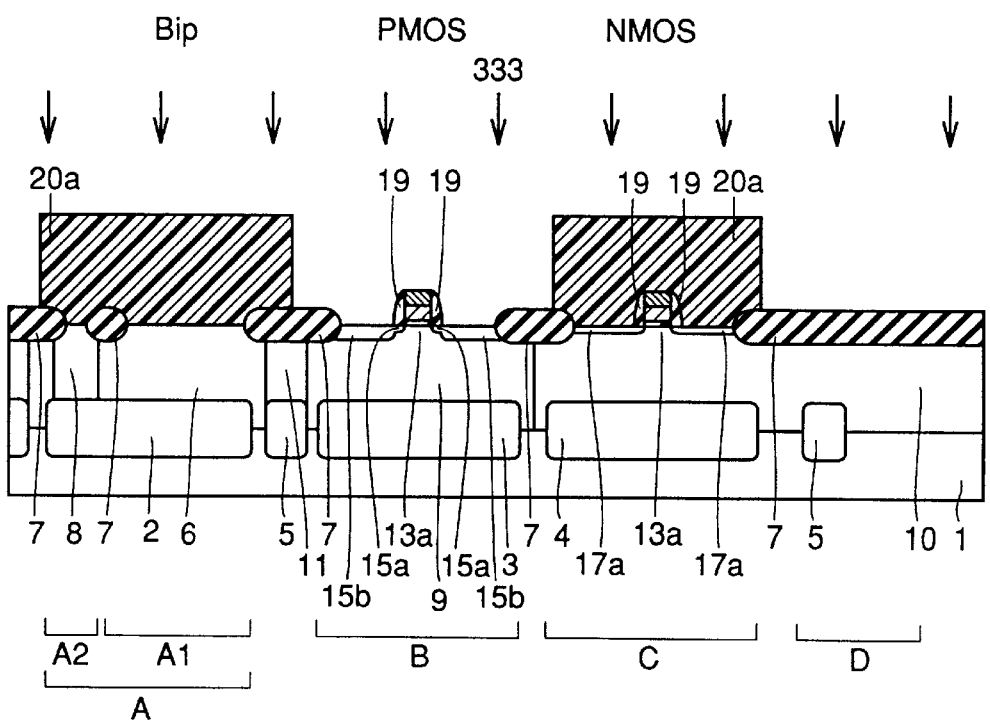
Figure 99:
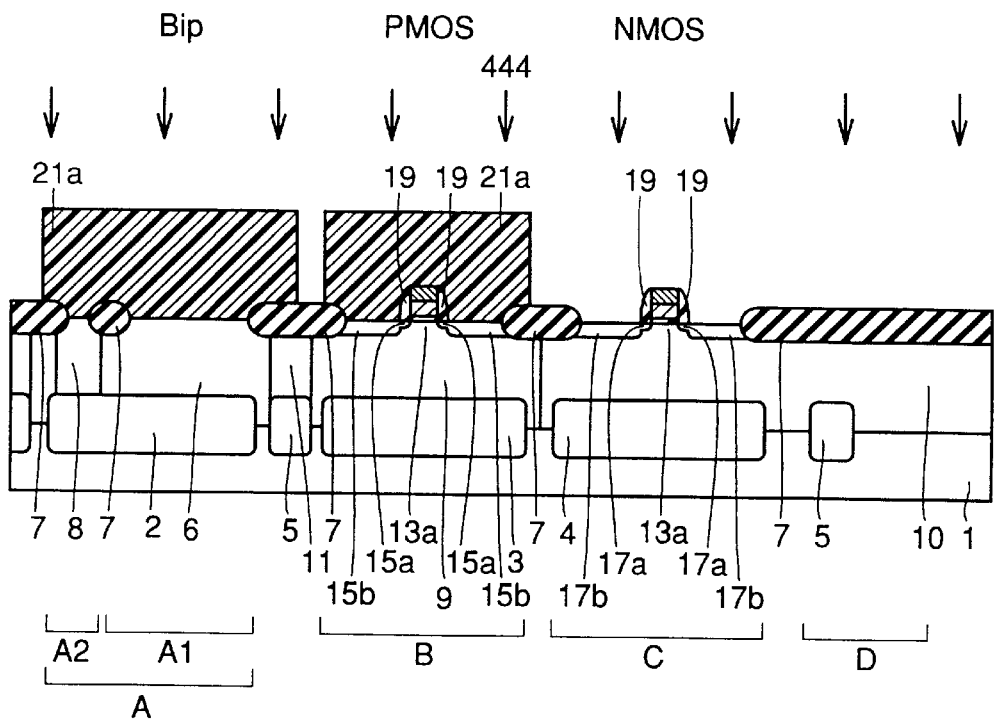
Figure 100:
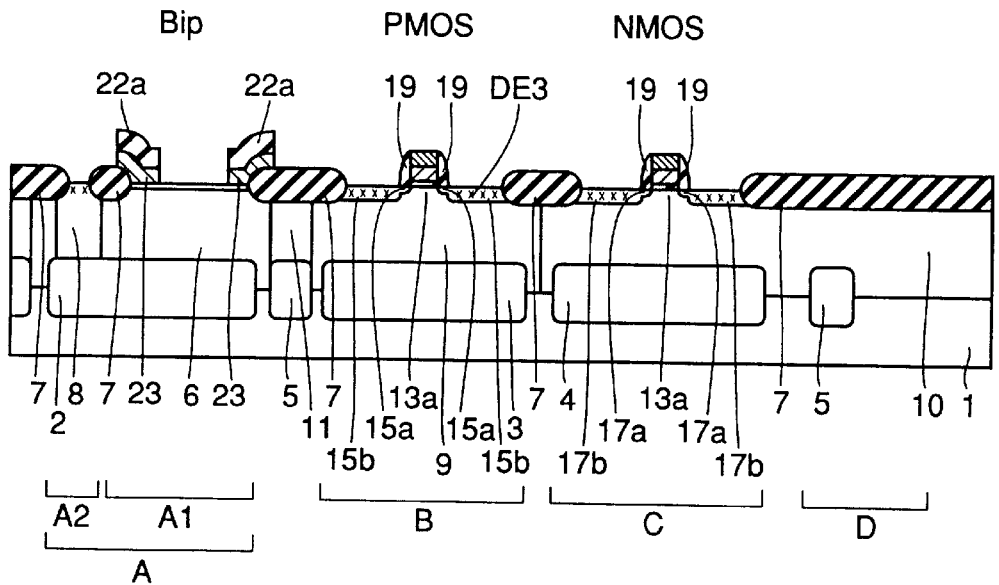
Figure 101:
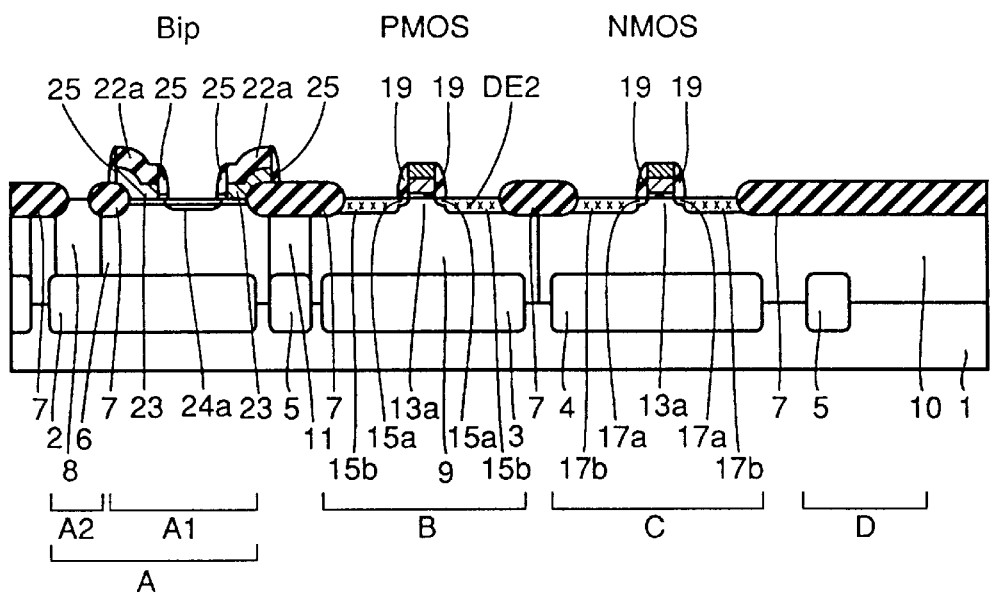
Figure 102:
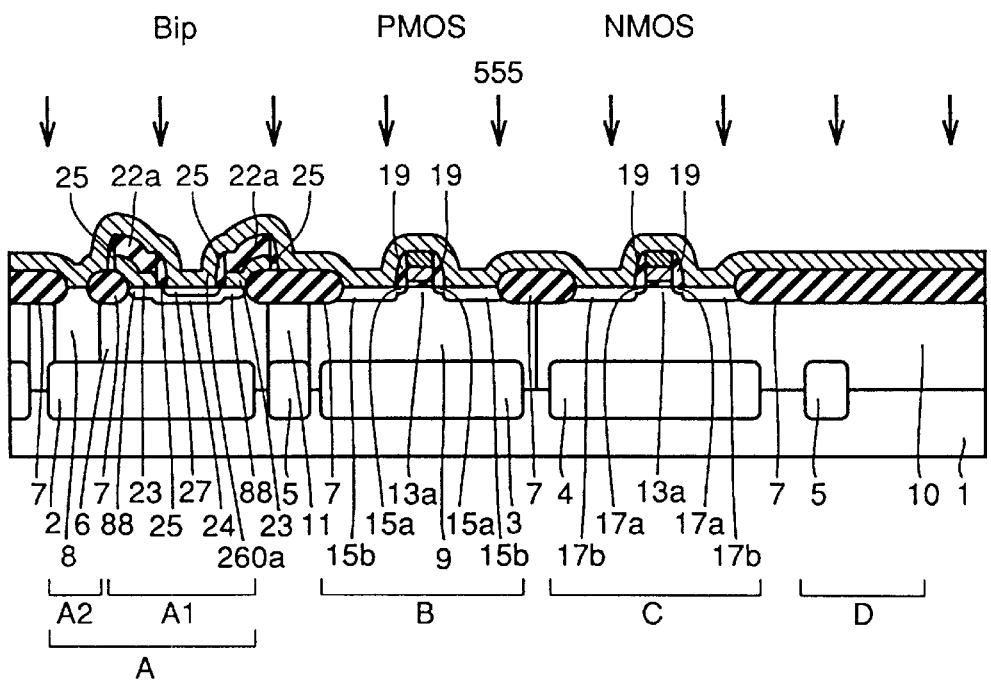
Figure 103:
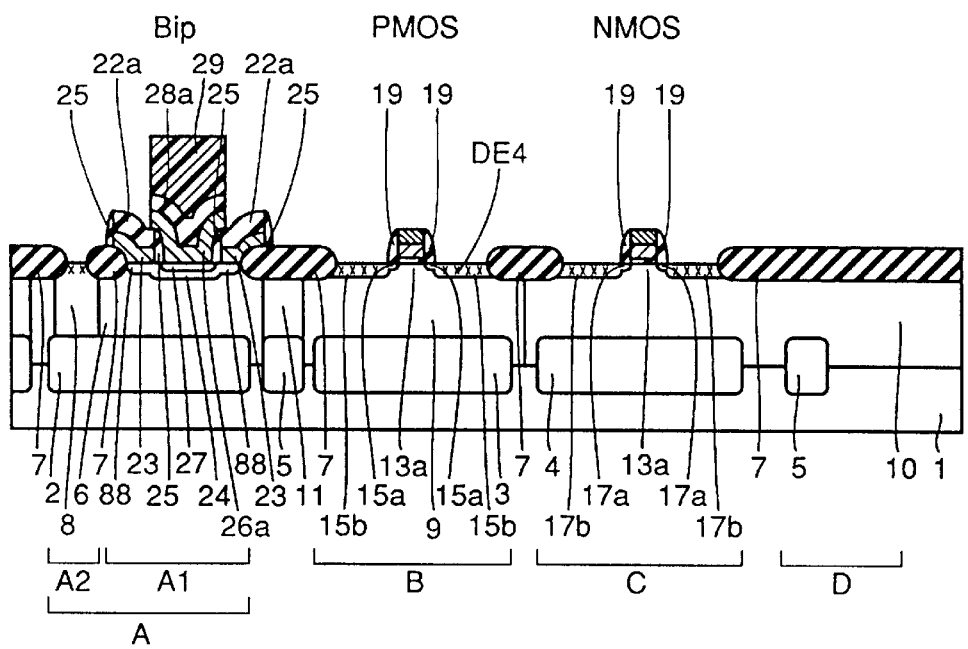
Figure 104:
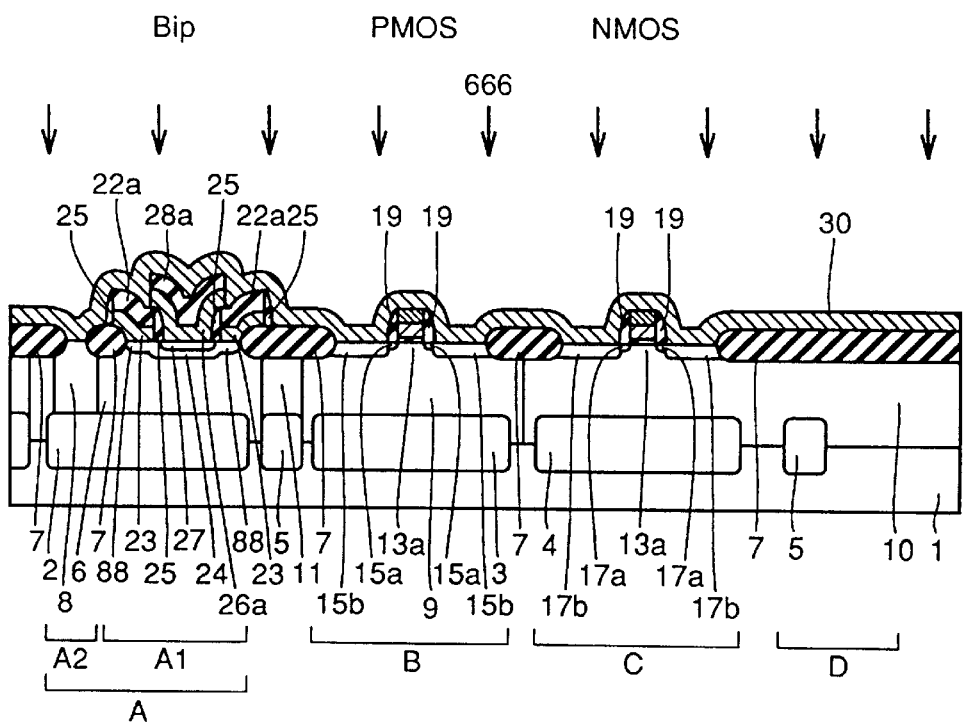
Figure 105:
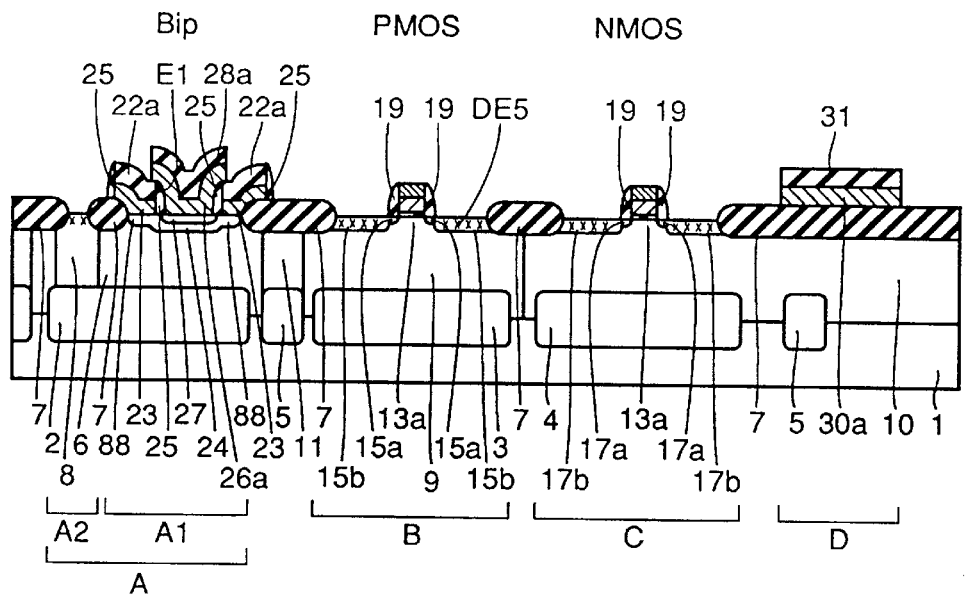
Figure 106:
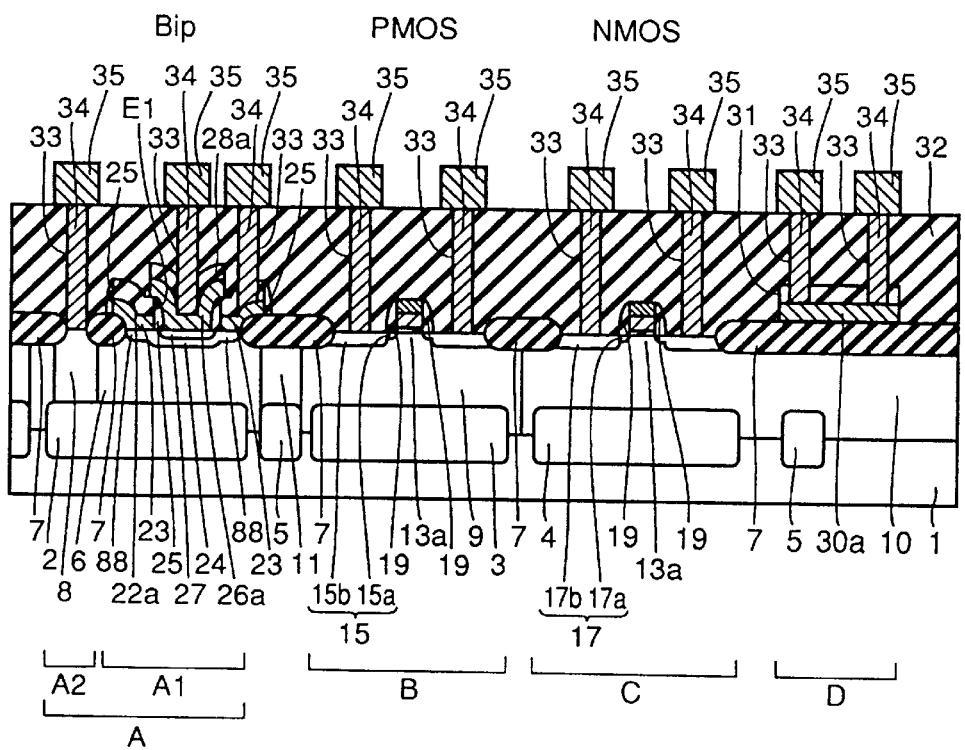
Figure 107:
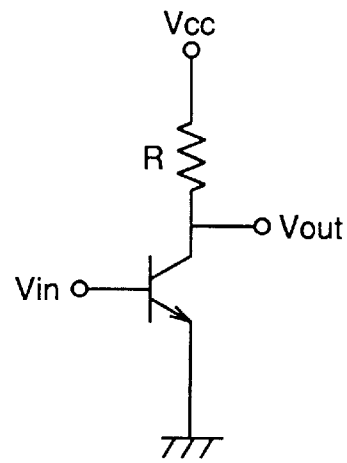
FIG. 107 is an equivalent circuit diagram showing an inverter circuit including a bipolar transistor and a resistance element in the prior art.
Figure 108:
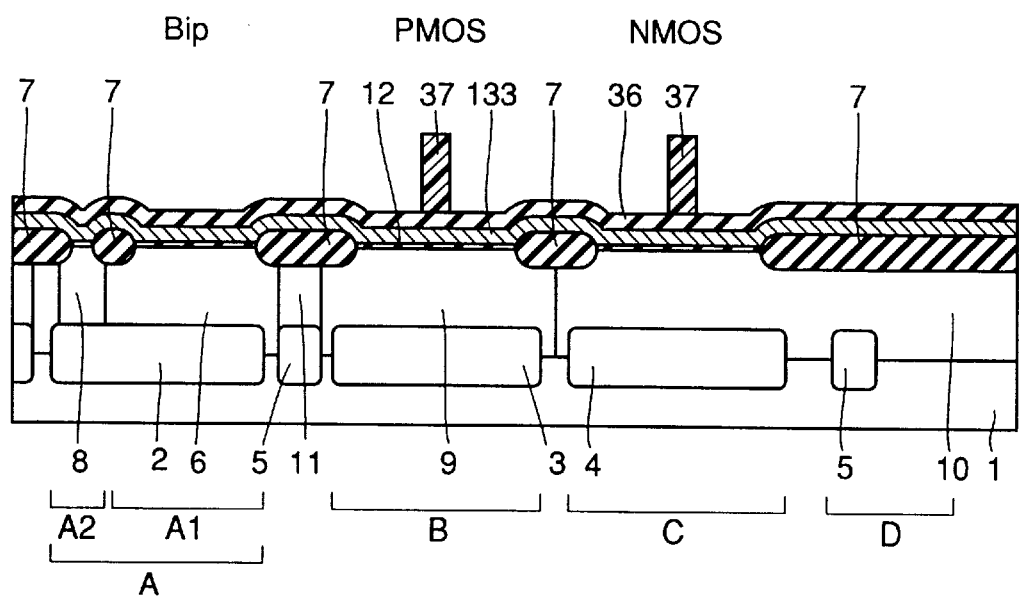
FIGS. 108 to 112 are cross sections showing a process of manufacturing a second BiCMOS element in the prior art.
Figure 109:
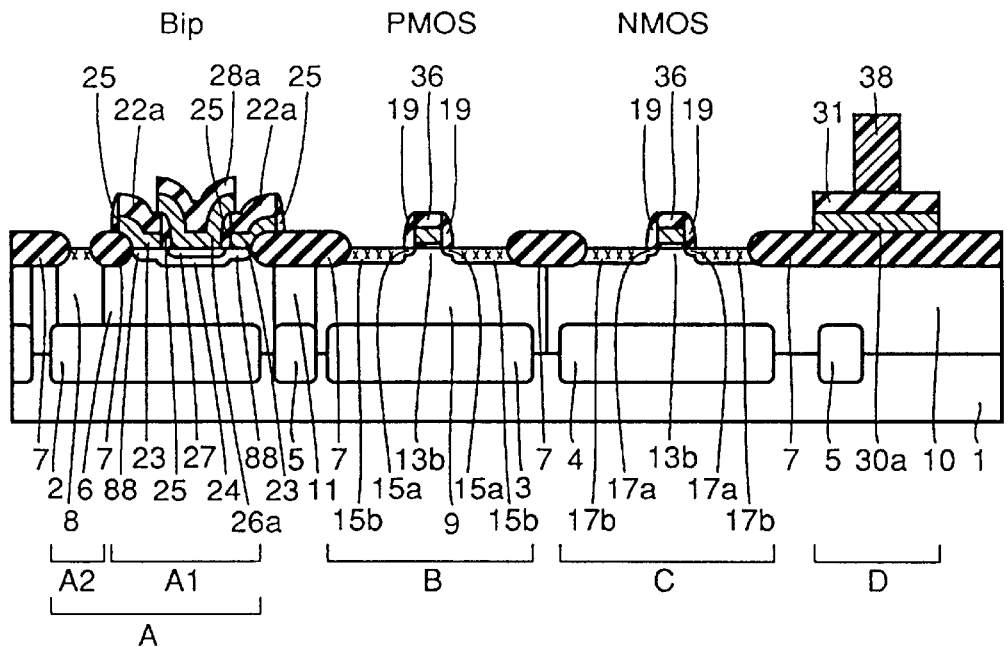
Figure 110:
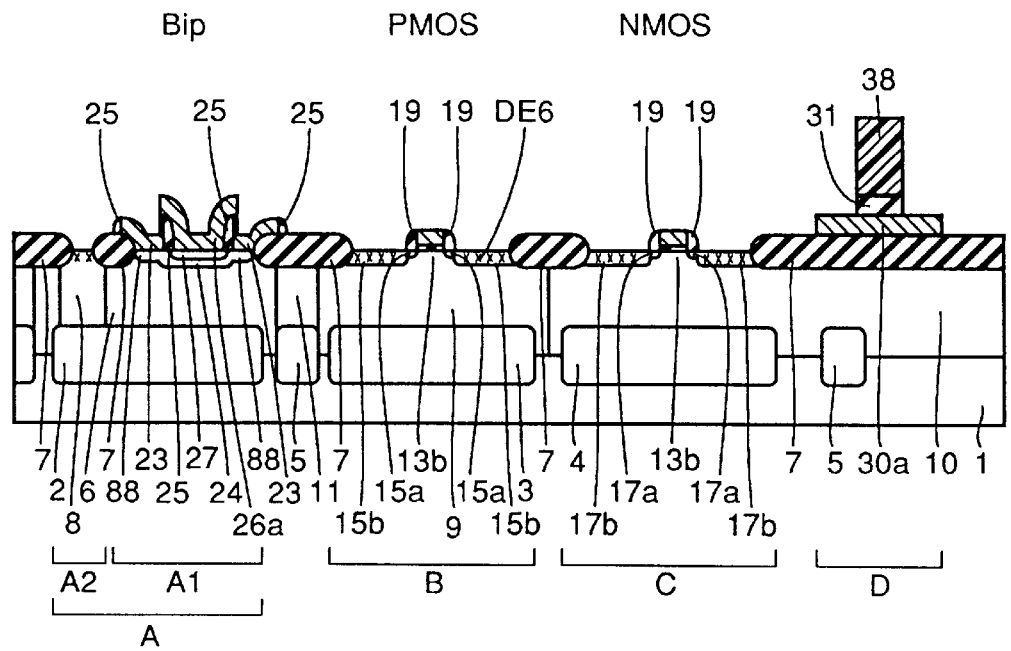
Figure 111:
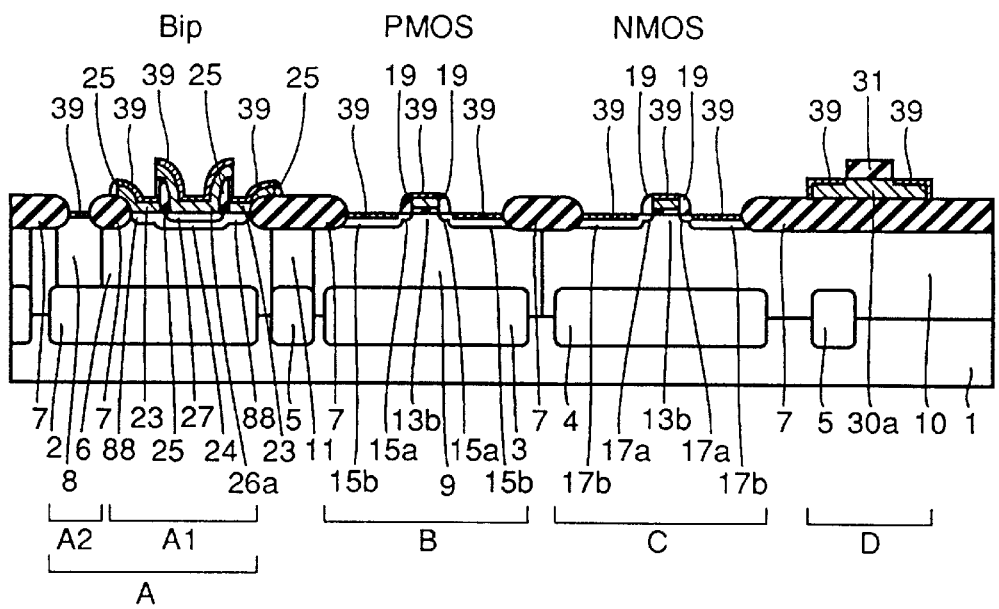

Thereafter, a structure shown in FIG. 92 is formed through a process similar to that of the embodiment 1 shown in FIGS. 10 to 12. Then, the BiCMOS element of the embodiment 19 is completed through a process similar to that of the embodiment 1 shown in FIGS. 13 to 18.

Owing to the above structure, it is possible to reduce etching damages to the bipolar transistor part and the CMOS transistor part while simplifying the manufacturing process, similarly to the embodiment 1.

Although the present invention has been described and illustrated in detail, it is clearly understood that the same is by way of illustration and example only and is not to be taken by way of limitation, the spirit and scope of the present invention being limited only by the terms of the appended claims. For example, a manufacturing process of the invention may be formed of a selective combination of the processes of the embodiments 1 to 19.

What is claimed is:

1. A method of manufacturing a semiconductor device including a bipolar transistor and a field-effect transistor formed on a semiconductor substrate comprising the steps of:

forming an element isolating region on a main surface of said semiconductor substrate;

forming a layered film by successively forming a gate insulating film, a first semiconductor film and a first insulating film on the main surface of said semiconductor substrate;

removing said layered film located on an emitter region and a base region of said bipolar transistor;

forming a second semiconductor film for an external base leader electrode on said emitter region and said base region;

forming a second insulating film on said second semiconductor film;

forming a first side wall insulating film on the side surface of said second semiconductor film and the side surface of said second insulating film, and removing said first insulating film on said first semiconductor film;

forming a third semiconductor film on said first semiconductor film, and thereafter patterning said first and third semiconductor films to form a gate electrode;

ion-implanting impurity into the main surface of said semiconductor surface of said semiconductor substrate masked with said gate electrode to form a pair of source/drain regions;

patterning said second semiconductor film to form the external base leader electrode and an opening for the emitter;

ion implanting impurity into the main surface of said semiconductor substrate through said opening for the emitter to form the base region;

forming a second side wall insulating film at the side surface of said external base leader electrode located in said opening for the emitter; and forming a fourth semiconductor film having a portion located in said opening for the emitter and electrically connected to the main surface of said semiconductor substrate, and thereafter patterning said fourth semiconductor film to form an emitter electrode.

2. The method of manufacturing the semiconductor device according to claim 1, wherein said second insulating film is left on said second semiconductor film in said step of forming said first side wall insulating film and removing said first insulating film.

3. The method of manufacturing the semiconductor device according to claim 1, wherein said impurity is also ion-implanted into the collector region of said bipolar transistor during ion-implantation of said impurity for forming said source/drain regions.

4. The method of manufacturing the semiconductor device according to claim 1, wherein said step of forming said emitter electrode includes the steps of:

forming a fourth semiconductor film and subsequently implanting first impurity into said fourth semiconductor film;

forming a mask layer on a portion of said fourth semiconductor film provided for forming a first resistance layer and subsequently implanting second impurity into said fourth semiconductor film; and removing said mask layer and subsequently patterning said fourth semiconductor film to form simultaneously said emitter electrode and said first resistance layer.

5. The method of manufacturing the semiconductor device according to claim 4, wherein said fourth semiconductor film is patterned to form a second resistance layer in addition to and simultaneously with said emitter electrode and said first resistance layer.

6. The method of manufacturing the semiconductor device according to claim 1, further comprising the steps of:

exposing a portion of upper surfaces of said external base leader electrode and said emitter electrode; and forming a silicide film at the surface of said exposed portion.

7. The method of manufacturing the semiconductor device according to claim 6, wherein said step of forming said silicide film includes the steps of:

forming a third insulating film at the side surface of said emitter electrode; and forming the silicide film on the upper surface of said emitter electrode.

8. The method of manufacturing the semiconductor device according to claim 1, wherein said implantation of the ions into said base region is performed by implanting the ions into the main surface of said semiconductor substrate after forming said second side wall insulating film.

9. The method of manufacturing the semiconductor device according to claim 8, wherein an impurity region for connecting an external base region and a true base region together is formed by ion-implanting impurity into the main surface of said semiconductor substrate through said opening for the emitter prior to formation of said second side wall insulating film.

* * * * *